(12) United States Patent
Abe et al.

(10) Patent No.: US 8,404,426 B2
(45) Date of Patent: *Mar. 26, 2013

(54) NEGATIVE RESIST COMPOSITION, METHOD OF FORMING RESIST PATTERN AND POLYMERIC COMPOUND

(75) Inventors: Sho Abe, Kawasaki (JP); Daiju Shiono, Kawasaki (JP); Tomoyuki Hirano, Kawasaki (JP); Takahiro Dazai, Kawasaki (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 435 days.

This patent is subject to a terminal disclaimer.

(21) Appl. No.: 12/458,228

(22) Filed: Jul. 6, 2009

(65) Prior Publication Data

US 2010/0035178 A1 Feb. 11, 2010

(30) Foreign Application Priority Data

Jul. 7, 2008 (JP) ................................ P2008-176846

(51) Int. Cl.
- G03F 7/004 (2006.01)
- G03F 7/30 (2006.01)
- C08F 220/22 (2006.01)

(52) U.S. Cl. .................... 430/270.1; 430/325; 430/907; 430/910; 526/245; 526/248

(58) Field of Classification Search ............... 430/270.1, 430/325, 907, 910; 526/245, 248
See application file for complete search history.

(56) References Cited

U.S. PATENT DOCUMENTS

| | | | |
|---|---|---|---|
| 5,008,175 A * | 4/1991 | Hsieh et al. ................... | 430/155 |
| 5,034,304 A | 7/1991 | Feely | |
| 5,545,509 A * | 8/1996 | Cameron et al. ........... | 430/270.1 |
| 5,945,517 A | 8/1999 | Nitta et al. | |
| 6,153,733 A | 11/2000 | Yukawa et al. | |
| 6,420,503 B1 | 7/2002 | Jayaraman et al. | |
| 6,686,429 B2 * | 2/2004 | Dammel et al. ............... | 526/297 |
| 6,737,215 B2 * | 5/2004 | Dammel et al. ........... | 430/270.1 |
| 7,678,530 B2 | 3/2010 | Hasegawa et al. | |
| 2001/0049073 A1 | 12/2001 | Hada et al. | |
| 2003/0013831 A1 * | 1/2003 | Dammel et al. ............... | 526/297 |
| 2007/0160929 A1 | 7/2007 | Hasegawa et al. | |
| 2009/0142699 A1 * | 6/2009 | Furuya et al. ............. | 430/286.1 |
| 2009/0317743 A1 * | 12/2009 | Shiono et al. ............. | 430/270.1 |
| 2010/0009291 A1 | 1/2010 | Utsumi et al. | |

FOREIGN PATENT DOCUMENTS

| | | |
|---|---|---|
| JP | 06001750 A * | 1/1994 |
| JP | 8-3635 B | 1/1996 |
| JP | 9-208554 | 8/1997 |
| JP | 11-35551 | 2/1999 |
| JP | 11-35552 | 2/1999 |
| JP | 11-35573 | 2/1999 |
| JP | 11-322707 | 11/1999 |
| JP | 2000-206694 A | 7/2000 |
| JP | 2005-36160 | 2/2005 |
| JP | 2005-315984 | 11/2005 |
| JP | 2005-315986 | 11/2005 |
| JP | 2007-182488 | 7/2007 |
| JP | 2007-192907 | 8/2007 |
| JP | 2008-287251 | 11/2008 |
| JP | 2009-237167 | 10/2009 |
| JP | 2009-244780 | 10/2009 |
| JP | 2010-037528 | 2/2010 |
| WO | 2004/074242 | 9/2004 |
| WO | 2004/076495 | 9/2004 |
| WO | 2008/047729 | 4/2008 |

OTHER PUBLICATIONS

Y. Tsuchiya et al., "Investigation of Acid-Catalyzed Insolubilization Reactions for Alicyclic Polymers with Carboxyl Groups", Journal of Photopolymer Science and Technology, vol. 10, No. 4, pp. 579-584, 1997.
K. Maeda et al., "ArF Chemically Amplified Negative Resist Using Alicyclic Epoxy Polymer", Journal of Photopolymer Science and Technology, vol. 11, No. 3, pp. 507-512, 1998.
S. Iwasa et al., "Novel negative photoresist based on polar alicyclic polymers for ArF excimer laser lithography", SPIE Advances in Resist Technology and Processing XV, vol. 3333, pp. 417-424, 1998.
W. Conley et al., "Negative Photoresist for 157 nm Microlithography; A Progress Report", SPIE Advances in Resist Technology and Processing XIX, vol. 4690, pp. 94-100, 2002.
Gil et al., "First Microprocessors with Immersion Lithography", Proceedings of SPIE, vol. 5754 pp. 119-128, 2005.
Kodama et al., "Synthesis of Novel Fluoropolymer for 157nm Photoresists by Cyclo-polymerization", Proceddings of SPIE, vol. 4690, pp. 76-83, 2002.
Japanese Office Action issued Jun. 26, 2012 in corresponding Japanese Application No. 2008-176846.
Japanese Office Action issued Feb. 5, 2013 in Japanese Application No. 2009-023627.

* cited by examiner

*Primary Examiner* — John Chu
(74) *Attorney, Agent, or Firm* — Wenderoth, Lind & Ponack, L.L.P.

(57) ABSTRACT

A negative resist composition including an alkali-soluble resin component (A), an acid generator component (B) that generates acid upon exposure, and a cross-linking component (C), the alkali-soluble resin component (A) including a polymeric compound (F) having a structural unit (f1) containing a base dissociable group and a structural unit (f2) containing a cross-linking group-containing group.

17 Claims, 1 Drawing Sheet

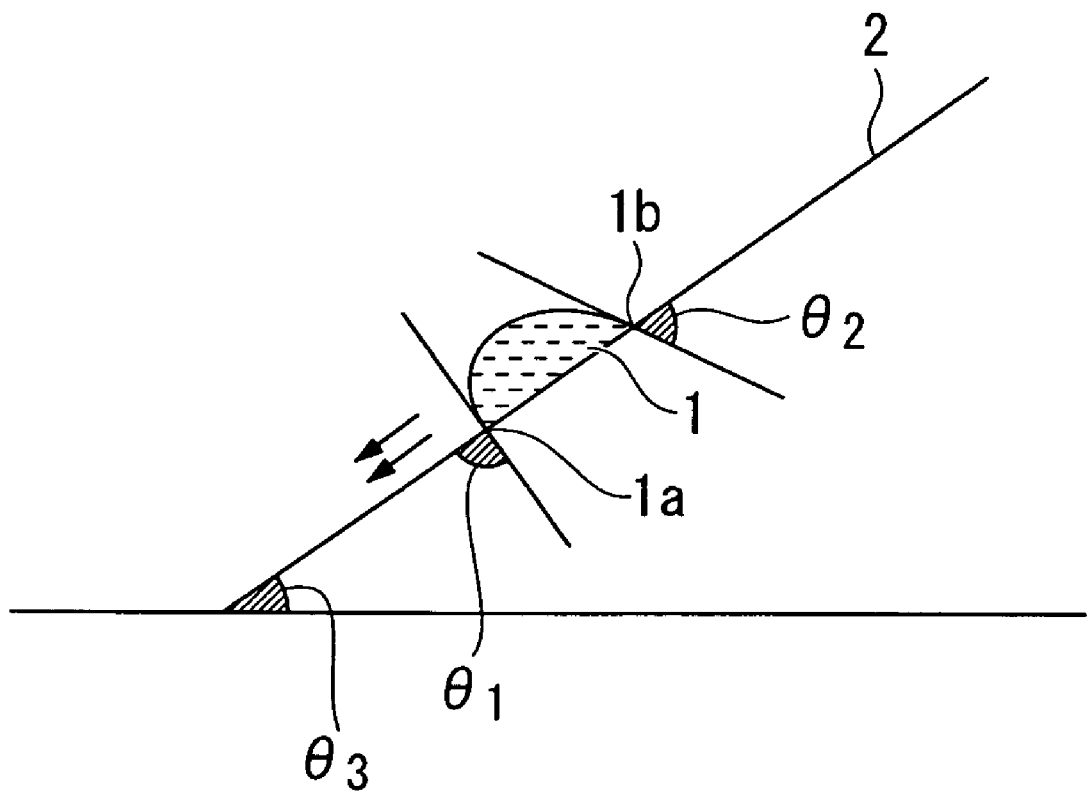

NEGATIVE RESIST COMPOSITION, METHOD OF FORMING RESIST PATTERN AND POLYMERIC COMPOUND

TECHNICAL FIELD

The present invention relates to a negative resist composition containing a novel polymeric compound, a method of forming a resist pattern using the same, and a polymeric compound.

Priority is claimed on Japanese Patent Application No. 2008-176846, filed Jul. 7, 2008, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed solubility in an alkali developing solution under action of acid and an acid generator that generates acid upon exposure.

Conventionally, negative resist materials for use in processes that use either i-line radiation or a KrF excimer laser (248 nm) as the light source have employed chemically amplified negative resist compositions containing a combination of an acid generator, an alkali-soluble resin such as a novolak resin or a polyhydroxystyrene, and an amino resin such as a melamine resin or urea resin (for example, see patent document 1).

Furthermore, negative resist materials that can be applied to processes that use an ArF excimer laser of even shorter wavelength use materials that exhibit improved transparency to ArF excimer lasers. For example, a negative resist composition that includes a resin component containing carboxyl groups, a cross-linker containing alcoholic hydroxyl groups, and an acid generator has been proposed.

In this composition, the carboxyl groups within the resin component react with the alcoholic hydroxyl groups of the cross-linker under the action of the acid generated from the acid generator. As a result, the resin component changes from an alkali-soluble state to an alkali-insoluble state.

Furthermore, compositions have also been proposed that include a resin component containing carboxyl groups or carboxylate ester groups as well as alcoholic hydroxyl groups, and an acid generator, wherein an intermolecular reaction between the carboxyl groups or carboxylate ester groups and the alcoholic hydroxyl groups within the resin component, under the action of the acid generated from the acid generator, causes the resin component to change from an alkali-soluble state to an alkali-insoluble state (for example, see non-patent documents 1 to 4 and patent document 2).

[Patent Document 1] Japanese Examined Patent Application, Second Publication No. Hei 08-3635

[Patent Document 2] Japanese Unexamined Patent Application, First Publication No. 2000-206694

[Non-Patent Document 1] J. Photopolym. Sci. Tech., Vol. 10, No. 4, pages 579 to 584 (1997)

[Non-Patent Document 2] J. Photopolym. Sci. Tech., Vol. 11, No. 3, pages 507 to 512 (1998)

[Non-Patent Document 3] SPIE Advances in Resist Technology and Processing XIV, Vol. 3333, pages 417 to 424 (1998)

[Non-Patent Document 4] SPIE Advances in Resist Technology and Processing XIX, Vol. 4690, pages 94 to 100 (2002)

SUMMARY OF THE INVENTION

In recent years, as requirements for high resolution increase with progress in the miniaturization of resist patterns, further improvement in various lithography properties has been demanded.

However, when a conventional negative resist composition described above is used to form a resist pattern on a substrate, there is a problem in that it is difficult to obtain a resist pattern with high rectangularity.

Further, in a negative resist composition, because the base resin in an unexposed state is required to exhibit satisfactory solubility in an alkali developing solution such as an aqueous solution of tetramethylammonium hydroxide (TMAH), a resin with a high level of hydrophilicity is typically used as the resin component. Therefore, there was a limit in enhancing the hydrophobicity of the resist film, depending on the type of base resin used.

Meanwhile, when a resist film is rendered hydrophobic by addition of a component (additive) for imparting hydrophobicity, there was a problem in that the lithography properties are adversely affected, e.g., deterioration of resolution or sensitivity, increase in the generation of scum, and the like, thereby resulting in an inferior shape of the resist pattern.

The present invention takes the above circumstances into consideration, with an object of providing a negative resist composition capable of forming a resist pattern with an excellent shape, a method of forming a resist pattern using the negative resist composition, and a polymeric compound useful as a resin component for the negative resist composition.

For solving the above-mentioned problems, the present invention employs the following aspects.

Specifically, a first aspect of the present invention is a negative resist composition including an alkali-soluble resin component (A), an acid generator component (B) that generates acid upon exposure, and a cross-linking component (C), the alkali-soluble resin component (A) including a polymeric compound (F) having a structural unit (f1) containing a base dissociable group and a structural unit (f2) containing a cross-linking group-containing group.

A second aspect of the present invention is a method of forming a resist pattern, including applying a negative resist composition according to the first aspect on a substrate to form a resist film, subjecting the resist film to exposure, and subjecting the resist film to alkali developing to form a resist pattern.

A third aspect of the present invention is a polymeric compound including a structural unit (f1) containing a base dissociable group and a structural unit (f2) containing a cross-linking group-containing group.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which part or all of the hydrogen atoms of an alkyl group is substituted with halogen atoms. Examples of halogen atoms include fluorine atoms, chlorine atoms, bromine atoms and iodine atoms.

The term "structural unit" refers to a monomer unit that contributes to the formation of a polymeric compound (polymer, copolymer).

The term "exposure" is used as a general concept that includes irradiation with any form of radiation.

According to the present invention, there are provided a negative resist composition capable of forming a resist pattern with an excellent shape, a method of forming a resist pattern using the negative resist composition, and a polymeric compound useful as a resin component for the negative resist composition.

BRIEF DESCRIPTION OF THE DRAWINGS

FIG. 1 is an explanatory diagram of an advancing angle ($\theta_1$), a receding angle ($\theta_2$) and a sliding angle ($\theta_3$).

DETAILED DESCRIPTION OF THE INVENTION

Negative Resist Composition

A negative resist composition according to a first aspect of the present invention includes an alkali-soluble resin component (A) (hereafter, frequently referred to as "component (A)"), an acid generator component (B) that generates acid upon exposure (hereafter, frequently referred to as "component (B)"), and a cross-linking component (C) (hereafter, frequently referred to as "component (C)").

This negative resist composition is soluble within an alkali developing solution prior to exposure, but when acid is generated from the component (B) upon exposure, the action of the acid causes cross-linking between the component (A) and the component (C), rendering the composition insoluble in an alkali developing solution. Therefore, in the formation of a resist pattern, by conducting selective exposure of a resist film formed by applying the negative resist composition to a substrate, the exposed portions become insoluble in the alkali developing solution, whereas the unexposed portions remain alkali-soluble, meaning a negative resist pattern can be formed by alkali developing.

<Component (A)>

In the present invention, the component (A) includes a polymeric compound (F) (hereafter, referred to as "component (F)") having a structural unit (f1) containing a base dissociable group and a structural unit (f2) containing a cross-linking group-containing group.

Further, the component (A) may also contain an alkali-soluble resin having a fluorinated hydroxyalkyl group such as that represented by general formula (a1-1-1) described later.

As a specific example of a preferable alkali-soluble resin having a fluorinated hydroxyalkyl group, a polymeric compound (A1) (hereafter, referred to as "component (A1)") containing a structural unit (a1) that contains, within the main chain, an aliphatic cyclic group having a fluorinated hydroxyalkyl group, and preferably also containing a structural unit (a2) having a hydroxyalkyl group, can be given.

Further, another example of a preferable alkali-soluble resin having a fluorinated hydroxyalkyl group includes a polymeric compound (A2) (hereafter, referred to as "component (A2)") containing a structural unit (a1') that contains an aliphatic cyclic group having a fluorinated hydroxyalkyl group, and preferably also containing a structural unit (a2') derived from an acrylate ester containing a hydroxyl group-containing aliphatic cyclic group, and/or a structural unit (a3') derived from an acrylic acid that has no cyclic structure and has an alcoholic hydroxyl group on a side chain.

[Component (F)]

In the present invention, the component (F) is a polymeric compound including a structural unit (f1) containing a base dissociable group and a structural unit (f2) containing a cross-linking group-containing group.

Structural Unit (f1)

The structural unit (f1) is a structural unit having a base dissociable group.

In the present description and claims, the term "base dissociable group" refers to an organic group which can be dissociated from the structural unit (f1) by the action of a base. Therefore, a "base dissociable group" can be dissociated by the action of an alkali developing solution (e.g., a 2.38% by weight aqueous solution of tetramethylammonium hydroxide (TMAH) at 23° C.).

When a base dissociable group is dissociated by the action of an alkali developing solution, a hydrophilic group is formed, thereby enhancing the affinity for the alkali developing solution. More specifically, since the component (F) includes not only a cross-linking group-containing group so as to exhibit cross-link ability, but also a "base dissociable group", the affinity for an alkali developing solution is enhanced by the action of the alkali developing solution.

Therefore, by using the negative resist composition, a resist film in which particularly unexposed portions exhibit excellent solubility in an alkali developing solution can be formed.

The base dissociable group is not particularly limited as long as it is an organic group that satisfies the definition described above, and for example, the base dissociable group may be either a group containing a fluorine atom, or a group which does not contain a fluorine atom. As the base dissociable group, a group which contains a fluorine atom is preferable.

In the structural unit (f1), when no fluorine atom is contained in portions other than the base dissociable group, it is particularly desirable that the base dissociable group contain a fluorine atom. On the other hand, when a fluorine atom is contained in a portion other than the base dissociable group, the base dissociable group may be either a group containing a fluorine atom, or a group which does not contain a fluorine atom, although a group containing a fluorine atom is preferable.

The reason for this is that, when the base dissociable group is an organic group having a fluorine atom, since the base dissociable group is dissociated by the action of an alkali developing solution, the fluorine atom contained in the base dissociable group is also dissociated, thereby enhancing the affinity for the alkali developing solution.

In the present invention, it is particularly desirable that the structural unit (f1) contains a fluorine atom only in the base dissociable group. By virtue of containing a component (F) including such a structural unit (f1), an excellent negative resist composition can be obtained which is capable of forming a resist film exhibiting both high hydrophobicity during immersion exposure and excellent solubility in an alkali developing solution without causing any conflicts. Such a negative resist composition is capable of forming a resist film which exhibits a high hydrophobicity during immersion exposure and satisfactory solubility in an alkali developing solution during development. Therefore, the negative resist composition can be preferably used for immersion exposure.

A base dissociable group containing a fluorine atom refers to a base dissociable group in which part or all of the hydrogen atoms have been substituted with a fluorine atom.

Specific examples of preferable base dissociable groups containing a fluorine atom include at least one base dissociable group selected from those represented by general formulas (II-1) to (II-4) shown below. In terms of the effects of the present invention and ease in synthesis, a group represented by general formula (II-1) or (II-4) shown below is particularly desirable.

[Chemical Formula 1]

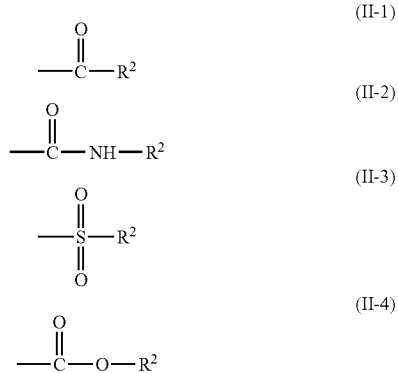

In the formulas, each $R^2$ independently represents an organic group having a fluorine atom.

In general formulas (II-1) to (II-4), each $R^2$ independently represents an organic group having a fluorine atom.

$R^2$ may be linear, branched or cyclic, and is preferably linear or branched.

Further, $R^2$ preferably has 1 to 20 carbon atoms, more preferably 1 to 15, still more preferably 1 to 10, and most preferably 1 to 5.

It is preferable that the organic group having a fluorine atom for $R^2$ has 25% or more of the hydrogen atoms within the organic group fluorinated, more preferably 50% or more, and most preferably 60% or more, as the hydrophobicity of the resist film during immersion exposure is enhanced.

As a preferable example of $R^2$, a fluorinated hydrocarbon group which may or may not have a substituent can be given.

The hydrocarbon group may be either an aliphatic hydrocarbon group or an aromatic hydrocarbon group, and an aliphatic hydrocarbon group is preferable.

In the present description and claims, the term "aliphatic" is a relative concept used in relation to the term "aromatic", and defines a group or compound that has no aromaticity.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^2$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups have been substituted with a fluorine atom.

The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8. Specific examples include a methyl group, an ethyl group, an n-propyl group, an n-butyl group, an n-pentyl group, an n-hexyl group, an n-heptyl group, an n-octyl group, an n-nonyl group and an n-decanyl group.

The unsubstituted branched alkyl group preferably has 3 to 10 carbon atoms, and more preferably 3 to 8. As the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecanyl group and a tetracyclododecanyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

As the fluorinated alkyl group for $R^2$, a linear or branched fluorinated alkyl group is preferable, and a group represented by general formula (III-1) or (III-2) shown below is particularly desirable.

[Chemical Formula 2]

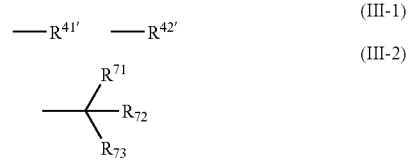

In general formula (III-1), $R^{41'''}$ represents an unsubstituted alkylene group of 1 to 9 carbon atoms, and $R^{42'}$ represents a fluorinated alkyl group of 1 to 9 carbon atoms, with the provision that the total number of carbon atoms of $R^{41'''}$ and $R^{42}$, is no more than 10. In general formula (III-2), each of $R^{71}$ to $R^{73}$ independently represents a linear alkyl group of 1 to 5 carbon atoms, with the provision that at least one of $R^{71}$ to $R^{73}$ represents an alkyl group having a fluorine atom.

In general formula (III-1), as $R^{41'}$, a linear or branched alkylene group of 1 to 5 carbon atoms is preferable, and a methylene group, an ethylene group or a propylene group is particularly desirable.

As $R^{42'}$, a linear or branched fluorinated alkyl group of 1 to 5 carbon atoms is preferable, and a perfluoroalkyl group is particularly desirable. Among perfluoroalkyl groups, a trifluoromethyl group and a tetrafluoroethyl group is preferable.

In general formula (III-2), as the alkyl group for $R^{71}$ to $R^{73}$, an ethyl group or a methyl group is preferable, and a methyl group is particularly desirable. At least one of the alkyl groups for $R^{71}$ to $R^{73}$ is a fluorinated alkyl group, and all of the alkyl groups for $R^{71}$ to $R^{73}$ may be fluorinated alkyl groups.

Among the examples described above, as a preferable example of the structural unit (f1), a structural unit represented by general formula (f1-1) or (f1-2) shown below can be given.

[Chemical Formula 3]

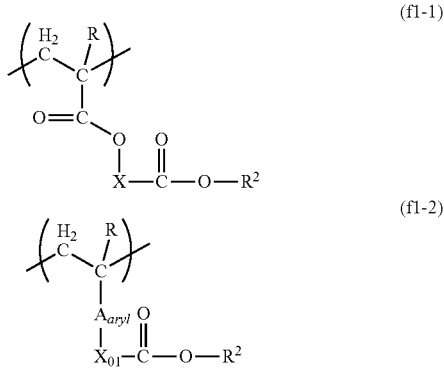

In the formulas above, each R independently represents a hydrogen atom, a lower alkyl group of 1 to 5 carbon atoms or a halogenated lower alkyl group of 1 to 5 carbon atoms; X represents a divalent organic group; $A_{aryl}$ represents an aromatic cyclic group which may have a substituent; $X_{01}$ represents a single bond or a divalent linking group; and each $R^2$ independently represents an organic group having a fluorine atom.

In general formulas (f1-1) and (f1-2), $R^2$ is the same as defined above.

In the present invention, as $R^2$, a fluorinated hydrocarbon group is preferable, more preferably a fluorinated hydrocarbon group of 1 to 5 carbon atoms, and still more preferably $-CH_2-CF_2-CF_3$, $-CH(CF_3)_2$ and $-CH_2-CH_2-CF_2-CF_2-CF_2-CF_3$.

R represents a hydrogen atom, a lower alkyl group or a halogenated lower alkyl group. Specific examples of lower alkyl groups include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group include groups in which part or all of the hydrogen atoms of the aforementioned "lower alkyl group" have been substituted with a halogen atom. Examples of halogen atoms include fluorine atoms, chlorine atoms, bromine atoms and iodine atoms, and fluorine atoms are particularly desirable.

In the present invention, as R, a hydrogen atom, a lower alkyl group or a fluorinated lower alkyl group is preferable, and a hydrogen atom or a methyl group is more preferable in terms of industrial availability.

In general formula (f1-1), X represents a divalent organic group.

Preferable examples of X include a hydrocarbon group which may have a substituent, and a group containing a hetero atom.

(Hydrocarbon Group which May have a Substituent)

With respect to X, the hydrocarbon group "has a substituent" means that part or all of the hydrogen atoms within the hydrocarbon group has been substituted with a group or an atom other than a hydrogen atom.

The hydrocarbon group may be either an aliphatic hydrocarbon group or an aromatic hydrocarbon group.

An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, still more preferably 1 to 3, and most preferably 1.

As a linear aliphatic hydrocarbon group, a linear alkylene group is preferable, and specific examples include a methylene group, an ethylene group $[-(CH_2)_2-]$, a trimethylene group $[-(CH_2)_3-]$, a tetramethylene group $[-(CH_2)_4-]$ and a pentamethylene group $[-(CH_2)_5-]$.

As a branched aliphatic hydrocarbon group, a branched alkylene group is preferable, and specific examples include alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$, and $-C(CH_2CH_3)_2-$; alkylethylene groups such as $-CH(CH_3)CH_2-$, $-CH(CH_3)CH(CH_3)-$, $-C(CH_3)_2CH_2-$, and $-CH(CH_2CH_3)CH_2-$; alkyltrimethylene groups such as $-CH(CH_3)CH_2CH_2-$, and $-CH_2CH(CH_3)CH_2-$; and alkyltetramethylene groups such as $-CH(CH_3)CH_2CH_2CH_2-$, and $-CH_2CH(CH_3)CH_2CH_2-$. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms, and an oxygen atom (=O).

As examples of the aliphatic hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include lower alkyl groups of 1 to 5 carbon atoms, fluorine atom, fluorinated lower alkyl groups of 1 to 5 carbon atoms, and oxygen atom (=O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

Among these examples, the aforementioned divalent aromatic hydrocarbon group is preferable, and an aromatic hydrocarbon group in which one hydrogen atom has been removed from a phenyl group, or an aromatic hydrocarbon group in which one hydrogen atom has been removed from a naphthyl group is particularly desirable.

The alkyl chain within the arylalkyl group preferably has 1 to 4 carbon atom, more preferably 1 or 2, and most preferably 1.

The aromatic hydrocarbon group may or may not have a substituent. Examples of substituents include lower alkyl groups of 1 to 5 carbon atoms, fluorine atom, fluorinated lower alkyl groups of 1 to 5 carbon atoms, and oxygen atom (=O).

Among the above-mentioned examples, as the hydrocarbon group which may have a substituent, a linear, branched or cyclic aliphatic hydrocarbon group or a divalent aromatic hydrocarbon group is preferable, and a methylene group, and ethylene group, —CH(CH$_3$)—, a group in which one hydrogen atom has been removed from a tetracyclododecanyl group, or an aromatic hydrocarbon group in which one hydrogen atom has been removed from a phenyl group is particularly desirable.

(Group Containing a Hetero Atom)

In the present invention, a "group containing a hetero atom" refers to a group containing an atom other than a carbon atom and a hydrogen atom. Examples of hetero atoms include an oxygen atom, a nitrogen atom, a sulfur atom and a halogen atom.

Examples of groups containing a hetero atom include —O—, —C(=O)—, —C(=O)—O—, a carbonate bond (—O—C(=O)—O—), —NH—, —NR$^{04}$— (R$^{04}$ represents an alkyl group), —NH—C(=O)—, =N—, and a combination of one or more of these "groups" with a divalent hydrocarbon group.

As examples of the divalent hydrocarbon group, the same groups as those described above for the hydrocarbon group which may have a substituent can be given, and a linear or branched aliphatic hydrocarbon group is preferable.

Among the above-mentioned examples, as the group containing a hetero atom, a combination of one or more of the aforementioned "groups" with a divalent hydrocarbon group is preferable. More specifically, it is particularly desirable to use a combination of one or more of the aforementioned "groups" with the aforementioned aliphatic hydrocarbon group, or a combination of the aforementioned aliphatic hydrocarbon group, one or more of the aforementioned "groups" and the aforementioned aliphatic hydrocarbon group.

Among the examples described above, as X, a group containing a hetero atom is preferable, and a combination of one or more of the aforementioned "groups" with a divalent hydrocarbon group is particularly desirable.

In general formula (f1-2), A$_{aryl}$ represents an aromatic cyclic group which may have a substituent.

A specific example of A$_{aryl}$ includes an aromatic hydrocarbon ring (which may have a substituent) having 2 hydrogen atoms removed therefrom.

The ring skeleton of the aromatic cyclic group for A$_{aryl}$ preferably has 6 to 15 carbon atoms. Examples of ring skeletons include a benzene ring, a naphthalene ring, a phenanthrene ring and an anthracene ring. Among these, a benzene ring or a naphthalene ring is particularly desirable.

Examples of substituents which an aromatic cyclic group for A$_{aryl}$ may have include a halogen atom, an alkyl group, an alkoxy group, a halogenated lower alkyl group and an oxygen atom (=O). Examples of halogen atoms include a fluorine atom, a chlorine atom, an iodine atom and a bromine atom. As the substituent which an aromatic cyclic group for A$_{aryl}$ may have, a fluorine atom is preferable.

A$_{aryl}$ may be either an aromatic cyclic group having no substituent, or an aromatic cyclic group having a substituent, although an aromatic cyclic group having no substituent is preferable.

When A$_{aryl}$ is an aromatic cyclic group having a substituent, the number of the substituent may be either 1 or at least 2, preferably 1 or 2, and more preferably 1.

X$_{01}$ represents a single bond or a divalent linking group. Examples of divalent linking groups include an alkylene group of 1 to 10 carbon atoms, —O—, —C(=O)—, —C(=O)—O—, a carbonate bond (—O—C(=O)—O—), —NH—C(=O)—, and a combination of these groups, and a combination of —O— with an alkylene group of 1 to 10 carbon atoms is particularly desirable.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

Among structural units represented by general formula (f1-1), structural units represented by general formulas (f1-11) to (f1-15) shown below are preferable.

Further, among structural units represented by general formula (f1-2), structural units represented by general formulas (f1-21) to (f1-24) are preferable.

[Chemical Formula 4]

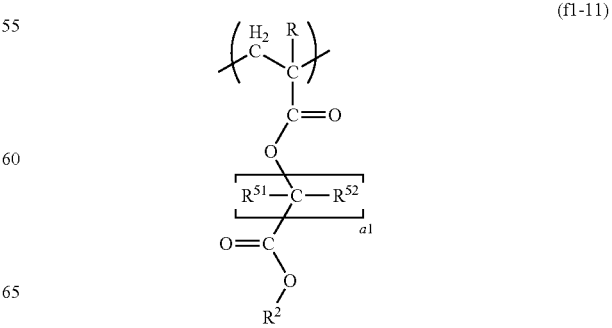

(f1-11)

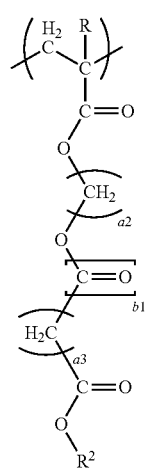 (f1-12)
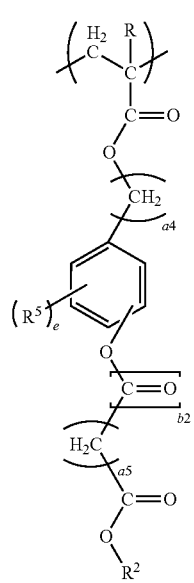 (f1-13)
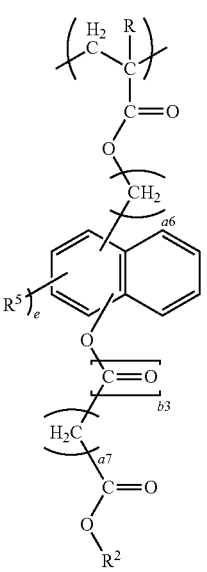 (f1-14)
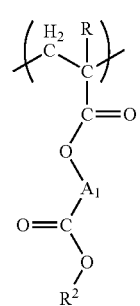 (f1-15)
[Chemical Formula 5]
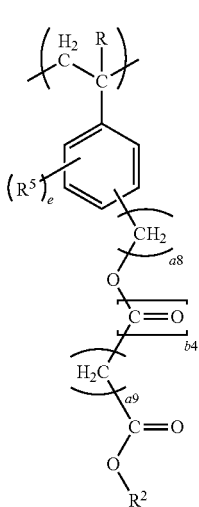 (f1-21)
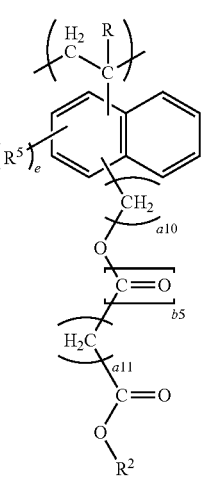 (f1-22)

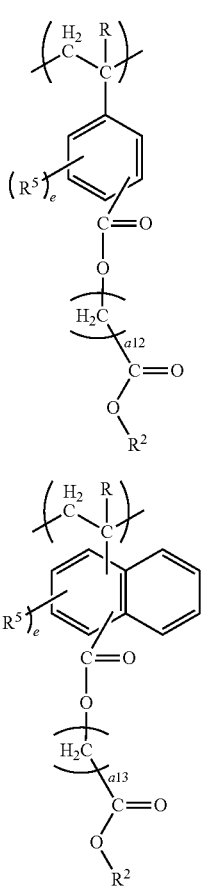

(f1-23)

(f1-24)

In general formulas (f1-11) to (f1-15) and (f1-21) to (f1-24), $R^{51}$ and $R^{52}$ are the same as defined above; $R^{51}$ and $R^{52}$ each independently represents a hydrogen atom or a lower alkyl group; each of a1, a2, a3, a5, a7, a9 and a11 to a13 independently represents an integer of 1 to 5; each of a4, a6, a8 and a10 independently represents 0 or an integer of 1 to 5; each of b1 to b5 independently represents 0 or 1; $R^5$ represents a substituent; e represents an integer of 0 to 2; and $A_1$ represents a cyclic alkylene group of 4 to 20 carbon atoms. As R, a hydrogen atom or a methyl group is preferable.

In general formula (f1-11), as the lower alkyl group for $R^{51}$ and $R^{52}$, the same lower alkyl groups as those described above for R can be used, although a methyl group or ethyl group is preferable, and a methyl group is particularly desirable. In the present invention, it is preferable that at least one of $R^{51}$ and $R^{52}$ be a hydrogen atom.

In general formula (f1-11), a1 is preferably 1 to 3, more preferably 1 or 2.

In general formula (f1-12), it is preferable that each of a2 and a3 independently represent 1 to 3, more preferably 1 or 2. b1 represents 0 or 1.

In general formula (f1-13), a4 is preferably 0 or 1 to 3, more preferably 0, 1 or 2, and most preferably 0 or 1. a5 is preferably 1 to 3, more preferably 1 or 2. As the substituent for $R^5$, for example, a halogen atom, a lower alkyl group, an alkoxy group of 1 to 5 carbon atoms, a halogenated lower alkyl group, or an oxygen atom (=O) can be used. Examples of halogen atoms include a fluorine atom, a chlorine atom, an iodine atom and a bromine atom. e is preferably 0 or 1, and most preferably 0 from an industrial viewpoint. b2 is preferably 0.

In general formula (f1-14) above, a6 is preferably 0 or 1 to 3, more preferably 0, 1 or 2, and most preferably 0 or 1. a7 is preferably 1 to 3, more preferably 1 or 2. b3 is preferably 0. $R^5$ and e are the same as defined above.

In general formula (f1-15), A1 represents a cyclic alkylene group of 4 to 20 carbon atoms, preferably a cyclic alkylene group of 5 to 15 carbon atoms, and more preferably a cyclic alkylene group of 6 to 12 carbon atoms. Specific examples include the aforementioned "cyclic aliphatic hydrocarbon groups" described above in relation to the aforementioned hydrocarbon group which may have a substituent.

In general formula (f1-21) above, a8 is preferably 0 or 1 to 3, more preferably 0, 1 or 2, and most preferably 0 or 1. a9 is preferably 1 to 3, more preferably 1 or 2. b4 is preferably 0. $R^5$ and e are the same as defined above.

In general formula (f1-22) above, a10 is preferably 0 or 1 to 3, more preferably 0, 1 or 2, and most preferably 0 or 1. a11 is preferably 1 to 3, more preferably 1 or 2. b5 is preferably 0. $R^5$ and e are the same as defined above.

In general formula (f1-23) above, a12 is preferably 1 to 3, more preferably 1 or 2.

$R^5$ and e are the same as defined above.

In general formula (f1-24) above, a 13 is preferably 1 to 3, more preferably 1 or 2.

$R^5$ and e are the same as defined above.

Specific examples of structural units represented by general formulas (f1-11) to (f1-15) and (f1-21) to (f1-24) are shown below.

[Chemical Formula 6]

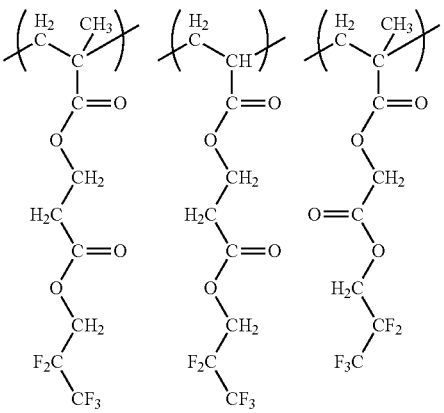

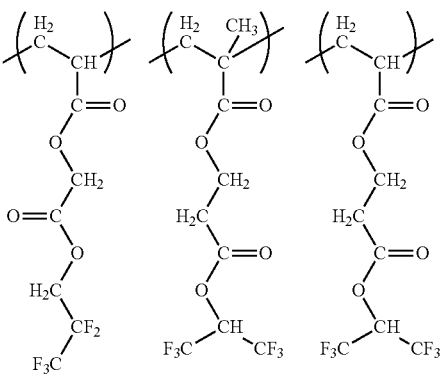

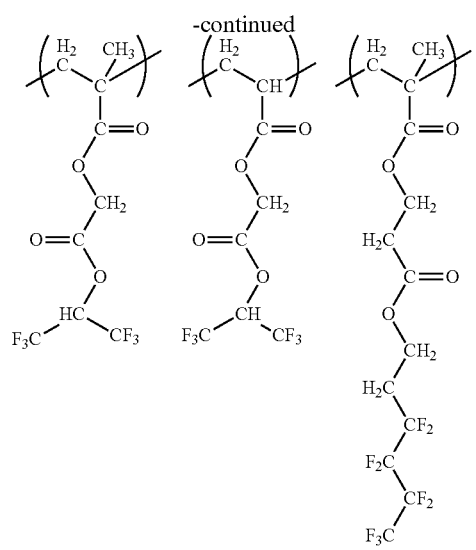
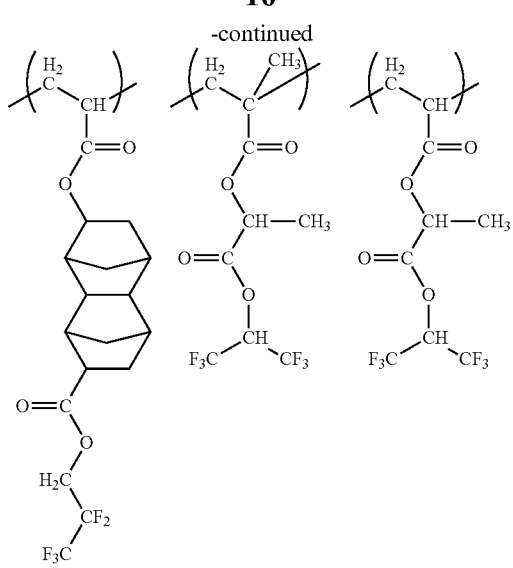
[Chemical Formula 8]
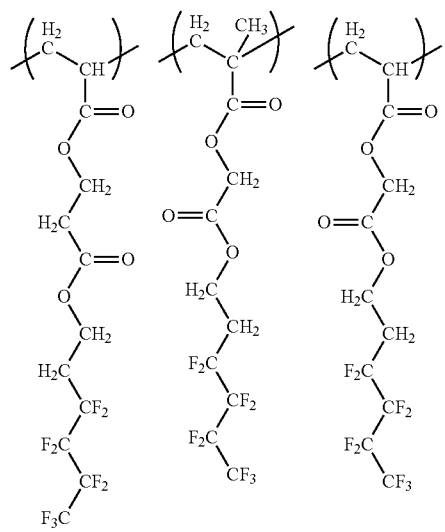
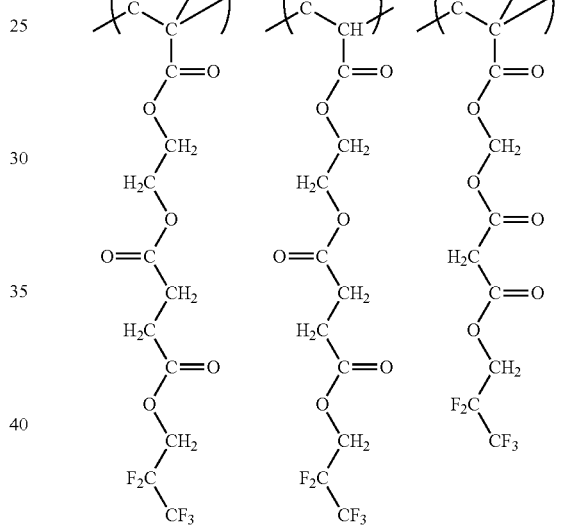
[Chemical Formula 7]
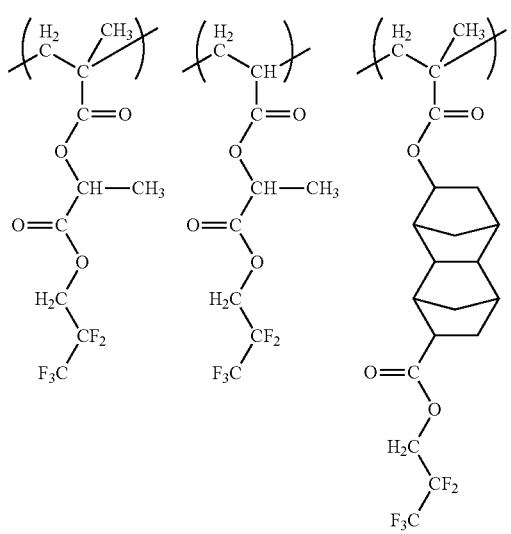
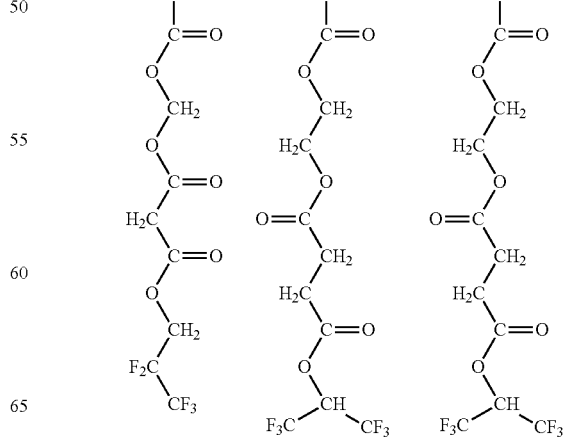

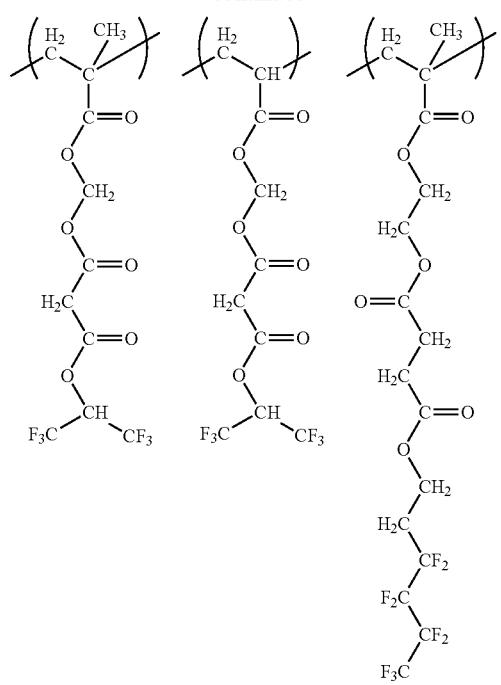
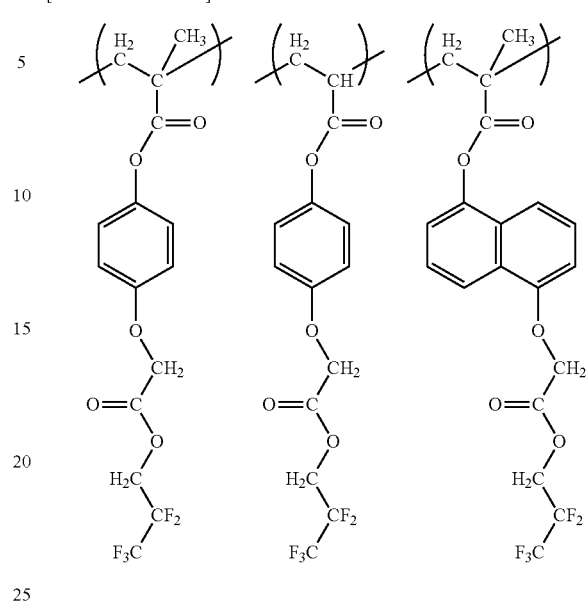
[Chemical Formula 9]
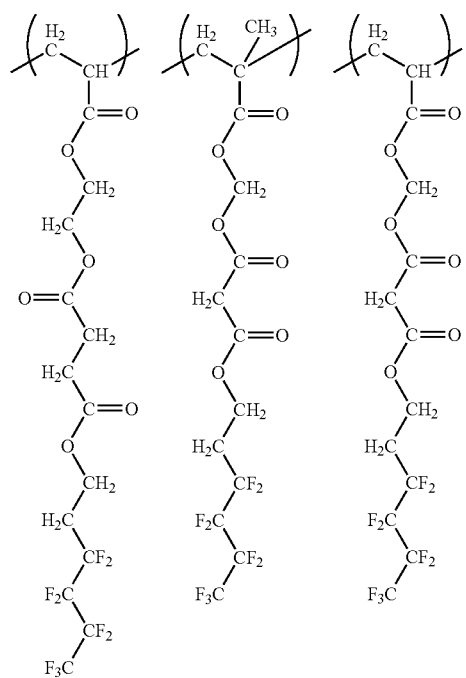
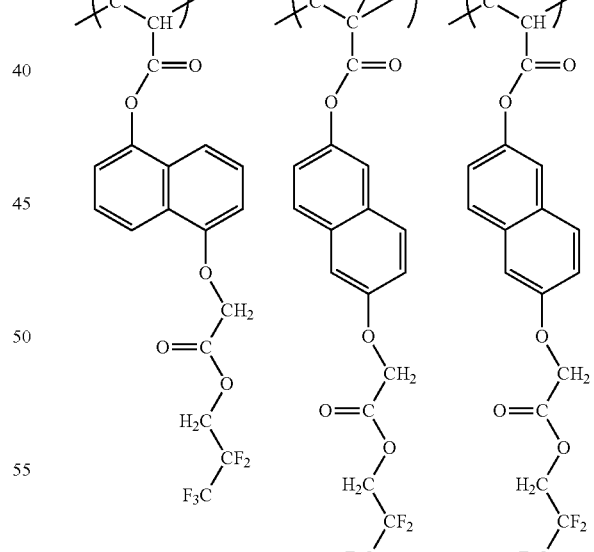

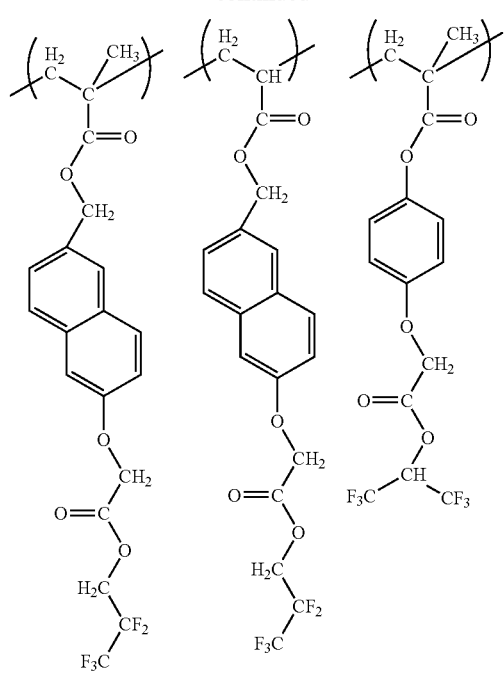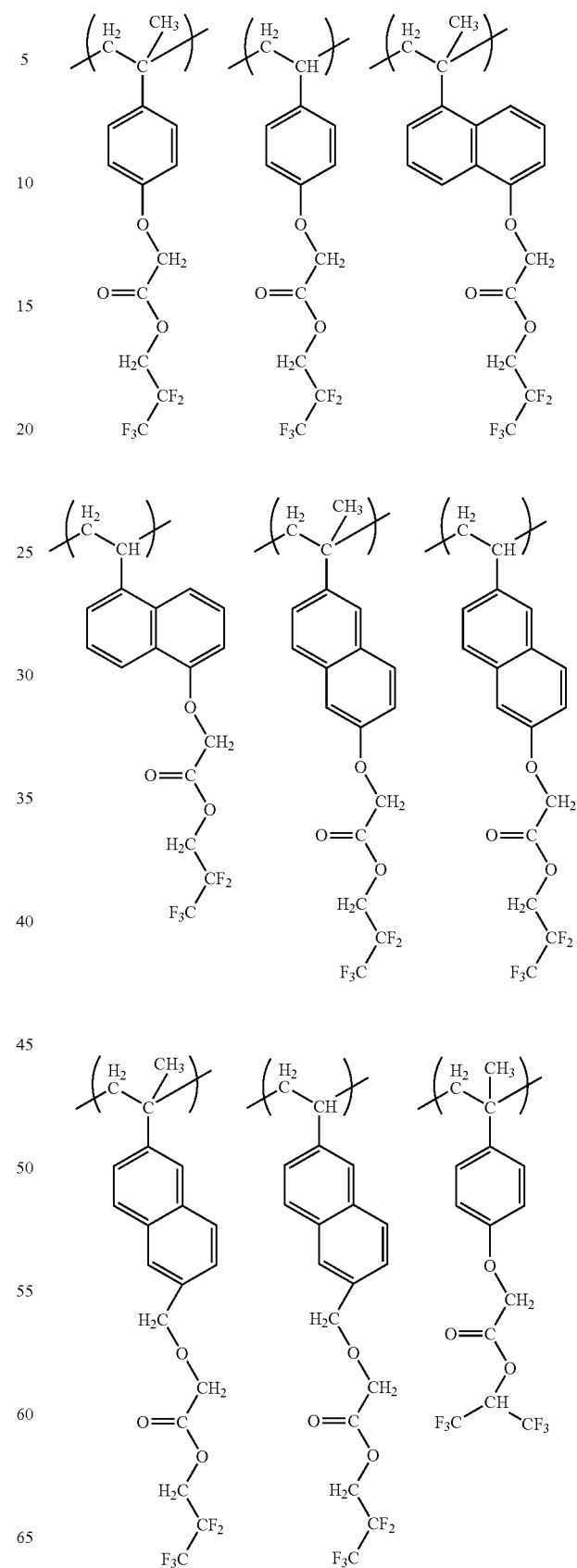
[Chemical Formula 10]

-continued

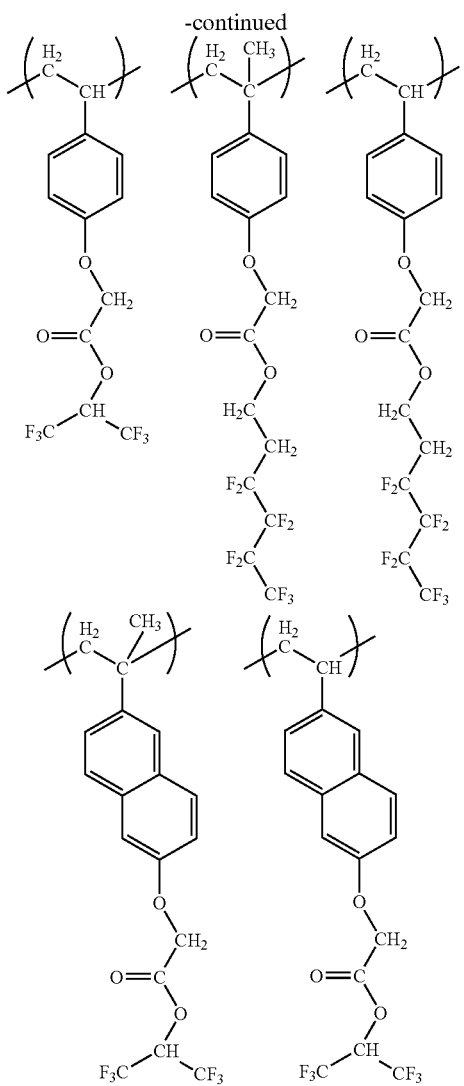

As the structural unit (f1), at least one structural unit selected from the group consisting of structural units represented by general formulas (f1-11) to (f1-15) and (f1-21) to (f1-24) is preferable, more preferably at least one structural unit selected from the group consisting of structural units represented by general formulas (f1-11) to (f1-13), (f1-21) and (f1-22), and most preferably at least one structural unit selected from the group consisting of structural units represented by general formulas (f1-11) and (f1-22).

In the component (F), as the structural unit (f1), one type of structural unit may be used, or two or more types may be used in combination.

In the component (F), the amount of the structural unit (f1) based on the combined total of all structural units constituting the component (F) is preferably 1 to 90 mol %, more preferably 5 to 85 mol %, and most preferably 10 to 80 mol %. By ensuring that the amount of the structural unit (f1) is at least as large as the lower limit of the above-mentioned range, the characteristic feature of becoming hydrophilic during alkali developing is improved. Further, when it contains a fluorine atom, the characteristic feature of exhibiting hydrophobicity during immersion exposure is improved. On the other hand, by ensuring that the amount is no more than the upper limit of the above-mentioned range, a good balance can be achieved with the other structural units.

When an alkali-soluble resin other than the component (F) is used as a base resin, and the component (F) is used as an additive, in terms of the improvement in hydrophobicity during immersion exposure, the amount of the structural unit (f1) is preferably 40 mol % or more, and most preferably 50 mol % or more.

Structural Unit (f2)

The structural unit (f2) is a structural unit containing a cross-linking group-containing group.

In the present description and claims, the term "cross-linking group-containing group" refers to a group containing a cross-linking group in the structure thereof. The cross-linking group-containing group may be either constituted of only a cross-linking group, or constituted of a cross-linking group and an atom or group other than a cross-linking group.

In the component (F) containing the structural unit (f2), when acid is generated from the component (B) upon exposure, the action of the generated acid causes cross-linking between the cross-linking group-containing group and either of a cross-linking agent, the component (A1) or the component (A2), and the cross-linked portion becomes insoluble in an alkali developing solution.

Therefore, by using the component (F), not only does the unexposed portions exhibit excellent solubility in an alkali developing solution by virtue of the "base dissociable group", but also the component (F) exhibits cross-link ability by virtue of the cross-linking group-containing group, so that dissolution of exposed portions in an alkali developing solution can be suppressed (i.e., dissolution inhibiting effect of the exposed portions in an alkali developing solution can be improved). As a result, the developing contrast can be improved, and a resist pattern having an excellent shape can be obtained.

Specific examples of the structural unit (f2) include structural units containing a group represented by general formula (f2-1), (f2-2) or (f2-3) shown below.

[Chemical Formula 11]

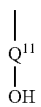

(f2-1)

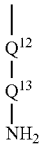

(f2-2)

(f2-3)

In the formulas, $Q^{11}$ represents an alkylene group which may have an ether bond; $Q^{12}$ represents a divalent linking group; $Q^{13}$ represents $-SO_2-$ or $-C(=O)-$; and $Q^{14}$ represents an aromatic cyclic group.

In general formula (f2-1), $Q^{11}$ represents an alkylene group which may have a substituent, and may be linear, branched or cyclic.

The linear or branched alkylene group for $Q^{11}$ preferably has 1 to 12 carbon atoms, more preferably 1 to 5, and most preferably 1 to 3.

Specific examples of alkylene groups include a methylene group, an ethylene group and a trimethylene group (n-propylene group).

The cyclic alkylene group for $Q^{11}$ may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the cyclic alkylene group, a group in which two or more hydrogen atoms have been removed from a monocycloalkane or a polycycloalkane such as a bicycloalkane, tricycloalkane or tetracycloalkane can be used. Specific examples include groups in which two or more hydrogen atoms have been removed from a monocycloalkane such as cyclopentane or cyclohexane; and groups in which two or more hydrogen atoms have been removed from a polycycloalkane such as adamantane, norbornane, isobornane, tricyclodecane or tetracyclododecane.

When $Q^{11}$ has an ether bond, preferable examples of $Q^{11}$ include —$CH_2$—O—$CH_2$—, —$CH_2$—O—$(CH_2)_2$—, —$CH_2$—O—$(CH_2)_3$—, —$(CH_2)_2$—O—$CH_2$—, —$(CH_2)_2$—O—$(CH_2)_2$—, and —$(CH_2)_2$—O—$(CH_2)_3$—.

In general formula (f2-2), $Q^{12}$ represents a divalent linking group

Examples of the divalent linking group for $Q^{12}$ include an alkylene group and a divalent linking group containing a hetero atom.

Examples of alkylene group for $Q^{12}$ include the same alkylene groups as those described above for $Q^{11}$.

Examples of divalent linking group for $Q^{12}$ that contains a hetero atom include an ether group, an ester group and a group in which at least one hydrogen atom and/or carbon atom within the aforementioned alkylene group has been substituted with a hetero atom.

Further, the divalent linking group for $Q^{12}$ may be a combination of the aforementioned alkylene group with the aforementioned divalent linking group containing a hetero atom.

Among these examples, a cyclic alkylene group is preferable, and a group in which two or more hydrogen atoms have been removed from a polycycloalkane is particularly desirable.

In general formula (f2-2), $Q^{13}$ represents —$SO_2$— or —C(=O)—.

In general formula (f2-3), $Q^{14}$ represents an aromatic cyclic group, and specific examples thereof include groups in which two hydrogen atoms have been removed from an aromatic hydrocarbon ring.

The ring skeleton of the aromatic cyclic group for $Q^{14}$ preferably has 3 to 30 carbon atoms, more preferably 5 to 30, still more preferably 5 to 20, still more preferably 6 to 15, and most preferably 6 to 12.

Specific examples of aromatic cyclic groups include divalent aromatic cyclic groups in which one hydrogen atom has been removed from an aryl group such as a phenyl group, a biphenyl group, a fluorenyl group, a naphthyl group, an anthryl group or a phenanthryl group. Among these, a group in which one hydrogen atom has been removed from a phenyl group or a naphthyl group is particularly desirable.

In the structural unit (f2), the main chain is not particularly limited, and may be either a cyclic type or a chain-like type.

Preferable examples of the structural unit (f2) include a structural unit having a cyclic main chain (hereafter, referred to as "cyclic-main chain structural unit") and a structural unit derived from an acrylate ester.

In the present description, the expression "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be used.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

In the halogenated lower alkyl group, the hydrogen atoms substituted with halogen atoms may represent either some, or all, of the hydrogen atoms that constitute the alkyl group.

Examples of halogen atoms include fluorine atoms, chlorine atoms, bromine atoms and iodine atoms, and fluorine atoms are particularly desirable.

In the present invention, it is preferable that a hydrogen atom, a lower alkyl group or a halogenated lower alkyl group is bonded to the α-position of the acrylate ester, a hydrogen atom, a lower alkyl group or a fluorinated lower alkyl group is more preferred, and in terms of industrial availability, a hydrogen atom or a methyl group is the most desirable.

In the present description, the component (F) includes a "cyclic-main chain structural unit" means that a structural unit constituting the component (F) has a monocyclic or polycyclic ring structure, and at least one carbon atom within the ring structure, preferably two or more carbon atoms within the ring structure constitutes the main chain. By including a cyclic-main chain structural unit, the etching resistance is improved. It is presumed that such improvement in the etching resistance is due to the high carbon density of the cyclic main chain.

Specific examples of structural units containing a group represented by general formulas (f2-1), (f2-2) or (f2-3) are shown below.

(Structural Unit Containing a Group Represented by General Formula (f2-1))

As a preferable example of a structural unit containing a group represented by general formula (f2-1), a structural unit represented by general formula (f2-1-10) shown below can be given.

[Chemical Formula 12]

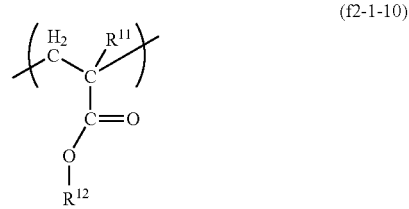

(f2-1-10)

In general formula (f2-1-10), $R^{11}$ represents a hydrogen atom, an alkyl group, a halogenated lower alkyl group of 1 to 5 carbon atoms or a hydroxyalkyl group, and $R^{12}$ represents a hydrogen atom, an alkyl group or a hydroxyalkyl group, provided that at least one of $R^{11}$ and $R^{12}$ represents a hydroxyalkyl group.

The hydroxyalkyl group for $R^{11}$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or hydroxyethyl group.

There are no particular limitations on the number of hydroxyl groups or the bonding positions of those groups, although one hydroxyl group is typical, and the hydroxyl group is preferably bonded to the terminal of the alkyl group.

The alkyl group for $R^{11}$ is preferably an alkyl group of not more than 10 carbon atoms, even more preferably an alkyl group of 2 to 8 carbon atoms, and is preferably an ethyl group or methyl group.

The halogenated lower alkyl group for $R^{11}$ is a lower alkyl group of not more than 5 carbon atoms (preferably an ethyl group or methyl group) in which part or all of the hydrogen atoms have been substituted with halogen atoms (preferably fluorine atoms).

Examples of the alkyl group and hydroxyalkyl group for $R^{12}$ include the same groups as the lower alkyl group and hydroxyalkyl group of $R^{11}$.

Specific examples of structural units represented by general formula (f2-1-10) include structural units derived from α-(hydroxyalkyl)acrylic acids (not including structural units derived from acrylate esters), structural units derived from alkyl α-(hydroxyalkyl)acrylate esters, and structural units derived from hydroxyalkyl (α-alkyl)acrylate esters.

Specific examples of structural units represented by general formula (f2-1-10) are shown below.

[Chemical Formula 13]

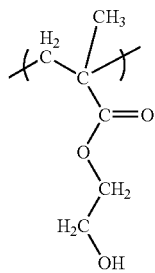

(f2-1-11)

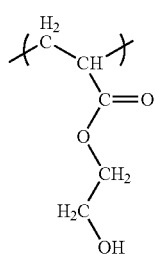

(f2-1-12)

As a preferable example of a structural unit represented by general formula (f2-1), a structural unit represented by general formula (f2-1-20) shown below can also be given.

[Chemical Formula 14]

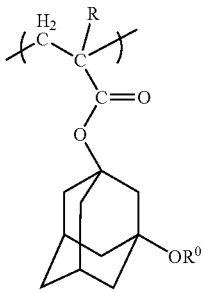

(f2-1-20)

In the formula, R represents a hydrogen atom, a lower alkyl group of 1 to 5 carbon atoms or a halogenated lower alkyl group of 1 to 5 carbon atoms; and $R^0$ represents a hydrogen atom or an alkyl group having a hydroxy group.

In general formula (f2-1-20), R is the same as defined for R in general formula (f1-1) or (f1-2), preferably a hydrogen atom or an alkyl group, and more preferably a hydrogen atom or a methyl group in terms of industrial availability.

In general formula (f2-1-20), $R^0$ represents a hydrogen atom or an alkyl group having a hydroxy group.

The alkyl group is preferably a linear alkyl group or a branched alkyl group. Although there are no particular limitations on the number of carbon atoms within the alkyl group, the number of carbon atoms is preferably from 1 to 5, more preferably from 1 to 4, and most preferably 2 or 3.

Although there are no particular limitations on the number of the hydroxy group, the number of hydroxy group is preferably from 1 to 4, more preferably from 1 to 3, and most preferably 1 or 2.

The bonding position of the hydroxy group is not particularly limited, although the hydroxy group is preferably bonded to the terminal of a main chain or side chain of the alkyl group, and more preferably bonded to the terminal of a main chain of the alkyl group.

As the alkyl group having a hydroxy group for $R^0$, a hydroxyalkyl group or a dihydroxyalkyl group is preferable, and a hydroxyethyl group or a dihydroxypropyl group is more preferable.

Specific examples of structural units represented by general formula (f2-1-20) are shown below.

[Chemical Formula 15]

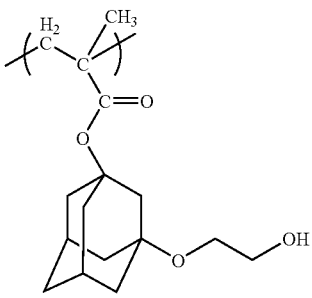

(f2-1-21)

(f2-1-22)

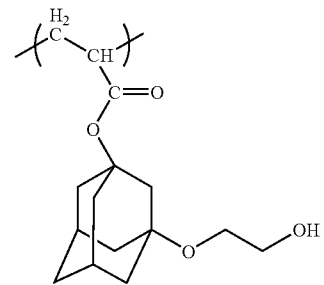

(f2-1-23)

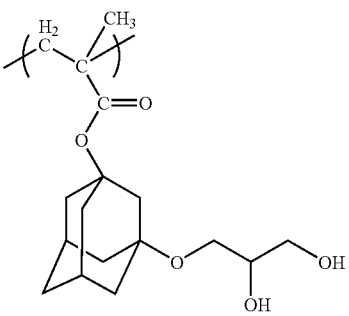

(f2-1-24)

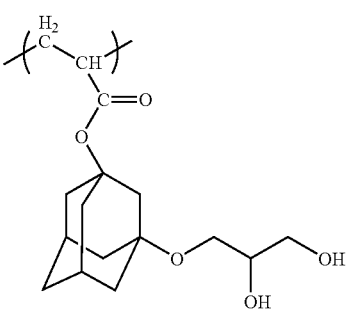

Further, as a preferable example of a structural unit represented by general formula (f2-1), a structural unit represented by general formula (f2-1-30) shown below can also be given.

[Chemical Formula 16]

(f2-1-30)

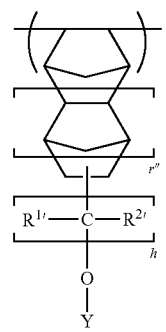

In general formula (f2-1-30), $R^{1\prime}$ and $R^{2\prime}$ each independently represent a hydrogen atom or a lower alkyl group, Y represents a hydrogen atom or a hydroxyalkyl group, r" represents either 0 or 1, and h represents an integer of 1 to 3.

The structural unit represented by general formula (f2-1-30) is a structural unit containing, within the main chain, a norbornane or tetracyclododecane structure having a hydroxyalkyl group.

In formula (f2-1-30), $R^{1\prime}$, and $R^{2\prime}$ each independently represent a hydrogen atom or a lower alkyl group. As the lower alkyl group, the same lower alkyl groups as those described above for R can be used. Of the various possibilities, groups in which both $R^{1\prime}$ and $R^{2\prime}$ are hydrogen atoms are particularly desirable.

Y represents a hydrogen atom or a hydroxyalkyl group.

As the hydroxyalkyl group, a linear or branched hydroxyalkyl group of not more than 10 carbon atoms is preferred, a linear or branched hydroxyalkyl group of not more than 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y is most preferably a hydrogen atom.

r" is either 0 or 1, and is preferably 0.

h represents an integer of 1 to 3, is preferably 1 or 2, and is most preferably 1.

Specific examples of the structural unit represented by general formula (f2-1-30) include units represented by chemical formulas (f2-1-31) to (f2-1-37) shown below.

[Chemical Formula 17]

(f2-1-31)

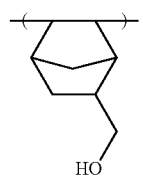

(f2-1-32)

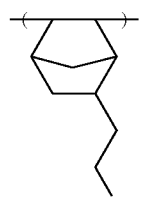

(f2-1-33)

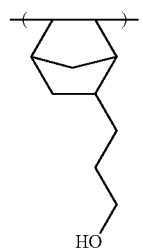

(f2-1-34)

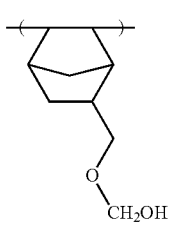

(f2-1-35)
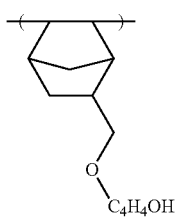

(f2-1-36)
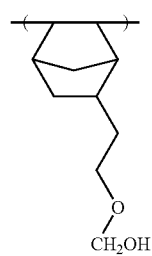

(f2-1-37)
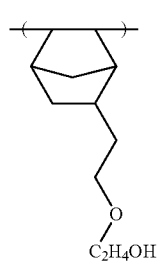

(Structural Unit Represented by General Formula (f2-2))

As a preferable example of a structural unit represented by general formula (f2-2), a structural unit represented by general formula (f2-2-0) shown below can be given.

[Chemical Formula 18]

(f2-2-0)
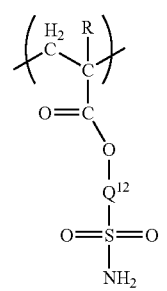

In the formula, R represents a hydrogen atom, a lower alkyl group of 1 to 5 carbon atoms or a halogenated lower alkyl group of 1 to 5 carbon atoms; and $Q^{12}$ represents a divalent linking group.

In general formula (f2-2-0), R is the same as defined for R in general formula (f1-1) or (f1-2), preferably a hydrogen atom or an alkyl group, and more preferably a hydrogen atom or a methyl group in terms of industrial availability.

$Q^{12}$ is the same as defined for $Q^{12}$ in general formula (f2-2).

Specific examples of structural units represented by general formula (f2-2-0) are shown below.

[Chemical Formula 19]

(f2-2-1)
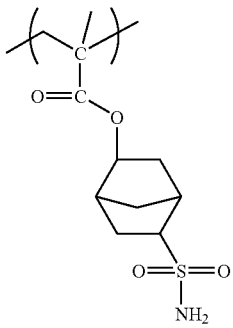

(f2-2-2)
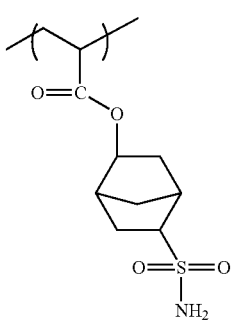

(f2-2-3)
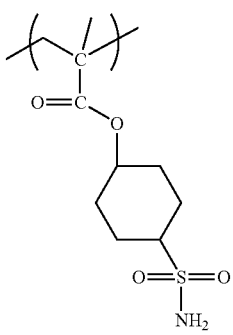

(f2-2-4)
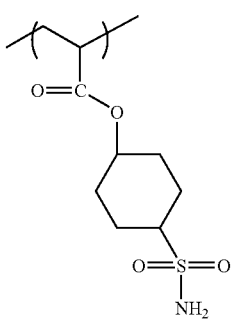

(Structural Unit Represented by General Formula (f2-3))

As a preferable example of a structural unit represented by general formula (f2-3), a structural unit represented by general formula (f2-3-0) shown below can be given.

[Chemical Formula 20]

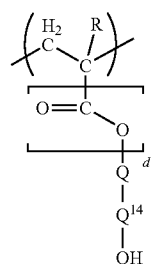

(f2-3-0)

In the formula, R represents a hydrogen atom, a lower alkyl group of 1 to 5 carbon atoms or a halogenated lower alkyl group of 1 to 5 carbon atoms; $Q^{14}$ represents an aromatic cyclic group; and d represents 0 or 1.

In general formula (f2-3-0), R is the same as defined for R in general formula (f1-1) or (f1-2), preferably a hydrogen atom or an alkyl group, and more preferably a hydrogen atom or a methyl group in terms of industrial availability.

$Q^{14}$ is the same as defined for $Q^{14}$ in general formula (f2-3). d represents 0 or 1.

As the structural unit represented by general formula (f2-3-0), a structural unit represented by general formula (f2-3-10) shown below or a structural unit represented by general formula (f2-3-30) shown below is preferable.

[Chemical Formula 21]

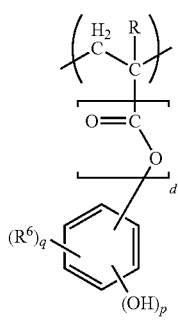

(f2-3-10)

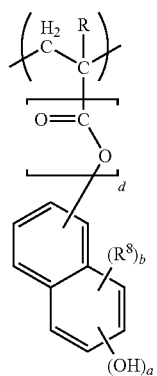

(f2-3-30)

In the formulas, each R independently represents a hydrogen atom, a lower alkyl group of 1 to 5 carbon atoms or a halogenated lower alkyl group of 1 to 5 carbon atoms; $R^6$ represents a lower alkyl group; p represents an integer of 1 to 3; q represents an integer of 0 to 2; $R^8$ represents an alkyl group; a represents 1 or 2; b represents an integer of 0 to 2; and d represents 0 or 1.

In general formulas (f2-3-10) and (f2-3-30), R is the same as defined above for R in general formula (f2-3-0).

In general formula (f2-3-10), p represents an integer of 1 to 3, and preferably 1.

The bonding position of the hydroxy group may be any of the o-position, m-position and p-position of the phenyl group. When p is 1, the p-position is preferable in terms of availability and low cost. When p is 2 or 3, a desired combination of the bonding positions can be used.

q represents an integer of 0 to 2. q is preferably 0 or 1, and most preferably 0 from industrial viewpoint.

As the lower alkyl group for $R^6$, the same as the lower alkyl groups for R above can be used.

When q is 1, the bonding position of $R^6$ may be any of the o-position, the m-position and the p-position.

When q is 2, a desired combination of the bonding positions can be used. Here, the plurality of the $R^6$ group may be the same or different from each other.

In general formula (f2-3-30), $R^8$ represents an alkyl group. The alkyl group may be linear, branched or cyclic, and a linear or branched alkyl group is preferable. The alkyl group preferably has 1 to 10 carbon atoms, more preferably 1 to 5, and still more preferably 1 to 3.

a represents 1 or 2, and most preferably 1.

b represents an integer of 0 to 2, is preferably 0 or 1, and is most preferably 0.

In general formula (f2-3-30), it is preferable that the carbon atom on the 1st or 2nd position of the naphthalene ring be bonded to the carbon atom to which R is bonded.

In such a case, the bonding position of the hydroxy group is not particularly limited, although the 5th to 8th position of the naphthalene ring is preferable. When a is 1, the 5th to 7th position of the naphthalene ring is preferable, and the 5th or 6th position is more preferable.

Specific examples of structural units represented by general formula (f2-3-10) and structural units represented by general formula (f2-3-30) are shown below.

[Chemcial Formula 22]

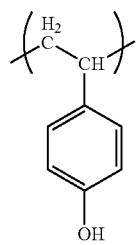

(f2-3-11)

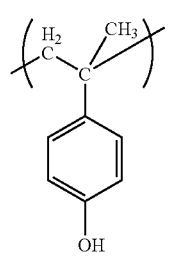

(f2-3-12)

[Chemcial Formula 23]
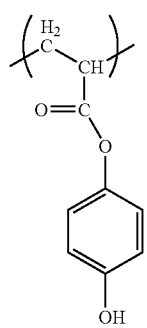 (f2-3-13)
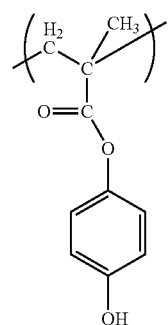 (f2-3-14)
[Chemcial Formula 24]
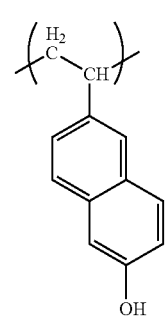 (f2-3-31)
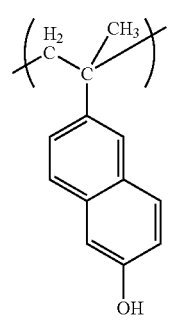 (f2-3-32)
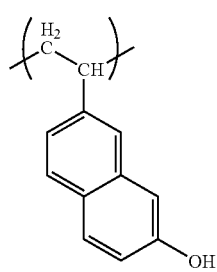 (f2-3-33)
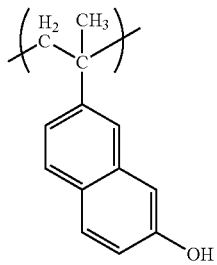 (f2-3-34)
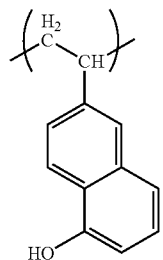 (f2-3-35)
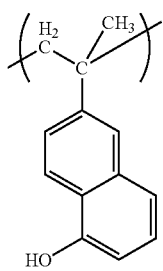 (f2-3-36)
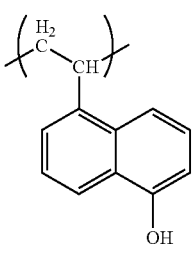 (f2-3-37)
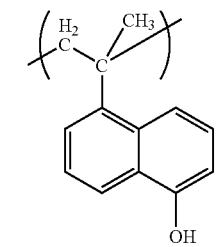 (f2-3-38)
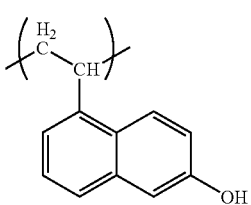 (f2-3-39)

-continued

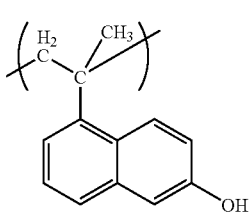
(f2-3-40)

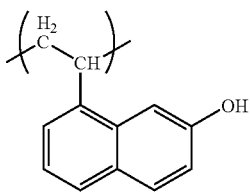
(f2-3-41)

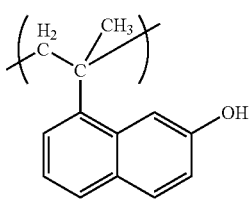
(f2-3-42)

[Chemical Formula 25]

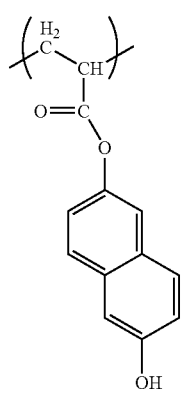
(f2-3-43)

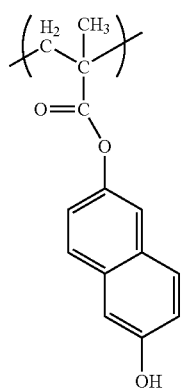
(f2-3-44)

Among these, as the structural unit (f2), at least one structural unit selected from the group consisting of structural units containing a group represented by general formula (f2-1), (f2-2) or (f2-3) is preferable. In terms of the effects of the present invention, a structural unit containing a group represented by general formula (f2-1) or (f2-2) is more preferable, and a structural unit derived from an acrylate ester is particularly desirable.

More specifically, at least one structural unit selected from the group consisting of a structural unit represented by general formula (f2-1-10), a structural unit represented by general formula (f2-1-20), a structural unit represented by general formula (f2-1-30), a structural unit represented by general formula (f2-2-0) and a structural unit represented by general formula (f2-3-0) is preferable; a structural unit represented by general formula (f2-1-10), a structural unit represented by general formula (f2-1-20), a structural unit represented by general formula (f2-1-30) or a structural unit represented by general formula (f2-2-0) is more preferable; and a structural unit represented by general formula (f2-1-10) or a structural unit represented by general formula (f2-2-0) is particularly desirable.

In the component (F), as the structural unit (f2), one type of structural unit may be used alone, or two or more types of structural units may be used in combination.

In the component (F), the amount of the structural unit (f2) based on the combined total of all structural units constituting the component (F) is preferably 1 to 80 mol %, more preferably 5 to 70 mol %, and most preferably 5 to 60 mol %. By ensuring that the amount of the structural unit (f2) is at least as large as the lower limit of the above-mentioned range, the dissolution inhibiting effect of the exposed portions in a developing solution can be improved, and a resist pattern having an excellent shape can be obtained. On the other hand, by ensuring that the amount is no more than the upper limit of the above-mentioned range, a good balance can be achieved with the other structural units.

When the component (F) is used as a base resin, it is preferable that the amount of the structural unit (f2) be high, and more preferably 20 mol % or more.

Other Structural Units

The component (F) may include a structural unit other than the structural unit (f1) and the structural unit (f2), as long as the effects of the present invention are not impaired.

Such a structural unit is not particularly limited, although it is preferable to use a structural unit derived from a compound copolymerizable with a compound or precursor for deriving the structural unit (f1) and the structural unit (f2). Examples of such structural units include structural units which have been proposed for the base resin of a conventional chemically amplified resist.

Examples of compounds for deriving the structural unit (f1) include a compound represented by general formula (f0-1) shown below and a compound represented by general formula (f0-2) shown below (hereafter, frequently referred to as "fluorine-containing compounds (F0)"). Further, examples of precursors for the fluorine-containing compounds (F0) include compounds represented by general formula (f0-1) and (f1-2) in which —O—$R^2$ have been substituted with —O—H (i.e., carboxylic acid compounds).

[Chemical Formula 26]

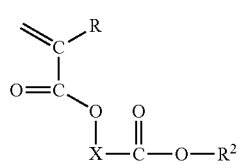
(f0-1)

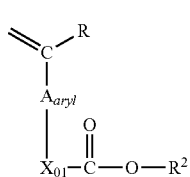

In the formulas, R, X, $A_{aryl}$, $X_{01}$ and $R^2$ are the same as defined above.

Specific examples of structural units other than the structural unit (f1) and the structural unit (f2) include a structural unit having an alkali-soluble group (hereafter, referred to as "structural unit (f3)"), a structural unit represented by general formula (f4-0) described later (hereafter, referred to as "structural unit (f4)"), and structural units (a1), (a2), (a1'), (a2') and (a4') described later as structural units which the component (A) may have.

Among these, as a structural unit other than the structural unit (f1) and the structural unit (f2) which may be included in the component (F), a structural unit (f3) is preferable.

Structural Unit (f3)

The component (F) may include a structural unit (f3) having an alkali-soluble group, as well as the structural unit (f1) and the structural unit (f2).

In the present description and claims, an "alkali-soluble group" refers to an organic group that is soluble in a basic solution. Therefore, an "alkali-soluble group" is a group that is soluble in an alkali developing solution (e.g., a 2.38% by weight aqueous solution of tetramethylammonium hydroxide (TMAH) at 23° C.). More specifically, an "alkali-soluble group" refers to a group that exhibits about the same acid dissociation constant (pKa) as that of a phenolic hydroxyl group, and has a group that is capable of forming an alkali-soluble group such as an alcoholic hydroxyl group or a carboxy group, namely, a group exhibiting a small pKa value (the pKa value is not particularly limited, and is preferably in the range of 6 to 12).

The alkali-soluble group is not particularly limited as long as it satisfies the definition described above. The alkali-soluble group may be an acidic group, or a group having a base dissociable group that is dissociated by the action of a basic solution (e.g., an alkali developing solution) to generate an acidic group and increase the solubility of the group in the basic solution.

The alkali-soluble group for the structural unit (f3) is preferably fluorinated, as the hydrophobicity is improved.

Specific examples of alkali-soluble groups for the structural unit (f3) include a carboxy group, an alcoholic hydroxy group which has no particular limitation with respect to the bonding position, and a hydroxyalkyl group in which a hydrogen atom bonded to the carbon atom on the α-position has been substituted with an electron-withdrawing group.

With respect to the hydroxyalkyl group in which a hydrogen atom bonded to the carbon atom on the α-position has been substituted with an electron-withdrawing group, examples of electron-withdrawing groups include a halogen atom and a halogenated alkyl group.

Examples of halogen atoms include a fluorine atom and a chlorine atom, and a fluorine atom is preferable.

In the halogenated alkyl group, the halogen atom as the substituent is the same as the halogen atom described above. The alkyl group is preferably a lower alkyl group of 1 to 3 carbon atoms, more preferably a methyl group or an ethyl group, and most preferably a methyl group. Specific examples of halogenated alkyl groups include a trifluoromethyl group, a difluoromethyl group, a monofluoromethyl group and a perfluoroethyl group, and a trifluoromethyl group is particularly desirable.

The number of the electron-withdrawing group is preferably 1 or 2, and more preferably 2.

As the structural unit (f3), a structural unit having a carboxy group is preferable. Preferable examples of structural units having a carboxy group include structural units represented by general formulas (f3-1), (f3-2) and (f3-3) shown below.

[Chemical Formula 27]

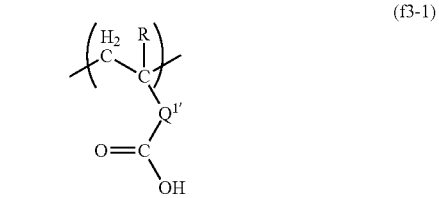

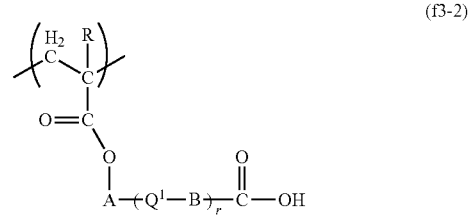

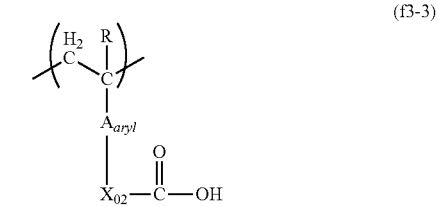

In the formulas, R represents a hydrogen atom, a lower alkyl group or a halogenated lower alkyl group; $Q^1$ represents a single bond or a divalent linking group; each of A and B independently represents a divalent hydrocarbon group which may have a substituent; $Q^1$ represents a divalent linking group containing an oxygen atom; r represents 0 or 1; $A_{aryl}$ represents an aromatic cyclic group which may have a substituent; and $X_{02}$ represents a single bond, $-(R^{72})_{a0}-O-[C(=O)]_{b0}-R^{82'}-$ or $-C(=O)-O-R^{92'}-$.

In general formula (f3-1), R is as defined above, and is preferably a hydrogen atom or a methyl group.

In general formula (f3-1), $Q^{1'}$ represents a single bond or a divalent linking group. Examples of the divalent linking group for $Q^{1'}$ include the same divalent linking groups as those described above for $X_{01}$ in general formula (f1-2), and divalent aromatic hydrocarbon groups. Examples of divalent aromatic hydrocarbon groups include aromatic hydrocarbon groups of 6 to 20 carbon atoms such as groups in which two hydrogen atoms have been removed from a benzene ring, a naphthalene ring or an anthracene ring.

In a structural unit (f3) represented by general formula (f3-1), $Q^{1'}$ is preferably a single bond or $-C(=O)-O-R^c-$ (in the formula, $R^c$ represents a linear or branched alkylene group of 1 to 10 carbon atoms which may contain an oxygen atom, and the alkylene group may be fluorinated), and more preferably a single bond.

In general formula (f3-2), R is as defined above, and is preferably a hydrogen atom or a methyl group.

In general formula (f3-2), A represents a divalent hydrocarbon group which may have a substituent, preferably a linear alkylene group, a branched alkylene group or a divalent aromatic hydrocarbon group. Examples of divalent aromatic hydrocarbon groups for A include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

In a structural unit (f3) represented by general formula (f3-2), it is particularly desirable that A be an ethylene group, an aromatic hydrocarbon group in which one hydrogen atom has been removed from a phenyl group, or an aromatic hydrocarbon group in which one hydrogen atom has been removed from a naphthyl group.

In general formula (f3-2), B represents a divalent hydrocarbon group which may have a substituent, preferably a linear or branched alkylene group, and a methylene group or an ethylene group is particularly desirable.

In general formula (f3-2), $Q^1$ represents a divalent linking group containing an oxygen atom, preferably —O—, —C(=O)—, —C(=O)—O—, —O—C(=O)—, a carbonate bond (—O—C(=O)—O—) or —NH—C(=O)—, and most preferably —O—, —C(=O)—O— or —O—C(=O)—.

In general formula (f3-2) above, r represents 0 or 1.

In general formula (f3-3), R is as defined above, and is preferably a hydrogen atom or a methyl group.

In general formula (f3-3), $A_{aryl}$ is the same as defined for $A_{aryl}$ in general formula (f1-2).

In general formula (f3-3), $X_{02}$ represents a single bond, —$(R^{72'})_{a0}$—O—$[C(=O)]_{b0}$—$R^{82'}$- or —C(=O)—O—$R^{92'}$—.

Each of $R^{72'}$, $R^{82'}$ and $R^{92'}$ independently represents a linear, branched or cyclic alkylene group of 1 to 10 carbon atoms, and preferably a linear or branched alkylene group of 1 to 5 carbon atoms or a cyclic alkylene group of 4 to 10 carbon atoms.

a0 represents 0 or an integer of 1 to 5. b0 represents 0 or 1.

Specific examples of structural units represented by general formulas (f3-1) to (f3-3) are shown below.

In general formulas (f3-1-1), (f3-2-1) to (f3-2-6) and (f3-3-1) to (f3-3-3), R is the same as defined above, and is preferably a hydrogen atom or a methyl group.

[Chemical Formula 28]

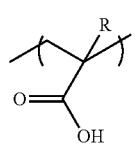

(f3-1-1)

[Chemical Formula 29]

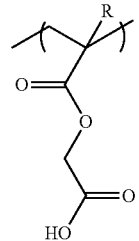

(f3-2-1)

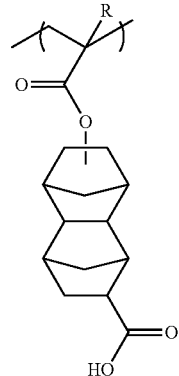

(f3-2-2)

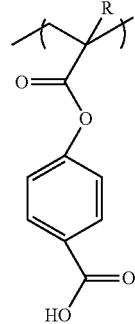

(f3-2-3)

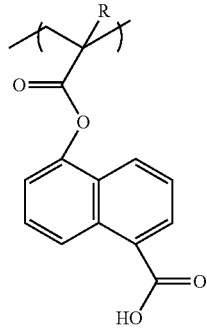

(f3-2-4)

(f3-2-5)
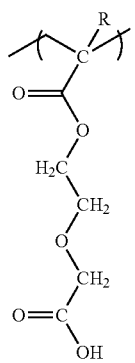

[Chemical Formula 30]

(f3-2-6)
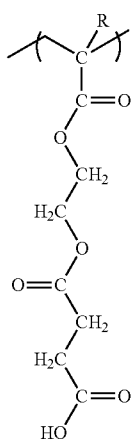

(f3-3-1)
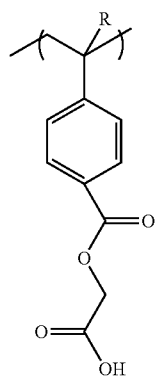

(f3-3-2)
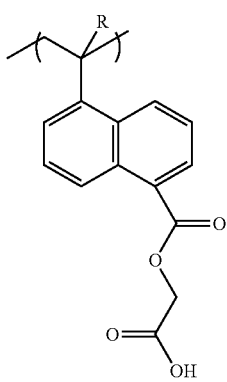

(f3-3-3)
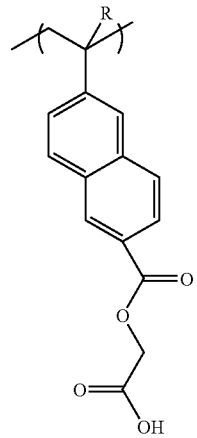

Other examples of the structural unit (f3) include structural units having a group represented by general formula (f3-4-1), a group represented by general formula (f2-4-2) or a group represented by general formula (f3-4-3).

[Chemical Formula 31]

(f3-4-1)
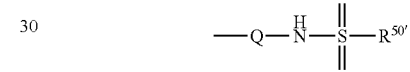

(f3-4-2)

(f3-4-3)
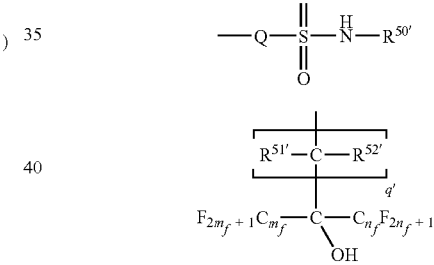

In general formula (f3-4-1), Q represents a divalent linking group or a single bond; and $R^{50'}$ represents a fluorinated alkyl group. In general formula (f3-4-2), Q and $R^{50'}$ are the same as defined above. In general formula (f3-4-3), each of $R^{51'}$ and $R^{52'}$ independently represents a hydrogen atom, a lower alkyl group of 1 to 5 carbon atoms, a fluorine atom or a fluorinated alkyl group; each of $m_f$ and $n_f$ independently represents an integer of 0 to 5 (with the provision that $m_f + n_f \geq 1$); and q' represents an integer of 0 to 5.

In general formula (f3-4-1), Q represents a divalent linking group or a single bond.

Examples of divalent linking groups include linear, branched or cyclic alkylene groups of 1 to 8 carbon atoms such as a methylene group, an ethylene group, a propylene group, an isopropylene group, a cyclopropylene group, an n-butylene group, an isobutylene group, a pentene group, an isopentene group, a neopentene group, a cyclopentylene group, a cyclohexylene group, a cycloheptylene group and a cyclooctylene group. The divalent group for Q may contain a hetero atom, and examples of such divalent linking groups include an ether group, an ester group and a group in which at least one hydrogen atom and/or carbon atom within the aforementioned alkylene group has been substituted with a hetero atom. Among these, in terms of ease in synthesis, a linear alkylene group is preferable, and a methylene group is particularly desirable.

$R^{50'}$ represents a fluorinated alkyl group. The fluorinated alkyl group is a group in which part or all of the hydrogen atoms of a linear, branched or cyclic alkyl group have been substituted with fluorine atoms.

The linear or branched alkyl group is preferably an alkyl group of 1 to 10 carbon atoms, more preferably an alkyl group of 1 to 8 carbon atoms, and still more preferably an alkyl group of 1 to 5 carbon atoms. Examples of alkyl groups include a methyl group, an ethyl group, a propyl group, an isopropyl group, an n-butyl group, an isobutyl group, a pentyl group, an isopentyl group and a neopentyl group. Among these, a propyl group is particularly desirable.

The cyclic alkyl group preferably has 4 to 12 carbon atoms, more preferably 5 to 10 carbon atoms, and most preferably 6 to 10 carbon atoms.

The fluorination ratio within the fluorinated alkyl group is preferably from 10 to 100%, more preferably from 30 to 100%, still more preferably from 50 to 100%, and is most preferably 100%, meaning groups in which all the hydrogen atoms have been substituted with fluorine atoms are the most preferred. Provided the fluorination ratio is at least 10%, the composition provides a superior improvement in the hydrophobicity of the resist film surface.

Among these examples, the fluorinated alkyl group for $R^{50'}$ is preferably a linear or branched fluorinated alkyl group, more preferably a fluorinated alkyl group of 1 to 5 carbon atoms, and most preferably a perfluoroalkyl group in which all of the hydrogen atoms within the alkyl group have been substituted with fluorine atoms. Specific examples of such perfluoroalkyl groups include a trifluoromethyl group and a pentafluoroethyl group, and a trifluoromethyl group is particularly desirable.

In general formula (f3-4-2), Q and $R^{50'}$ are the same as defined for Q and $R^{50'}$ in general formula (f3-4-1).

In general formula (f3-4-3), each of $R^{51'''}$ and $R^{52'}$ independently represents a hydrogen atom, a lower alkyl group of 1 to 5 carbon atoms, a fluorine atom or a fluorinated lower alkyl group.

As the lower alkyl group of 1 to 5 carbon atoms for $R^{51'}$ and $R^{52'}$, a linear or branched lower alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group. Among these, a methyl group is particularly desirable.

Examples of the fluorinated lower alkyl group for $R^{51'}$ and $R^{52'}$ include groups in which at least one hydrogen atom within the aforementioned lower alkyl group for $R^{50'}$ has been substituted with a fluorine atom.

Among these examples, as $R^{51'}$ and $R^{52'}$, a hydrogen atom is preferable, and it is particularly desirable that both $R^{51'}$ and $R^{52'}$ are hydrogen atoms.

Each of $m_f$ and $n_f$ independently represents an integer of 0 to 5 (with the provision that $m_f + n_f \geq 1$), and is preferably an integer of 1 to 3. In terms of achieving a superior effect for the present invention, $m_f$ and $n_f$ are most preferably both 1.

q' represents an integer of 0 to 5, is preferably an integer of 0 to 3, is more preferably either 0 or 1, and is most preferably 1.

The main chain of a structural unit (f3) having a group represented by any one of general formulas (f3-4-1) to (f3-4-3) is not particularly limited, and examples of such a structural unit (f3) include a structural unit having a cyclic main chain (hereafter, referred to as "cyclic-main chain structural unit") and a structural unit derived from an acrylate ester. Among these examples, a structural unit (a1') described later is preferable.

In the present description, the component (F) includes a "cyclic-main chain structural unit" means that a structural unit constituting the component (F) has a monocyclic or polycyclic ring structure, and at least one carbon atom within the ring structure, preferably two or more carbon atoms within the ring structure constitutes the main chain. By including a cyclic-main chain structural unit, the etching resistance is improved. It is presumed that such improvement in the etching resistance is due to the high carbon density of the cyclic main chain.

Examples of cyclic-main chain structural units include a structural unit derived from a polycycloolefin (polycyclic olefin) and a dicarboxylic acid anhydride-containing structural unit described later in relation to the structural unit (f4).

Among these examples, in terms of improvement in the etching resistance of the formed resist, it is preferable that the main chain has a structural unit derived from a polycycloolefin.

As a structural unit derived from a polycycloolefin, a structural unit having a basic skeleton represented by general formula (f3-4') shown below is preferable.

[Chemical Formula 32]

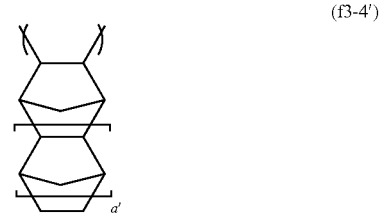

(f3-4')

In general formula (f3-4'), a' represents 0 or 1.

In general formula (f3-4'), a' represents 0 or 1. In terms of industrial availability, a' is preferably 0.

In the present description, a "structural unit having a basic skeleton represented by general formula (f3-4')" may be either a structural unit represented by general formula (f3-4') per se (i.e., a structural unit derived from bicyclo[2.2.1]-2-heptene(norbornene) or a structural unit derived from tetracyclo[4.4.0.1$^{2,5}$.1$^{7,10}$]-3-dodecene), or a structural unit having a substituent on the ring skeleton. In other words, a "structural unit having a basic structure represented by general formula (f3-4')" includes structural units in which part or all of the hydrogen atoms bonded to the carbon atoms that constitute the cyclic structure (namely, bicyclo[2.2.1]-2-heptane or tetracyclo[4.4.0.1$^{2,5}$.1$^{7,10}$]-3-dodecane) are substituted with an atom or a substituent other than hydrogen.

Specific examples of preferable structural units for the structural unit (f3) include structural units (f3-4) represented by general formula (f3-4) shown below.

[Chemical Formula 33]

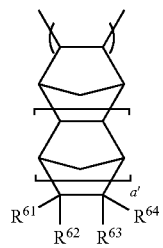

(f3-4)

In general formula (f3-4), each of $R^{61}$ to $R^{64}$ independently represents a hydrogen atom, a fluorine atom, a linear or branched alkyl group, a fluorinated alkyl group, a group represented by general formula (f3-4-1), a group represented by general formula (f3-4-2) or a group represented by general formula (f3-4-3), with the provision that at least one of $R^{61}$ to $R^{64}$ is a group represented by general formula (f3-4-1), a group represented by general formula (f3-4-2), or a group represented by general formula (f3-4-3); and a' represents 0 or 1.

The structural unit represented by general formula (f3-4) is a structural unit having a basic structure represented by general formula (f3-4'), and also having a group represented by general formula (f3-4-1), a group represented by general formula (f3-4-2) or a group represented by general formula (f3-4-3) as a substituent at a specific position on the ring structure.

In the present invention, including a structural unit (f3-4) as the structural unit (f3) improves the hydrophobicity of the resist film surface. Further, the lithography properties are also improved.

In general formula (f3-4), a' is the same as defined above for a' in formula (f3-4').

In general formula (f3-4), each of $R^{61}$ to $R^{64}$ independently represents a hydrogen atom, a fluorine atom, a linear or branched alkyl group, a fluorinated alkyl group, a group represented by general formula (f3-4-1), a group represented by general formula (f3-4-2) or a group represented by general formula (f-4-3).

Examples of the linear or branched alkyl group for $R^{61}$ to $R^{64}$ include the same linear or branched alkyl groups as those described above in relation to $R^{50'}$.

Examples of the fluorinated alkyl group for $R^{61}$ to $R^{64}$ include the same fluorinated alkyl groups as those described above in relation to $R^{50'}$.

At least one of $R^{61}$ to $R^{64}$ must be a group represented by general formula (f3-4-1), a group represented by general formula (f3-4-2) or a group represented by general formula (f3-4-3), and a group represented by general formula (f3-4-1) or a group represented by general formula (f3-4-3) is preferable.

Among these examples, structural units in which at least one of $R^{61}$ to $R^{64}$ is a group represented by general formula (f3-4-1) and the remaining 0 to 3 groups are one or more moieties selected from the group consisting of a hydrogen atom and linear or branched alkyl groups; and structural units in which at least one of $R^{61}$ to $R^{64}$ is a group represented by general formula (f3-4-3) and the remaining 0 to 3 groups are one or more moieties selected from the group consisting of a hydrogen atom and linear or branched alkyl groups are preferable.

Of these, structural units in which one of $R^{61}$ to $R^{64}$ is a group represented by general formula (f3-4-1) and the remaining three groups are hydrogen atoms; and structural units in which one of $R^{61}$ to $R^{64}$ is a group represented by general formula (f3-4-3) and the remaining three groups are hydrogen atoms are particularly desirable.

As the structural unit represented by general formula (f3-4), a structural unit represented by general formula (f3-4-1') shown below or a structural unit represented by general formula (f3-4-3') shown below is preferable.

[Chemical Formula 34]

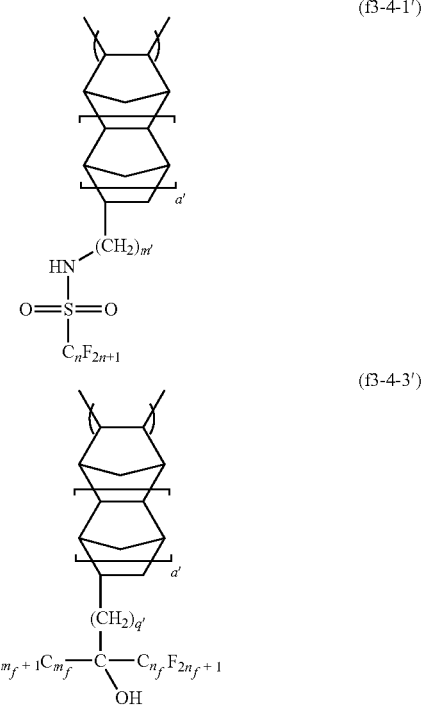

In general formulas (f3-4-1') and (f3-4-3'), a' is the same as defined above for a' in formula (f3-4).

In general formula (f3-4-1'), m represents an integer of 1 to 5, preferably an integer of 1 to 3, and most preferably 1.

n is preferably an integer of 1 to 5, and is most preferably 1.

In general formula (f3-4-3'), q' is the same as defined above for q' in formula (f3-4-3), and is most preferably 1.

$m_f$ and $n_f$ are the same as defined above for $m_f$ and $n_f$ in formula (f3-4-3), and it is particularly desirable that both of $m_f$ and $n_f$ are 1.

A monomer for deriving a structural unit represented by general formula (f3-4) can be synthesized, for example, by a method disclosed in U.S. Pat. No. 6,420,503.

As the structural unit (f3), at least one structural unit selected from the group consisting of structural units represented by general formulas (f3-1) to (f3-3), (f3-4-1') and (f3-4-3') is preferable, at least one structural unit selected from the group consisting of structural units represented by general formulas (f3-1) to (f3-3) is more preferable, and a structural unit represented by general formula (f3-1) is particularly desirable.

More specifically, as the structural unit (f3), at least one structural unit selected from the group consisting of structural units represented by general formulas (f3-1-1), (f3-2-1) to (f3-2-6) and (f3-3-1) to (f3-3-3) is preferable, and a structural unit represented by general formula (f3-1-1) is particularly desirable.

In the component (F), as the structural unit (f3), one type of structural unit may be used alone, or two or more types of structural units may be used in combination.

In the component (F), it preferable that the amount of the structural unit (f3) be smaller than that of the structural unit (f1). For example, the amount of the structural unit (f3) based on the combined total of structural units constituting the component (F) is preferably 1 to 40 mol %, more preferably 3 to 35 mol %, and still more preferably 5 to 33 mol %.

Structural Unit (f4)

The component (F) may include a structural unit (f4) represented by general formula (f4-0) shown below, as well as the structural unit (f1) and the structural unit (f2).

[Chemical Formula 35]

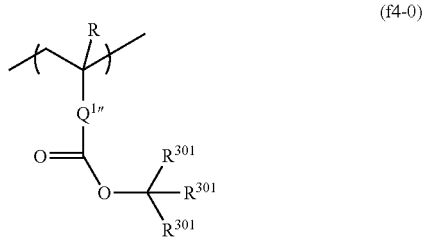

(f4-0)

In the formula, R represents a hydrogen atom, a lower alkyl group or a halogenated lower alkyl group; $Q^{1'''}$ represents a single bond or a divalent linking group; and at least one $R^{301}$ represents a linear or branched alkyl group of 1 to 4 carbon atoms which may have a substituent, and the or each remaining $R^{301}$ independently represents a linear or branched alkyl group of 1 to 4 carbon atoms or a monovalent aliphatic cyclic group of 4 to 20 carbon atoms which may have a substituent, or the remaining two $R^{301}$ may be mutually bonded to form a divalent aliphatic cyclic group of 4 to 20 carbon atoms together with the carbon atom to which the two $R^{301}$ are bonded, and the plurality of $R^{301}$ may be the same or different from each other.

In general formula (f4-0), R represents a hydrogen atom, a lower alkyl group or a halogenated lower alkyl group. As the lower alkyl group and halogenated lower alkyl group for $R^1$, the same groups as those for R above can be used.

In general formula (f4-0), $Q^{1'''}$ represents a single bond or a divalent linking group. As the divalent linking group for $Q^{1'''}$, the same groups as those for $X_{01}$ in general formula (f1-2) or divalent aromatic hydrocarbon groups can be used. Examples of divalent aromatic hydrocarbon groups include aromatic hydrocarbon groups of 6 to 20 carbon atoms such as groups in which two hydrogen atoms have been removed from a benzene ring, a naphthalene ring or an anthracene ring.

In the structural unit (f4), $Q^{1'''}$ is preferably a single bond or a group represented by the formula —C(=O)—O—$R^c$— (in the formula, $R^c$ represents a linear or branched alkylene group of 1 to 10 carbon atoms which may contain an oxygen atom, and the alkylene group may be fluorinated), and more preferably a single bond.

In general formula (f4-0), the plurality of $R^{301}$ may be the same or different from each other. At least one $R^{301}$ represents a linear or branched alkyl group of 1 to 4 carbon atoms which may have a substituent, and the or each remaining $R^{301}$ independently represents a linear or branched alkyl group of 1 to 4 carbon atoms or a monovalent aliphatic cyclic group of 4 to 20 carbon atoms which may have a substituent. Alternatively, the remaining two $R^{301}$ may be mutually bonded to form a divalent aliphatic cyclic group of 4 to 20 carbon atoms together with the carbon atom to which the two $R^{301}$ are bonded.

Examples of linear or branched alkyl groups of 1 to 4 carbon atoms include a methyl group, an ethyl group, a propyl group, an isopropyl group, an n-butyl group, an isobutyl group and a tert-butyl group.

As the aliphatic cyclic group, for example, a group in which one or more hydrogen atoms have been removed from a monocycloalkane or a polycycloalkane such as a bicycloalkane, a tricycloalkane or a tetracycloalkane can be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Specific examples of such groups include a cyclopentyl group, a cyclohexyl group, a norbornyl group and an adamantyl group.

As an example of a substituent for $R^{301}$, a halogen atom such as a fluorine atom can be given.

Preferable examples of the structural unit (f4) include structural units represented by general formulas (f4-1) to (f4-8) shown below. In the formulas shown below, R is as defined above, and is preferably a hydrogen atom or a methyl group.

[Chemical Formula 36]

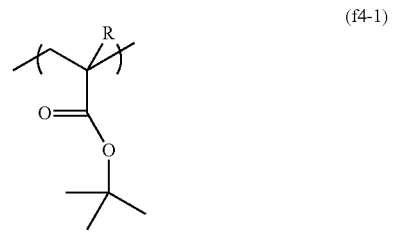

(f4-1)

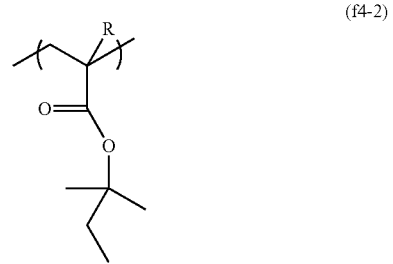

(f4-2)

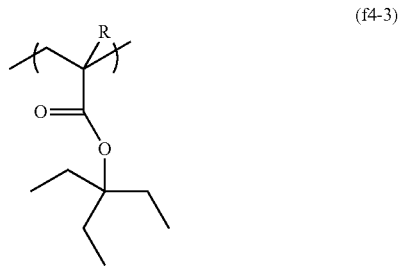

(f4-3)

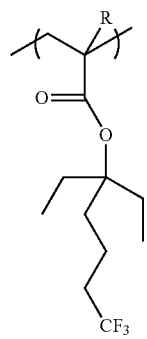
(f4-4)

[Chemical Formula 37]

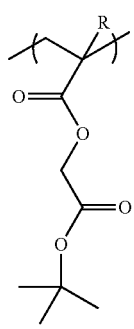
(f4-5)

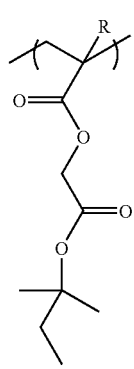
(f4-6)

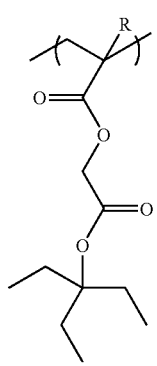
(f4-7)

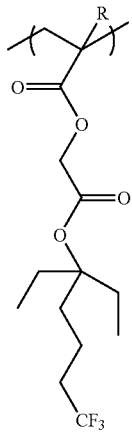
(f4-8)

Among these, as the structural unit (f4), a structural unit represented by general formula (f4-0) is preferable, more preferably at least one structural unit selected from the group consisting of structural units represented by general formulas (f4-1) to (f4-8), still more preferably at least one structural unit selected from the group consisting of structural units represented by general formulas (f4-1) to (f4-4), and at least one structural unit selected from the group consisting of structural units represented by general formulas (f4-1) to (f4-3) is particularly desirable.

In the component (F), as the structural unit (f4), one type of structural unit may be used, or two or more types may be used in combination.

In the component (F), it preferable that the amount of the structural unit (f4) be smaller than that of the structural unit (f1). For example, the amount of the structural unit (f4) based on the combined total of structural units constituting the component (F) is preferably 1 mol % to less than 50 mol %, more preferably 5 to 45 mol %, still more preferably 10 to 45 mol %, and most preferably 15 to 45 mol %.

In the present invention, the component (F) is a polymeric compound including a structural unit (f1) and a structural unit (f2).

Examples of such polymeric compounds include a copolymer consisting of a structural unit (f1) and a structural unit (f2); a copolymer consisting of a structural unit (f1), a structural unit (f2) and a structural unit (f3); a copolymer consisting of a structural unit (f1), a structural unit (f2) and a structural unit (f4); and a copolymer consisting of a structural unit (f1), a structural unit (f2), a structural unit (f3) and a structural unit (f4).

Among these, as the component (F), a copolymer consisting of a structural unit (f1), a structural unit (f2) and a structural unit (f3) or a copolymer consisting of a structural unit (f1) and a structural unit (f2) is preferable because it exhibits an excellent solubility in an alkali developing solution.

The weight average molecular weight (Mw) (the polystyrene equivalent value determined by gel permeation chromatography) of the component (F) is not particularly limited, but is preferably 2,000 to 50,000, more preferably 3,000 to 30,000, and most preferably 4,000 to 25,000. By ensuring that the weight average molecular weight is no more than the upper limit of the above-mentioned range, the resist composition exhibits a satisfactory solubility in a resist solvent. On the other hand, by ensuring that the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

As the component (F), one type of compound may be used, or two or more types of compounds may be used in combination.

In the negative resist composition of the present invention, when a polymeric compound (A1) and/or a polymeric compound (A2) described later is used as a base resin for the negative resist composition, i.e., when the component (F) is not used as a base resin but as an additive, the amount of the component (F) relative to 100 parts by weight of the component (A) excluding the component (F) is preferably 0.1 to 50 parts by weight, more preferably 0.1 to 40 parts by weight, still more preferably 0.5 to 30 parts by weight, and most preferably 1 to 15 parts by weight. By ensuring that the amount of the component (F) is at least as large as the lower limit of the above-mentioned range, an excellent solubility in an alkali developing solution can be achieved, and a resist pattern having an excellent shape can be obtained. Further, when it contains a fluorine atom, the characteristic feature of exhibiting hydrophobicity during immersion exposure is improved. On the other hand, by ensuring that the amount is no more than the upper limit of the above-mentioned range, the lithography properties are improved.

Alternatively, the component (F) can be used as a base resin for the negative resist composition. In such a case, the amount of the component (F) contained in the component (A) is preferably 50% by weight or more, more preferably 70% by weight or more, still more preferably 90% by weight or more, and most preferably 100% by weight. By ensuring that the amount of the component (F) is at least as large as the lower limit of the above-mentioned range, an excellent solubility in an alkali developing solution can be achieved, and a resist pattern having an excellent shape can be obtained. Further, when it contains a fluorine atom, the characteristic feature of exhibiting hydrophobicity during immersion exposure is improved.

[Component (A1)]

The component (A1) includes a structural unit (a1) that contains, within the main chain, an aliphatic cyclic group having a fluorinated hydroxyalkyl group (hereafter, simply abbreviated as "structural unit (a1)").

Further, the component (A1) preferably also includes, in addition to the structural unit (a1), a structural unit (a2) having a hydroxyalkyl group (hereafter, simply abbreviated as "structural unit (a2)").

Structural Unit (a1)

The component (A1) includes a structural unit (a1) that contains, within the main chain, an aliphatic cyclic group having a fluorinated hydroxyalkyl group.

In the structural unit (a1), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one, and preferably two or more carbon atoms within the ring structure of the aliphatic cyclic group constitute part of the main chain of the component (A1).

In the present invention, by using a component (A) that includes a component (A1) containing the structural unit (a1), the solubility of the resist film within an alkali developing solution is enhanced, and lithography properties such as the resolution, resist pattern shape, and line edge roughness (LER) are also improved. Further, because the resin (A1) includes the aliphatic cyclic group (such as a norbornane or tetracyclododecane structure) within the main chain, the carbon density is increased, yielding an improvement in the etching resistance.

Here, a "fluorinated hydroxyalkyl group" refers to a hydroxyalkyl group, in which a portion of the hydrogen atoms of an alkyl group have been substituted with hydroxyl groups, wherein some or all of the remaining hydrogen atoms within the hydroxyalkyl group have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group.

Although there are no particular limitations on the number of carbon atoms within the alkyl group, the number of carbon atoms is preferably from 1 to 20, more preferably from 4 to 16, and most preferably from 4 to 12.

There are no particular limitations on the number of hydroxyl groups, although a single hydroxyl group is preferred.

Of the various possibilities, groups in which a fluorinated alkyl group and/or a fluorine atom is bonded to the carbon atom to which the hydroxyl group is bonded (which refers to the α-position carbon atom of the hydroxyalkyl group) are preferred as the fluorinated hydroxyalkyl group.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The term "aliphatic" in the expression "aliphatic cyclic group having a fluorinated hydroxyalkyl group" is a relative concept used in relation to the term "aromatic", and defines a group or compound or the like that contains no aromaticity. The aliphatic cyclic group may be either monocyclic or polycyclic.

The expression "monocyclic aliphatic cyclic group" describes a monocyclic group that contains no aromaticity, whereas the expression "polycyclic aliphatic cyclic group" describes a polycyclic group that contains no aromaticity.

In the structural unit (a1), the aliphatic cyclic group is preferably a polycyclic group, as such groups provide superior etching resistance and the like.

The aliphatic cyclic group includes both hydrocarbon groups formed solely from carbon and hydrogen (alicyclic groups), and heterocyclic groups in which a portion of the carbon atoms that constitute the ring structure of an alicyclic group have been substituted with a hetero atom such as an oxygen atom, nitrogen atom, or sulfur atom. These aliphatic cyclic groups may include substituent groups, and examples of these substituent groups include alkyl groups of 1 to 5 carbon atoms.

The expression "include substituent groups" means that some or all of the hydrogen atoms bonded to the carbon atoms that constitute the ring structure of the aliphatic cyclic group have been substituted with substituent groups (atoms or groups other than a hydrogen atom). In the present invention, an alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The aliphatic cyclic group preferably has 5 to 15 carbon atoms.

Specific examples of the aliphatic cyclic group include the groups described below.

Examples of the monocyclic groups include groups in which two or more hydrogen atoms have been removed from a cycloalkane. Specific examples include groups in which two or more hydrogen atoms have been removed from cyclopentane or cyclohexane.

Examples of the polycyclic groups include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions used in ArF excimer laser processes.

Of the various possibilities, groups in which two or more hydrogen atoms have been removed from cyclopentane, cyclohexane, adamantane, norbornane or tetracyclododecane are readily available industrially, and are consequently preferred.

Of the alicyclic groups described above, groups such as those shown in a structural unit (a1-1) below, in which three hydrogen atoms have been removed from norbornane or tetracyclododecane, are preferred, and groups in which three hydrogen atoms have been removed from norbornane are particularly desirable.

Of the units included within the definition of the structural unit (a1), structural units (a1-1) represented by general formula (a1-1) shown below are preferred. By including the structural unit (a1-1), the solubility of the resin in an alkali developing solution improves significantly. Furthermore, the lithography properties such as the resolution are also improved.

[Chemical Formula 38]

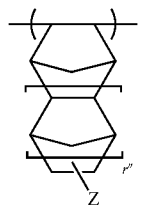

(a1-1)

In general formula (a1-1), Z represents a fluorinated hydroxyalkyl group, and r" is either 0 or 1.

In formula (a1-1), r" is either 0 or 1, and in terms of industrial availability, is preferably 0.

Further, in formula (a1-1), examples of the "fluorinated hydroxyalkyl group" represented by Z include the same groups as those described above. Of these, Z is preferably a group represented by general formula (a1-1-1) shown below, as such groups yield a particularly superior resist pattern shape as well as reduced levels of line edge roughness (LER).

"Line edge roughness (LER)" refers to non-uniform unevenness in the side walls of pattern lines.

[Chemical Formula 39]

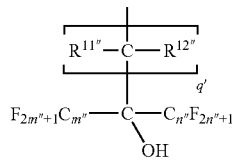

(a1-1-1)

In general formula (a1-1-1), $R^{11''}$ and $R^{12''}$ each independently represent a hydrogen atom or a lower alkyl group, m" and n" each independently represents an integer of 1 to 5, and q" also represents an integer of 1 to 5.

In formula (a1-1-1), $R^{11''}$ and $R^{12''}$ each independently represents a hydrogen atom or a lower alkyl group.

As the lower alkyl group, a linear or branched lower alkyl group of no more than 5 carbon atoms is preferred, and specific examples include a methyl group, an ethyl group, a propyl group, an isopropyl group, an n-butyl group, an isobutyl group, a tert-butyl group, a pentyl group, an isopentyl group or an neopentyl group, and a methyl group is particularly desirable.

Of the various possibilities, groups in which both $R^{11''}$ and $R^{12''}$ are hydrogen atoms are particularly desirable.

q" represents an integer of 1 to 5, and preferably an integer of 1 to 3, and is most preferably 1.

m" and n" each independently represents an integer of 1 to 5, and preferably an integer of 1 to 3. Groups in which both m" and n" are 1 are preferred in terms of ease of synthesis.

The structural unit (a1) may use either one type of structural unit, or a mixture of two or more types.

In the component (A1), the amount of the structural unit (a1) based on the combined total of all structural units constituting the component (A1) is preferably 50 to 90 mol %, more preferably 55 to 90 mol %, and still more preferably 60 to 80 mol %. Making this proportion at least as large as the lower limit of the above-mentioned range yields an improvement in the effects achieved by including the structural unit (a1). On the other hand, by making the proportion no more than the upper limit of the above-mentioned range, a good balance can be achieved with the other structural units.

Structural Unit (a2)

In addition to the structural unit (a1), the component (A1) preferably also includes a structural unit (a2) having a hydroxyalkyl group.

In the present invention, including a component (A1) containing the structural unit (a2) within the component (A) improves the solubility of the component (A) within an alkali developing solution. Further, the cross-linking of the component (A) with the component (C) is enhanced; meaning the difference in the solubility within the alkali developing solution (the contrast) between the exposed portions and the unexposed portions can be increased, enabling the composition to function more effectively as a negative resist.

As the structural unit (a2), units such as a structural unit (a210) that contains, within the main chain, an aliphatic cyclic group having a hydroxyalkyl group (hereafter abbreviated as "structural unit (a210)"), and a structural unit (a220) derived from an acrylate ester having a hydroxyl group-containing alkyl group (hereafter abbreviated as "structural unit (a220)") are preferred.

Structural Unit (a210)

In the present invention, the structural unit (a210) is a structural unit that contains, within the main chain, an aliphatic cyclic group having a hydroxyalkyl group.

Examples of the structural unit (a210) include the same units as those described above for the structural unit (a1), with the exception that the "fluorinated hydroxyalkyl group" within the structural unit (a1) is replaced with an unfluorinated hydroxyalkyl group, namely a hydroxyalkyl group in which a portion of the hydrogen atoms of an alkyl group have been substituted with hydroxyl groups, and the remaining hydrogen atoms have not been substituted with fluorine atoms.

Of the units included within the definition of the structural unit (a210), a structural unit represented by general formula (f2-1-30) (hereafter, referred to as "structural unit (a-1)") described above in relation to the structural unit (f2) for the component (F) can be given as a preferable example. By including the structural unit (a2-1), lithography properties such as the resolution, resist pattern shape and line width roughness (LWR) are improved. Further, a favorable contrast is more readily obtained, and thus, the etching resistance also improves.

Of these structural units, those represented by the above-mentioned chemical formulas (f2-1-31), (f2-1-32) and (f2-1-33) are preferred.

The structural unit (a210) may use either one type of structural unit, or a mixture of two or more types.

In the component (A1), the amount of the structural unit (a210) based on the combined total of all structural units constituting the component (A1) is preferably 10 to 50 mol %, more preferably 15 to 50 mol %, and still more preferably 20 to 45 mol %. Making this proportion at least as large as the lower limit of the above-mentioned range improves the effects achieved by including the structural unit (a210) such as improving the alkali solubility and making a favorable contrast more readily obtainable. On the other hand, by making the proportion no more than the upper limit of the above-mentioned range, a good balance can be achieved with the other structural units.

Structural Unit (a220)

The structural unit (a220) is a structural unit derived from an acrylate ester having a hydroxyl group-containing alkyl group.

If the structural unit (a220) is a structural unit that includes a hydroxyl group-containing cyclic alkyl group (hereafter abbreviated as "structural unit (a221)"), the resist pattern swelling suppression effect is further enhanced. Further, the resolution is also improved. Furthermore, favorable levels of contrast and etching resistance are also more readily obtained.

Examples of the structural unit (a221) include those units, amongst the structural units described below in the description of a "structural unit (a2') derived from an acrylate ester containing a hydroxyl group-containing aliphatic cyclic group" that constitutes a component (A2) described below, in which the aliphatic cyclic group is a saturated hydrocarbon group. Of these structural units, units in which the substituent bonded to the α-position of the acrylate ester is a fluorinated lower alkyl group are particularly preferred, and this substituent is most preferably a trifluoromethyl group (—$CF_3$).

Furthermore, if the structural unit (a220) is a structural unit that includes a hydroxyl group-containing chain-like alkyl group (hereafter abbreviated as "structural unit (a222)"), then the hydrophilicity of the entire component (A) is increased, the solubility of the component within an alkali developing solution is improved, and the resolution also improves. Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222) include those units, amongst the structural units described below in the explanation of a "structural unit (a3') derived from an acrylic acid that has no cyclic structure and has an alcoholic hydroxyl group on a side chain" that constitutes the component (A2) described below, that include a hydroxyalkyl group. Of these structural units, units having a hydroxyalkyl group at the acrylate ester portion are preferred, structural units in which the substituent bonded to the α-position of the acrylate ester is a fluorinated alkyl group are particularly preferred, and this substituent is most preferably a trifluoromethyl group (—$CF_3$).

The structural unit (a220) may use either one type of structural unit, or a mixture of two or more types.

In the component (A1), the amount of the structural unit (a220) based on the combined total of all structural units constituting the component (A1) is preferably 10 to 80 mol %, more preferably 15 to 60 mol %, and still more preferably 20 to 55 mol %. Making this proportion at least as large as the lower limit of the above-mentioned range ensures that the effects obtained by including the structural unit (a220) are achieved. On the other hand, by making the proportion no more than the upper limit of the above-mentioned range, a good balance can be achieved with the other structural units.

In those cases where the structural unit (a220) includes both the structural unit (a221) and the structural unit (a222), the mixing ratio between the two structural units, reported as a molar ratio, is preferably such that structural unit (a221): structural unit (a222) is from 9:1 to 1:9, more preferably from 8:2 to 2:8, and most preferably from 6:4 to 7:3.

By including the structural unit (a221) and the structural unit (a222) in a favorable balance that satisfies the above-mentioned mixing ratio, a favorable exposure margin can be obtained. Further, a suitable level of contrast is obtained, and the resolution is improved. Moreover, the etching resistance also improves.

Other Structural Units

In the negative resist composition of the present invention, besides the structural units (a1) and (a2) described above, the component (A) may also include other structural units typically used in the component (A) of conventional chemically amplified resist compositions.

However, in the present invention, the component (A1) is preferably a polymeric compound in which the structural units (a1) and (a2) represent the main components.

Here the term "main components" means that the combined quantity of the structural unit (a1) and the structural unit (a2), relative to the combined total of all the structural units that constitute the component (A), is preferably at least 70 mol %. This proportion is more preferably 80 mol % or higher, and may be 100 mol %. Of the various possibilities, polymeric compounds formed solely from the structural units (a1) and (a2) are the most desirable.

In the present invention, the combination of the structural unit (a1) and the structural unit (a2) within the component (A1) is preferably a combination of the structural unit (a1) and the structural unit (a210).

Of the various possibilities, the component (A1) is preferably a polymeric compound containing the structural unit (a1-1) represented by the above-mentioned general formula (a1-1) and the structural unit (a2-1) represented by the above-mentioned general formula (f2-1-30).

Preferred examples of the component (A1) include polymeric compounds containing the combinations of structural units represented by chemical formulas (A1-1) to (A1-4) shown below.

[Chemical Formula 40]

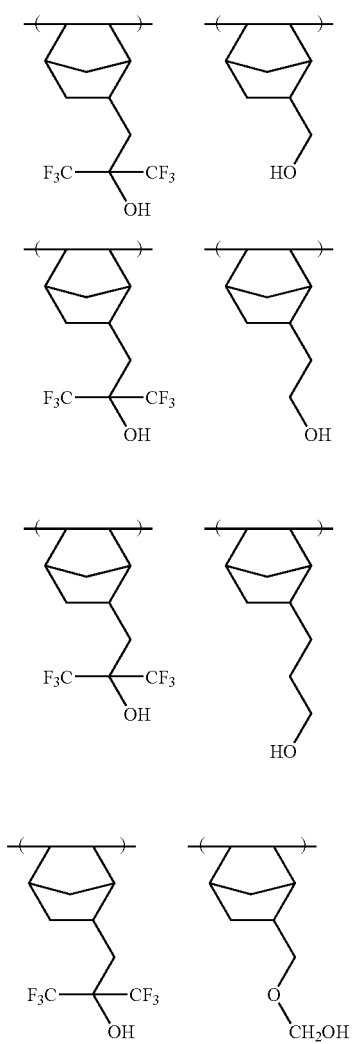

Of the above examples, the component (A1) is preferably a polymeric compound that includes at least one combination of structural units selected from the combinations represented by chemical formulas (A1-1) to (A1-4), and is most preferably a polymeric compound including the combination of structural units represented by chemical formula (A1-1).

In the present invention, the weight average molecular weight (Mw, the polystyrene equivalent molecular weight measured by gel permeation chromatography) of the component (A1) is preferably within a range from 2,000 to 10,000, more preferably from 3,000 to 6,000, and most preferably from 3,000 to 5,000. Ensuring that this molecular weight is at least as large as the lower limit of the above-mentioned range enables good contrast to be obtained, whereas ensuring the molecular weight is no more than the upper limit of the above-mentioned range can suppress swelling of the resist pattern. As a result, the resolution can be improved. Further, suppressing swelling of the pattern also yields an improvement in the depth of focus (DOF) properties and improved suppression of line edge roughness (LER). Furthermore, ensuring a weight average molecular weight within the above range is preferred in terms of achieving a large suppression effect on resist pattern swelling. For the weight average molecular weight, lower values within the above-mentioned range tend to yield more favorable properties.

Further, the degree of dispersion (Mw/Mn) is preferably from 1.0 to 5.0, and more preferably from 1.0 to 2.5. Mn represents the number average molecular weight. Here, Mn is the number average molecular weight.

When the component (A1) is used in the component (A), one type of the component (A1) may be used alone, or a mixture of two or more types may be used. In those cases where the component (A1) is used, the proportion of the component (A1) within the component (A) is preferably 40% by weight or more, more preferably 50% by weight or more, and most preferably 60% by weight or more.

[Component (A2)]

The component (A2) includes a structural unit (a1') that contains an aliphatic cyclic group having a fluorinated hydroxyalkyl group (hereafter, simply abbreviated as "structural unit (a1')").

Further, in addition to the structural unit (a1'), the component (A2) preferably also includes a structural unit (a2') (hereafter, simply abbreviated as "structural unit (a2')") derived from an acrylate ester containing a hydroxyl group-containing aliphatic cyclic group.

Furthermore, in addition to the structural unit (a1'), or in addition to a combination of the structural unit (a1') and the structural unit (a2'), the component (A2) preferably also includes a structural unit (a3') (hereafter, abbreviated as "structural unit (a3')") derived from an acrylic acid that has no cyclic structure and has an alcoholic hydroxyl group on a side chain.

Structural Unit (a1')

The structural unit (a1') is a structural unit that includes an aliphatic cyclic group having a fluorinated hydroxyalkyl group. Including the structural unit (a1') improves the solubility in an alkali developing solution. Further, swelling of the resist pattern is suppressed, and lithography properties such as the resolution, pattern shape and LWR are improved.

Examples of the aliphatic cyclic group having a fluorinated hydroxyalkyl group include the same groups as those described above for the structural unit (a1). As the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups, a group in which two hydrogen atoms have been removed from norbornane is particularly desirable.

The structural unit (a1') is preferably a structural unit derived from acrylic acid. A structure in which the above-mentioned aliphatic cyclic group is bonded to the oxygen atom (—O—) at the terminal of the carbonyloxy group [—C(O)—O-] of an acrylate ester (namely, a structure in which the hydrogen atom of the carboxyl group of acrylic acid has been substituted with the aliphatic cyclic group) is particularly desirable.

As the structural unit (a1'), structural units (a1'-1) represented by general formula (1) shown below are preferred.

[Chemical Formula 41]

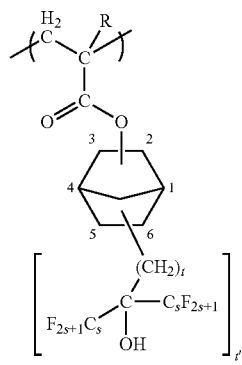

(1)

In general formula (1), R represents a hydrogen atom, a lower alkyl group or a halogenated lower alkyl group, and s, t and t' each independently represents an integer of 1 to 5.

In formula (1), R represents a hydrogen atom, a lower alkyl group or a halogenated lower alkyl group.

Examples of the lower alkyl group or halogenated lower alkyl group for R include the same groups as those described above for the lower alkyl group or halogenated lower alkyl group that may be bonded to the α-position of the above-mentioned acrylate ester.

In the present invention, R is preferably a hydrogen atom or a lower alkyl group, and in terms of industrial availability, is most preferably a hydrogen atom or a methyl group.

Each s independently represents an integer of 1 to 5, and is preferably an integer of 1 to 3, and most preferably 1.

t represents an integer of 1 to 5, preferably an integer of 1 to 3, and most preferably 1.

t' represents an integer of 1 to 3, preferably an integer of 1 to 2, and most preferably 1.

The structural unit (a1'-1) represented by general formula (1) preferably has a 2-norbornyl group or 3-norbornyl group bonded to the terminal of the carboxyl group of the (α-lower alkyl)acrylic acid. The fluorinated alkyl alcohol is preferably bonded to the 5th or 6th position of the norbornyl group.

The structural unit (a1') may use either one type of structural unit, or a mixture of two or more types.

The proportion of the structural unit (a1') within the component (A2), relative to the combined total of all the structural units that constitute the component (A2), is preferably within a range from 10 to 90 mol %, more preferably from 20 to 90 mol %, still more preferably from 40 to 90 mol %, and most preferably from 45 to 85 mol %. Making this proportion at least as large as the lower limit of the above-mentioned range ensures that the effects obtained by including the structural unit (a1') are achieved. On the other hand, by making the proportion no more than the upper limit of the above-mentioned range, a good balance can be achieved with the other structural units.

Structural Unit (a2')

In addition to the structural unit (a1'), the component (A2) preferably also includes a structural unit (a2') derived from an acrylate ester containing a hydroxyl group-containing aliphatic cyclic group.

When a component (A2) that includes the structural unit (a2') is blended into the negative resist composition, the hydroxyl group (the alcoholic hydroxyl group) of this structural unit (a2') reacts with the component (C) under the action of the acid generated from the component (B), and this reaction causes the component (A2) to change from a state that is soluble in the alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same aliphatic cyclic groups as those described above in relation to the structural unit (a1').

As the aliphatic cyclic group of the structural unit (a2'), of the groups described above, a cyclohexyl group, adamantyl group, norbornyl group or tetracyclododecanyl group are readily available commercially, and are preferred. Of these, a cyclohexyl group or adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a2'), the hydroxyl group-containing aliphatic cyclic group is preferably bonded to the oxygen atom at the terminal of the ester group (—C(O)—O—) of the acrylate ester.

In such cases, in the structural unit (a2'), another substituent may be bonded to the α-position (the α-position carbon atom) of the acrylate ester instead of a hydrogen atom. Examples of preferred substituents include a lower alkyl group or a halogenated lower alkyl group.

Examples of the lower alkyl group or halogenated lower alkyl group include the same groups as those described for R within general formula (1) representing the above-mentioned structural unit (a1'). Of the various moieties that can be bonded to the α-position, a hydrogen atom or a lower alkyl group is preferred, and a hydrogen atom or methyl group is particularly desirable.

As the structural unit (a2'), structural units (a2'-1) represented by general formula (2) shown below are preferred.

[Chemical Formula 42]

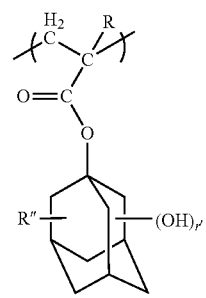

(2)

In general formula (2), R is as defined for R in general formula (1), R" represents a hydrogen atom, a lower alkyl group, or an alkoxy group of 1 to 5 carbon atoms, and r' represents an integer of 1 to 3.

R is the same as defined above for R in general formula (1).

The lower alkyl group for R" is the same as defined above for the lower alkyl group for R in general formula (1).

In general formula (2), R and R" are both preferably hydrogen atoms.

r' represents an integer of 1 to 3, and is most preferably 1.

Although there are no particular limitations on the bonding position of the hydroxyl group, units in which the hydroxyl group is bonded to the 3rd position of the adamantyl group are preferred.

The structural unit (a2') may use either one type of structural unit, or a mixture of two or more types.

The proportion of the structural unit (a2') within the component (A2), relative to the combined total of all the structural units that constitute the component (A2), is preferably within a range from 10 to 70 mol %, more preferably from 10 to 50 mol %, and still more preferably from 20 to 40 mol %. Making this proportion at least as large as the lower limit of the above-mentioned range ensures that the effects obtained by including the structural unit (a2') are achieved. On the other hand, by making the proportion no more than the upper limit of the above-mentioned range, a good balance can be achieved with the other structural units.

Structural Unit (a3')

In addition to the structural unit (a1'), or in addition to both the structural unit (a1') and the structural unit (a2'), the component (A2) preferably also includes a structural unit (a3') derived from an acrylic acid that has no cyclic structure and has an alcoholic hydroxyl group on a side chain.

When a component (A2) that includes the structural unit (a3') is blended into the negative resist composition, the alcoholic hydroxyl group of this structural unit (a3') reacts with the component (C), together with the hydroxyl group of the structural unit (a2'), under the action of the acid generated from the component (B).

Accordingly, the component (A2) changes more readily from a state that is soluble in the alkali developing solution to a state that is insoluble, which has the effect of improving the lithography properties such as the resolution. Further, thickness loss can also be suppressed, and the controllability of the cross-linking reaction that occurs during pattern formation improves. Moreover, the film density also tends to increase. As a result, the heat resistance tends to improve. Moreover, the etching resistance also improves.

In the structural unit (a3'), the expression "has no cyclic structure" means that the structural unit includes no aliphatic cyclic groups or aromatic groups.

The structural unit (a3') is readily distinguishable from the structural unit (a2') as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a1').

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a3'), the hydroxyalkyl group preferably exists at either one, or both of these locations.

In those cases where the hydroxyalkyl group is not bonded to the α-position, the hydrogen atom at the α-position carbon atom may be replaced with a lower alkyl group or a halogenated lower alkyl group.

Examples of this lower alkyl group or halogenated lower alkyl group include the same groups as those described above for R within general formula (1).

As the structural unit (a3'), a structural unit represented by general formula (f2-1-10) (hereafter, referred to as "structural unit (a3'-1)") described above in relation to the structural unit (f2) for the component (F) is preferable.

Specific examples of the structural unit (a3'-1) include structural units derived from α-(hydroxyalkyl)acrylic acids (not including structural units derived from acrylate esters), structural units derived from alkyl α-(hydroxyalkyl)acrylate esters, and structural units derived from hydroxyalkyl (α-alkyl)acrylate esters.

Of these, including a structural unit derived from an alkyl α-(hydroxyalkyl)acrylate ester as the structural unit (a3') is preferred in terms of improving the film density. Of the various possibilities, structural units derived from ethyl α-(hydroxymethyl)acrylate or methyl α-(hydroxymethyl)acrylate are particularly desirable.

Furthermore, including a structural unit derived from a hydroxyalkyl (α-alkyl)acrylate ester as the structural unit (a3') is preferred in terms of improving the cross-linking efficiency. Of such units, structural units derived from hydroxyethyl α-methyl-acrylate or hydroxymethyl α-methyl-acrylate are particularly desirable.

The structural unit (a3') may use either one type of structural unit, or a mixture of two or more types.

The proportion of the structural unit (a3') within the component (A2), relative to the combined total of all the structural units that constitute the component (A2), is preferably within a range from 5 to 50 mol %, more preferably from 5 to 40 mol %, still more preferably from 5 to 30 mol %, and most preferably from 10 to 25 mol %. Making this proportion at least as large as the lower limit of the above-mentioned range ensures that the effects obtained by including the structural unit (a3') are achieved. By making the proportion no more than the upper limit of the above-mentioned range, a good balance can be achieved with the other structural units.

Other Structural Units

Besides each of the structural units (a1') to (a3') described above, the component (A2) may also include other copolymerizable structural units.

As such structural units, any of the structural units used in known resin components of conventional chemically amplified resist compositions can be used. An example is a structural unit (a4') derived from an acrylate ester that includes a lactone-containing monocyclic or polycyclic group.

As the structural unit (a4'), any unit can be used without any particular limitations. Specifically, examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

The structural unit (a4') may use either one type of structural unit, or a mixture of two or more types.

If the structural unit (a4') is included in the component (A2), then the proportion of the structural unit (a4') within the component (A2), relative to the combined total of all the structural units that constitute the component (A2), is preferably within a range from 10 to 70 mol %, more preferably from 10 to 40 mol %, and most preferably from 10 to 25 mol %. Making this proportion at least as large as the lower limit of the above-mentioned range ensures that the effects obtained by including the structural unit (a4') are achieved. On the other hand, by making the proportion no more than the upper limit of the above-mentioned range, a good balance can be achieved with the other structural units.

However, in the present invention, the component (A2) is preferably a polymeric compound in which the structural units (a1') to (a3') represent the main components.

Here, the term "main components" means that the combined quantity of the structural units (a1') to (a3') represents at least 50 mol %, preferably at least 70 mol %, and more preferably 80 mol % or greater, of all the structural units. Component (A2) in which this proportion is 100 mol %, namely component (A2) composed solely of the structural unit (a1'), the structural unit (a2') and the structural unit (a3'), is the most desirable.

As the component (A2), resins that include a combination of structural units such as that represented by formula (A2-1) shown below are particularly desirable.

[Chemical Formula 43]

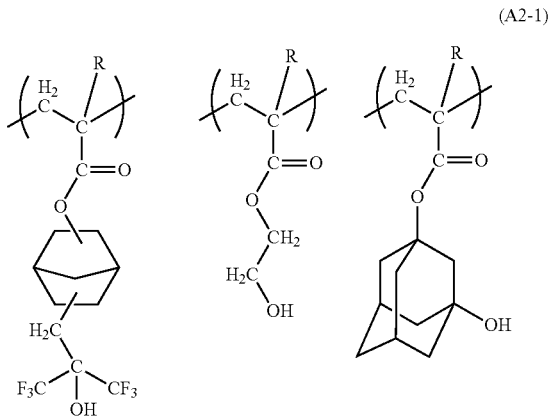

(A2-1)

In the formulas, R is the same as defined above, and the plurality of R may be the same or different from each other.

In the present invention, the weight average molecular weight (Mw) of the component (A2) is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the degree of dispersion (Mw/Mn) is preferably from 1.0 to 5.0, and more preferably from 1.0 to 2.5.

When the component (A2) is used in the component (A), one type of the component (A2) may be used alone, or a mixture of two or more types may be used.

In those cases where the component (A2) is used, the proportion of the component (A2) within the component (A) is preferably 40% by weight or more, more preferably 50% by weight or more, and most preferably 60% by weight or more.

The component (A1) and the component (A2) used in the present invention can be synthesized, for example, by the method disclosed in International Patent Publication 2004/076495 pamphlet, or a method in which the monomers that give rise to each of the structural units are subjected to a radical polymerization using conventional methods.

In the present invention, besides the component (F), the component (A1) and the component (A2), the component (A) may also use other polymeric compounds used within conventional negative resist compositions (such as hydroxystyrene resins, novolak resins or acrylic resins).

In the present invention, the quantity of the component (A) within the negative resist composition may be adjusted in accordance with the resist film thickness that is to be formed.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be used.

[Chemical Formula 44]

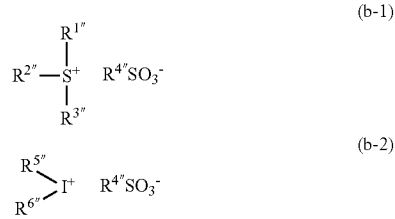

In the formulas above, $R^{1\prime\prime}$ to $R^{3\prime\prime}$, $R^{5\prime\prime}$ and $R^{6\prime\prime}$ each independently represent an aryl group or alkyl group, wherein two of $R^{1\prime\prime}$ to $R^{3\prime\prime}$ may be bonded to each other to form a ring with the sulfur atom; and $R^{4\prime\prime}$ represents an alkyl group, a halogenated alkyl group, an aryl group or an alkenyl group which may have a substituent, with the provision that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups. The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The alkoxy group, with which hydrogen atoms of the aryl group may be substituted, is preferably an alkoxy group having 1 to 5 carbon atoms, and is most preferably a methoxy group or an ethoxy group.

The halogen atom, with which hydrogen atoms of the aryl group may be substituted, is preferably a fluorine atom.

The alkyl group for $R^{1''}$ $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1''}$ to $R^{3''}$ independently represent a phenyl group or a naphthyl group.

When two of $R^{1''}$ to $R^{3''}$ in formula (b-1) are bonded to each other to form a ring with the sulfur atom, it is preferable that the two of $R^{1''}$ to $R^{3''}$ form a 3 to 10-membered ring including the sulfur atom, and it is particularly desirable that the two of $R^{1''}$ to $R^{3''}$, form a 5 to 7-membered ring including the sulfur atom.

When two of $R^{1''}$ to $R^{3''}$ in formula (b-1) are bonded to each other to form a ring with the sulfur atom, the remaining one of $R^{1''}$ to $R^{3''}$ is preferably an aryl group. As examples of the aryl group, the same as the above-mentioned aryl groups for $R^{1''}$ to $R^{3''}$ can be given.

$R^{4''}$ represents an alkyl group, a halogenated alkyl group, an aryl group or an alkenyl group which may have a substituent.

The alkyl group for $R^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4''}$ may have one substituent, or two or more substituents.

Examples of the substituent include a halogen atom, a hetero atom, an alkyl group, and a group represented by the formula $X^2$-$Q^2$- (in the formula, $Q^2$ represents a divalent linking group containing an oxygen atom; and $X^2$ represents a hydrocarbon group of 3 to 30 carbon atoms which may have a substituent).

Examples of the hetero atom as a substituent for $R^{4''}$ include an oxygen atom, a nitrogen atom, and a sulfur atom.

Examples of halogen atoms and alkyl groups as substituents for $R^{4''}$ include the same halogen atoms and alkyl groups as those described above with respect to the halogenated alkyl group for $R^{4''}$.

Examples of the alkyl group as a substituent for $R^{4''}$ include the same alkyl groups as those described above for $R^{4''}$.

Specific examples of linear alkyl groups include a methyl group, an ethyl group, a propyl group, a butyl group, a pentyl group, a hexyl group, a heptyl group, an octyl group, a nonyl group and a decanyl group.

Specific examples of branched alkyl groups include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The linear or branched alkyl group may have a substituent. Examples of substituents include an alkoxy group, a halogen atom, a halogenated alkyl group, a hydroxyl group and an oxygen atom (=O).

The cyclic alkyl group as a substituent for $R^{4''}$ may be either a monocyclic group or a polycyclic group. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

The cyclic alkyl group may have a substituent. For example, part of the carbon atoms constituting the ring within the cyclic alkyl group may be substituted with a hetero atom, or a hydrogen atom bonded to the ring within the cyclic alkyl group may be substituted with a substituent. In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(=O)—O—). In the latter example, as the substituent for the cyclic alkyl group, an alkyl group, an alkoxy group, a halogen atom, a halogenated alkyl group, a hydroxyl group, an oxygen atom (=O) or the like can be used.

In the group represented by formula $X^2$-$Q^2$-, $Q^2$ represents a divalent linking group containing an oxygen atom.

$Q^2$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{92}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2CH(CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2CH(CH_3$)$CH_2CH_2$—; and a pentamethylene group [—$CH_2CH_2CH_2CH_2CH_2$—].

As $Q^2$, a divalent linking group containing an ester bond or an ether bond is preferable, and —$R^{91}$—O—, —$R^{92}$—O—C(=O)— or —C(=O)—O—$R^{93}$—O—C(=O)— is more preferable.

In the group represented by the formula $X^2$-$Q^2$-, the hydrocarbon group for $X^2$ may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for $X^2$ may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $X^2$, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $X^2$, there is no particular limitation as long as it is an atom other than a carbon atom and a hydrogen atom.

Examples of halogen atoms include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 45]

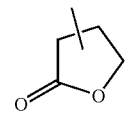

(L1)

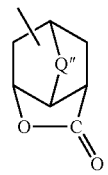

(L2)

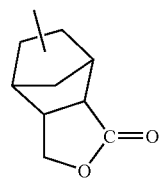

(L3)

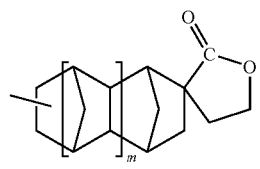

(L4)

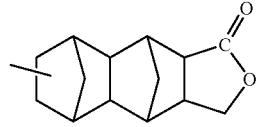

(L5)

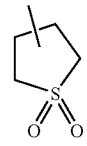

(S1)

(S2)

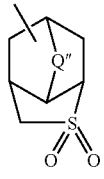

(S3)

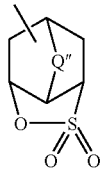

(S4)

In the formula, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

As the alkylene group for Q'', $R^{94}$ and $R^{95}$, the same alkylene groups as those described above for $R^{91}$ to $R^{93}$ can be used.

In these aliphatic cyclic groups, part of the hydrogen atoms boned to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

In the present invention, when $R^{4'''}$ has $X^2$-$Q^2$- as a substituent, $R^{4'''}$ is preferably a group represented by the formula $X^2$-$Q^2$-$Y^2$— (in the formula, $Q^2$ and $X^2$ are the same as defined above; and $Y^2$ represents an alkylene group of 1 to 4 carbon atoms which may have a substituent, or a fluorinated alkylene group of 1 to 4 carbon atoms which may have a substituent).

In the group represented by the formula $X^2$-$Q^2$-$Y^2$—, as the alkylene group for $Y^2$, the same alkylene group as those described above for $Q^2$ in which the number of carbon atoms is 1 to 4 can be used.

As the fluorinated alkylene group, the aforementioned alkylene group in which part or all of the hydrogen atoms has been substituted with fluorine atoms can be used, Specific examples of $Y^2$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —CH(CF_3)CH_2$—, —CH(CF_2CF_3)$—, —C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)$ $CH_2CH_2$—, —$CH_2CH(CH_3)CH_2$—, —$CH(CH_3)CH$ $(CH_3)$—, —$C(CH_3)_2CH_2$—, —$CH(CH_2CH_3)CH_2$—, —CH $(CH_2CH_2CH_3)$—, and —$C(CH_3)(CH_2CH_3)$—.

$Y^2$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)$ $CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5'''}$ and $R^{6'''}$ each independently represent an aryl group or alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be used.

As the alkyl group for $R^{5'''}$ and $R^{6'''}$, the same as the alkyl groups for $R^{1'''}$ to $R^{3'''}$ can be used.

It is particularly desirable that both of $R^{5'''}$ and $R^{6'''}$ represents a phenyl group.

As $R^{4'''}$ in formula (b-2), the same groups as those mentioned above for $R^{4'''}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Furthermore, it is also possible to use onium salts that have a camphorsulfonate ion as the anion moiety and generate a relatively weak acid.

A specific example of the anion moiety for such an onium salt includes a sulfonate ion ($-SO_3^-$) represented by the chemical formula shown below.

[Chemical Formula 46]

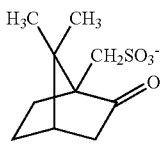

Furthermore, onium salts in which the anion moiety of these onium salts are replaced by an anion moiety represented by any one of formulas (b1) to (b7) shown below can be used.

[Chemical Formula 47]

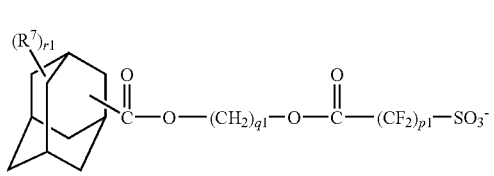
(b1)

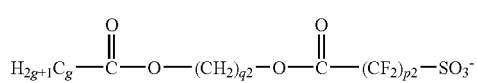
(b2)

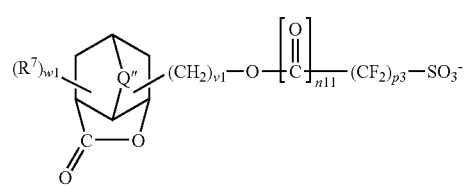
(b3)

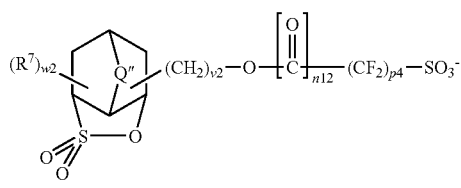
(b4)

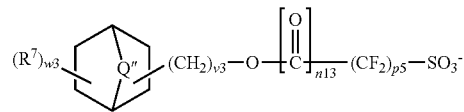
(b5)

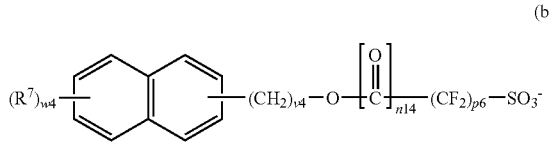
(b6)

-continued

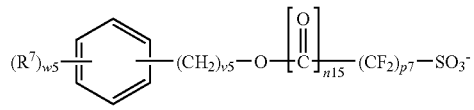
(b7)

In the formulas, each of p1 to p7 independently represents an integer of 1 to 3; each of q1 and q2 independently represents an integer of 1 to 5; r1 represents an integer of 0 to 3; g represents an integer of 1 to 20; $R^7$ represents a substituent; each of n11 to n15 independently represents 0 or 1; each of v1 to v5 independently represents an integer of 0 to 3; each of w1 to w5 independently represents an integer of 0 to 3; and Q" is the same as defined above.

As the substituent for $R^7$, the same groups as those which the aforementioned aliphatic hydrocarbon group or aromatic hydrocarbon group for $X^2$ may have as a substituent can be used.

If there are two or more of the $R^7$ group, as indicated by the values r1 and w1 to w5, then the two or more of the $R^7$ groups may be the same or different from each other.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 48]

(b-3)

(b-4)

In formulas (b-3) and (b-4) above, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 49]

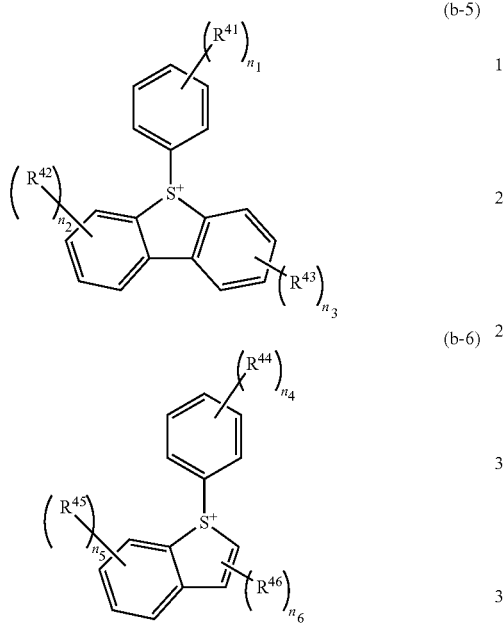

In formulas (b-5) and (b-6) above, each of $R^{41}$ to $R^{46}$ independently represents an alkyl group, an acetyl group, an alkoxy group, a carboxy group, a hydroxyl group or a hydroxyalkyl group; each of $n_1$ to n5 independently represents an integer of 0 to 3; and n6 represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

If there are two or more of an individual $R^{41}$ to $R^{46}$ group, as indicated by the corresponding value of $n_1$ to n6, then the two or more of the individual $R^{41}$ to $R^{46}$ group may be the same or different from each other.

$n_1$ is preferably 0 to 2, more preferably 0 or 1, and still more preferably 0.

It is preferable that n2 and n3 each independently represent 0 or 1, and more preferably 0.

$n_4$ is preferably 0 to 2, and more preferably 0 or 1.
$n_5$ is preferably 0 or 1, and more preferably 0.
$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{41}SO_3-$) for onium salt-based acid generators represented by general formula (b-1) or (b-2) shown above; and anion moieties represented by general formula (b-3) or (b-4) shown above. Among these, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly desirable. Specific examples thereof include a trifluoromethylsulfonate ion, a heptafluoro-n-propanesulfonate ion and a nonafluoro-n-butanesulfonate ion.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 50]

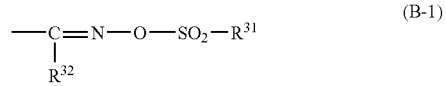

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group are substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 51]

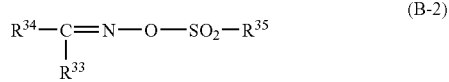

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 52]

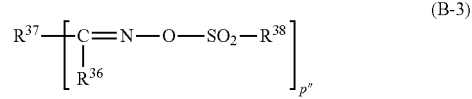

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyirmino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p- methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 53]

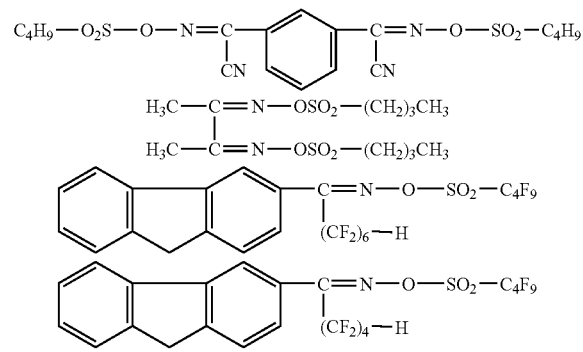

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

In the present invention, as the component (B), it is preferable to use an onium salt which has an alkylsulfonate ion having a substituent as the anion moiety. As the substituent for the alkylsulfonate ion, a halogen atom or an alkyl group which may have a substituent is preferable, more preferably a fluorine atom or a cyclic alkyl group which may have a substituent, still more preferably a fluorine atom or a cyclic alkyl group which has a hydrogen atom boned to the ring substituted with an oxygen atom (=O), and most preferably a fluorine atom or a group in which one or more hydrogen atoms have been removed from a polycycloalkane and has a hydrogen atom boned to the ring substituted with an oxygen atom (=O).

As the component (B), one type of acid generator may be used, or two or more types of acid generators may be used in combination.

In the negative resist composition of the present invention, the amount of the component (B) relative to 100 parts by weight of the component (A) is preferably 0.5 to 30 parts by weight, and more preferably 1 to 10 parts by weight. By ensuring that the amount of the component (B) is within the above-mentioned range, formation of a resist pattern can be satisfactorily performed. Further, by virtue of the above-mentioned range, a uniform solution can be obtained and the storage stability becomes satisfactory.

<Component (C)>

There are no particular limitations on the component (C), which may be selected appropriately from the various cross-linkers used within conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups; and compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the component (C), at least one type of cross-linker selected from the group consisting of melamine-based cross-linkers, urea-based cross-linkers, alkylene urea-based cross-linkers, glycoluril-based cross-linkers and epoxy-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical Formula 54]

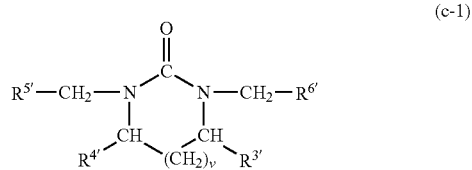

(c-1)

In general formula (C-1), $R^{5'}$ and $R^{6'}$ each independently represent a hydroxyl group or a lower alkoxy group; $R^{3'}$ and $R^{4'}$ each independently represents a hydrogen atom, a hydroxyl group or a lower alkoxy group, and v represents 0 or an integer of 1 to 2.

The lower alkoxy group for $R^{5'}$ and $R^{6'}$ may be either a linear or branched group, and is preferably an alkoxy group of 1 to 4 carbon atoms. $R^{5'}$ and $R^{6'}$ may be the same or different, and are preferably the same.

The lower alkoxy group for $R^{3'}$ and $R^{4'}$ may be either a linear or branched group, and is preferably an alkoxy group of 1 to 4 carbon atoms. $R^{3'}$ and $R^{4'}$ may be the same or different, and are preferably the same.

v is either 0 or an integer from 0 to 2, and is preferably 0 or 1.

As the alkylene urea-based cross-linker, compounds in which v is 0 (ethylene urea-based cross-linkers) and/or compounds in which v is 1 (propylene urea-based cross-linkers) are preferred.

Compounds represented by general formula (C-1) can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group may be used. Of such cross-linkers, those having two or more epoxy groups are preferred. Including two or more epoxy groups improves the cross-linking reaction.

The number of epoxy groups is preferably at least two, more preferably from 2 to 4, and is most preferably 2.

Preferred examples of the epoxy-based cross-linkers are shown below.

[Chemical Formula 55]

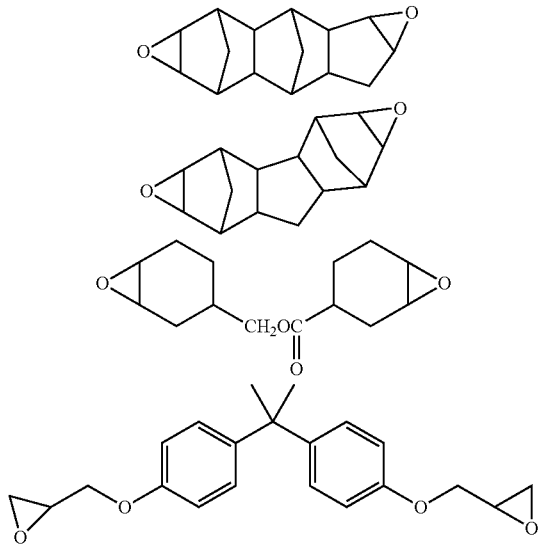

As the component (C), one type of cross-linker may be used alone, or two or more types may be used in combination.

The amount of the component (C) relative to 100 parts by weight of the component (A) is preferably within a range from 1 to 50 parts by weight, more preferably from 3 to 30 parts by weight, still more preferably from 3 to 15 parts by weight, and most preferably from 5 to 10 parts by weight. By ensuring that the quantity of the component (C) is at least as large as the lower limit of the above-mentioned range, the formation of cross-linking is able to proceed favorably, and a favorable resist pattern with minimal swelling is obtained. On the other hand, by ensuring that the quantity is not more than the upper limit of the above-mentioned range, the storage stability of the resist coating liquid improves, and deterioration over time in the sensitivity can be suppressed.

<Optional components>
[Component (D)]

In the negative resist composition of the present invention, for improving the resist pattern shape and the post exposure stability of the latent image formed by the pattern-wise exposure of the resist layer, it is preferable that a nitrogen-containing organic compound (D) (hereafter referred to as the component (D)) is further included as an optional component.

A multitude of these components (D) have already been proposed, and any of these known compounds may be used, although a cyclic amine, an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (namely, alkylamines or alkyl alcohol amines). Specific examples include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, alkyl alcohol amines and trialkylamines are preferable, and alkyl alcohol amines are the most desirable. Of these alkyl alcohol amines, triethanolamine and triisopropanolamine are the most preferred.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

In the present invention, of the various possibilities, an alkyl alcohol amine is preferably used as the component (D).

The component (D) is typically used in an amount within a range from 0.01 to 5.0 parts by weight, relative to 100 parts by weight of the component (A).

[Component (E)]

Furthermore, in the negative resist composition according to the present invention, for preventing any deterioration in sensitivity, and improving the resist pattern shape and the post exposure stability of the latent image formed by the patternwise exposure of the resist layer, at least one compound (E) (hereafter referred to as "component (E)") selected from the group consisting of organic carboxylic acids and phosphorus oxo acids and derivatives thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferred, and salicylic acid is particularly desirable.

The component (E) is typically used in an amount within a range from 0.01 to 5.0 parts by weight, relative to 100 parts by weight of the component (A).

If desired, other miscible additives can also be added to the negative resist composition according to the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The negative resist composition according to the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate, and dipropylene glycol monoacetate, and compounds having an ether bond, such as a monoalkyl ether (such as a monomethyl ether, monoethyl ether, monopropyl ether or monobutyl ether) or a monophenyl ether of any of these polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene; and primary alcohols such as n-pentyl alcohol, s-pentyl alcohol, t-pentyl alcohol, isopentyl alcohol, isobutanol (also known as isobutyl alcohol or 2-methyl-1-propanol), isopropyl alcohol, 2-ethylbutanol, neopentyl alcohol, n-butanol, s-butanol, t-butanol, 1-propanol, n-hexanol, 2-heptanol, 3-heptanol, 2-methyl-1-butanol, 2-methyl-2-butanol and 4-methyl-2-pentanol.

These solvents can be used individually, or in combination as a mixed solvent.

Among these, as the component (S), PGMEA, PGME and EL are preferred.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range of 2 to 20% by weight, and preferably 5 to 15% by weight.

The negative resist composition of the present invention is advantageous in that a resist pattern having an excellent shape can be formed. The reason for this has not been elucidated yet, but is presumed as follows.

The negative resist composition of the present invention contains a polymeric compound (F) including a structural unit (f1) containing a base dissociable group and a structural unit (f2) containing a cross-linking group-containing group.

The base dissociable group contained in the structural unit (f1) can be dissociated by the action of a base. Therefore, during development, the negative resist composition exhibits improved affinity for an alkali developing solution, and hence, a resist film in which particularly unexposed portions exhibit excellent solubility in an alkali developing solution can be formed.

The cross-linking group-containing group within the structural unit (f2) is capable of cross linking with a cross linking agent or the like by the action of acid. Therefore, in the negative resist composition, cross linking occurs between the component (F) and a cross-linking agent or the like during exposure and the negative resist composition becomes hardly soluble in an alkali developing solution. As a result, thickness loss at exposed portions can be suppressed, and a resist film exhibiting improved development contrast can be formed.

Thus, as described above, by virtue of containing a polymeric compound (F) including a structural unit (f1) and a structural unit (f2), it is presumed that a resist pattern having an excellent shape can be obtained from the negative resist composition of the present invention.

Further, when the negative resist composition of the present invention contains a polymeric compound (F) including a structural unit (f1) containing a fluorine atom and a structural unit (f2), the negative resist composition is particularly suitable for immersion exposure.

Hereinbelow, the case where the negative resist composition of the present invention contains a polymeric compound (F) including a structural unit (f1) containing a fluorine atom will be explained.

As described above, a negative resist composition requires satisfactory solubility in an alkali developing solution. On the other hand, in a resist composition for immersion exposure, a satisfactory hydrophobicity is required for improving water tracking ability. Therefore, a negative resist composition for immersion exposure requires satisfying two conflicting characteristics, hydrophobicity and solubility in an alkali developing solution.

When the negative resist composition of the present invention contains a polymeric compound (F) including a structural unit (f1) containing a fluorine atom and a structural unit (f2), the negative resist composition exhibits both of excellent solubility in an alkali developing solution and excellent hydrophobicity, and hence, the negative resist composition can be preferably used for immersion exposure.

In the present invention, a component (F) including a structural unit (f1) containing a fluorine atom exhibits high hydrophobicity, and the hydrophilicity thereof is enhanced under basic conditions. The reason why the hydrophilicity is enhanced is that the base dissociable group is dissociated by the action of a base (alkali developing solution), and a hydrophilic group is generated.

Therefore, a resist film formed using the negative resist composition of the present invention in which such a component (F) is blended with the component (B) and the component (C) exhibits high hydrophobicity prior to coming in contact with an alkali developing solution (e.g., during immersion exposure), and the hydrophilicity thereof is enhanced by coming in contact with an alkali developing solution, thereby exhibiting high solubility in the alkali developing solution. Especially when the base dissociable group is a fluorine-containing organic group, the base dissociable group containing a fluorine atom (i.e., portion exhibiting high hydrophobicity) is dissociated by the action of an alkali developing solution, and hence, a resist film which exhibits a satisfactory solubility in an alkali developing solution can be formed.

As described above, a resist film formed using the negative resist composition of the present invention exhibits high hydrophobicity during immersion exposure. Therefore the unexposed portions exhibit excellent solubility during alkali developing, and also, the resist film exhibits an excellent water tracking ability (tracking ability of water with respect to the movement of the lens) which is required when immersion exposure is conducted using a scanning-type immersion exposure apparatus as disclosed in Non-Patent Document 1.

Further, in the negative resist composition of the present invention, particularly by virtue of containing the component (F) including both of the structural unit (f1) and the structural unit (f2), the solubility of the unexposed portions in an alkali developing solution can be effectively improved, and thickness loss can be suppressed at exposed portions. As a result, an excellent development contrast can be achieved, and a resist pattern having an excellent shape and high rectangularity can be formed.

Further, as hydrophilicity is enhanced during alkali developing, the negative resist composition of the present invention is capable of effectively reducing defects caused by immersion exposure, as compared to a conventional negative resist composition having a fluorine-containing compound added thereto. More specifically, in liquid immersion lithography, when immersion exposure of a resist film is conducted, the solubility of the exposed portions in an alkali developing solution changes. For example, in the case of a negative resist composition, the solubility of the exposed portions in an alkali developing is decreased. By conducting alkali developing, the unexposed portions are removed, and as a result, a resist pattern is formed.

On the surface of the resist film at portions which were irradiated with radial rays by immersion exposure, defects (water mark defects, and the like) caused by the influence of the immersion medium such as water are likely to be generated following alkali developing. However, since the hydrophilicity of a resist film formed using the negative resist composition of the present invention is enhanced during alkali developing, generation of such defects can be reduced.

Further, by using the negative resist composition of the present invention, elution of a substance from the resist film during immersion exposure can be suppressed.

As described above, immersion exposure is a method in which exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air. In immersion exposure, when the resist film comes into contact with the immersion medium, elution of substances within the resist film (component (B), component (D), and the like) into the immersion medium occurs. This elution of a substance causes phenomenon such as degeneration of the resist film and change in the refractive index of the immersion medium, thereby adversely affecting the lithography properties.

The amount of the eluted substance is affected by the properties of the resist film surface (e.g., hydrophilicity, hydrophobicity, and the like). Therefore, it is presumed that the amount of eluted substance can be reduced by enhancing the hydrophobicity of the resist film surface.

When the negative resist composition of the present invention contains a component (F) including a structural unit (f1) containing a fluorine atom, the negative resist composition exhibits high hydrophobicity prior to conducting exposure and developing, as compared to a resist composition which does not contain such a component (F). Therefore, it is presumed that the negative resist composition of the present invention can suppress elution of a substance during immersion exposure.

Since elution of a substance can be suppressed, by using the negative resist composition of the present invention, phenomenon such as degeneration of the resist film and change in the refractive index of the immersion medium, which occur during immersion exposure, can be suppressed. Further, as variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

In addition, a resist film formed using the negative resist composition of the present invention hardly swells due to being exposed to water. Therefore, a very fine resist pattern can be formed with a high precision.

Also, the negative resist composition of the present invention exhibits excellent lithography properties with respect to sensitivity, resolution, etching resistance and the like, and is capable of forming a resist pattern without any practical problems when used as a resist for immersion exposure. For example, by using the negative resist composition of the present invention, a very fine resist pattern with a size of 120 nm or smaller can be formed.

The hydrophobicity of a resist film can be evaluated by measuring the contact angle thereof against water, for example, the static contact angle (the contact angle between the surface of a water droplet on the resist film in a horizontal state and the resist film surface), the dynamic contact angle (the contact angle at which a water droplet starts to slide when the resist film is inclined (sliding angle), the contact angle at the front-end point of the water droplet in the sliding direction (advancing angle) and the contact angle at the rear-end point of the water droplet in the sliding direction (receding angle)). For example, the higher the hydrophobicity of a resist film, the higher the static angle, advancing angle, and receding angle and the smaller the sliding angle.

As shown in FIG. 1, when a droplet 1 is placed on a plane 2 and the plane 2 is gradually inclined, the advancing angle is the angle $\theta_1$ formed between the lower end 1a of the droplet 1 and the plane 2 as the droplet 1 starts to move (slide) on the plane 2. Further, at this time (when the droplet 1 starts to move (slide) on the plane 2), the receding angle is the angle $\theta_2$ formed between the upper end 1b of the droplet 1 and the plane 2, and the sliding angle is the inclination angle $\theta_3$ of the plane 2.

In the present description, the advancing angle, receding angle and sliding angle are measured in the following manner.

First, a resist composition solution is spin-coated onto a silicon substrate, and then heated at a temperature of 80° C. for 60 seconds to form a resist film.

Subsequently, the contact angles can be measured using commercially available measurement apparatuses such as DROP MASTER-700 (product name; manufactured by Kyowa Interface Science Co. Ltd.), AUTO SLIDING ANGLE: SA-30 DM (product name; manufactured by Kyowa Interface Science Co. Ltd.), and AUTO DISPENSER: AD-31 (product name; manufactured by Kyowa Interface Science Co. Ltd.).

With respect to a resist film formed using the negative resist composition of the present invention, it is preferable that the receding angle as measured prior to conducting immersion exposure and developing be 50 degrees or more, more preferably 50 to 150 degrees, still more preferably 50 to 130 degrees, and most preferably 53 to 100 degrees. When the receding angle is at least as large as the lower limit of the above-mentioned range, the effect of suppressing the elution of a substance during immersion exposure is enhanced. The reason for this has not been elucidated yet, but it is presumed that one of the main reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure.

On the other hand, when the receding angle is no more than the upper limit of the above-mentioned range, the lithography properties become satisfactory.

For the same reasons as described above, with respect to a resist film formed using the negative resist composition of the present invention, it is preferable that the static contact angle as measured prior to conducting immersion exposure and developing be 70 degrees or more, more preferably 70 to 100 degrees, and most preferably 75 to 100 degrees.

Further, with respect to a resist film formed using the negative resist composition of the present invention, it is preferable that the sliding angle as measured prior to conducting immersion exposure and developing be 32 degrees or lower, and more preferably 5 to 30 degrees. When the sliding angle is no more than the upper limit of the above-mentioned range, the effect of suppressing the elution of a substance during immersion exposure is enhanced. On the other hand, when the sliding angle is at least as large as the lower limit of the above-mentioned range, the lithography properties become satisfactory.

The level of the above-mentioned various angles (dynamic contact angle (advancing angle, receding angle and sliding angle) and static contact angle) can be adjusted by the formulation of the negative resist composition, for example, the type and amount of the component (F), and the type of the component (A). For example, by increasing the amount of the component (F), the hydrophobicity of the obtained resist composition can be enhanced, and the advancing angle, receding angle and static contact angle becomes large, whereas the sliding angle becomes small.

As described above, the negative resist composition of the present invention containing a component (F) including a structural unit (f1) containing a fluorine atom exhibits various properties required for a resist material for use in immersion exposure. Therefore, the negative resist composition of the present invention can be preferably used for immersion exposure.

<<Method of Forming a Resist Pattern>>

The method of forming a resist pattern according to a second aspect of the present invention includes applying a negative resist composition according to the first aspect on a substrate to form a resist film, subjecting the resist film to exposure, and subjecting the resist film to alkali developing to form a resist pattern.

More specifically, the method for forming a resist pattern according to the present invention can be performed, for example, as follows.

Firstly, a resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, alkali developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the alkali developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air.

More specifically, in immersion lithography, the region between the resist film formed in the above-described manner and lens at the lowermost portion of the exposure apparatus is filled with a solvent (a immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

<<Polymeric Compound>>

The polymeric compound according to a third aspect of the present invention includes a structural unit (f1) containing a base dissociable group and a structural unit (f2) containing a cross-linking group-containing group, an is the same as the component (F) explained above in relation to the negative resist composition according to the third aspect of the present invention.

In the polymeric compound of the present invention, the base dissociable group preferably contains a fluorine atom.

As a preferable example of the structural unit (f1), a structural unit represented by general formula (f1-1) or (f1-2) shown below can be given.

[Chemical Formula 56]

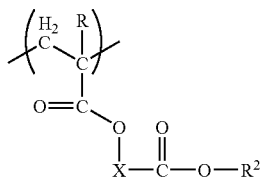

(f1-1)

-continued

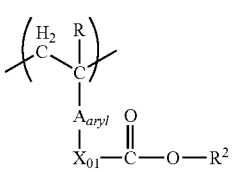

(f1-2)

In the formulas above, each R independently represents a hydrogen atom, a lower alkyl group of 1 to 5 carbon atoms or a halogenated lower alkyl group of 1 to 5 carbon atoms; X represents a divalent organic group; $A_{aryl}$ represents an aromatic cyclic group which may have a substituent; $X_{01}$ represents a single bond or a divalent linking group; and each $R^2$ independently represents an organic group having a fluorine atom.

In the formulas, X, $A_{aryl}$, $X_{01}$, R and $R^2$ are respectively the same as defined for X, $A_{aryl}$, $X_{01}$, R and $R^2$ described above in relation to the component (F).

Preferable examples of the structural unit (f2) include at least one structural unit selected from the group consisting of structural units containing a group represented by general formulas (f2-1), (f2-2) and (f2-3) shown below.

[Chemical Formula 57]

(f2-1)

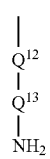

(f2-2)

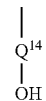

(f2-3)

In the formulas, $Q^{11}$ represents an alkylene group which may have an ether bond; $Q^{12}$ represents a divalent linking group; $Q^{13}$ represents —$SO_2$— or —C(=O)—; and $Q^{14}$ represents an aromatic cyclic group.

In the formulas, $Q^{11}$ to $Q^{14}$ are respectively the same as defined for $Q^{11}$ to $Q^{14}$ described above in relation to the component (F).

(Production Method of the Polymeric Compound)

The polymeric compound of the present invention can be produced, for example, by a conventional radical polymerization or the like of the monomers corresponding with each of the structural units, using a radical polymerization initiator such as azobisisobutyronitrile (AIBN) or dimethyl 2,2'-azobis(isobutyrate) (V-601).

Examples of monomers for deriving the structural unit (f1) include the aforementioned fluorine-containing compounds (F0) represented by general formula (f0-1) or (f0-2).

A fluorine-containing compound (F0) can be produced, for example, by introducing a base dissociable group -$R^2$ ($R^2$ is as defined above) having a fluorine atom into the carboxy group of a monomer represented by general formula (f0-1-0) or (f0-2-0) shown below (hereafter, referred to as "monomer (V-1)") (i.e., substituting the hydrogen atom within —OH of the carboxy group with the $R^2$ group).

The -$R^2$ group can be introduced by a conventional method. For example, a monomer (V-1) can be reacted with a compound (V-2) represented by general formula (V-2) shown below, to thereby obtain a fluorine-containing compound (F0).

[Chemical Formula 58]

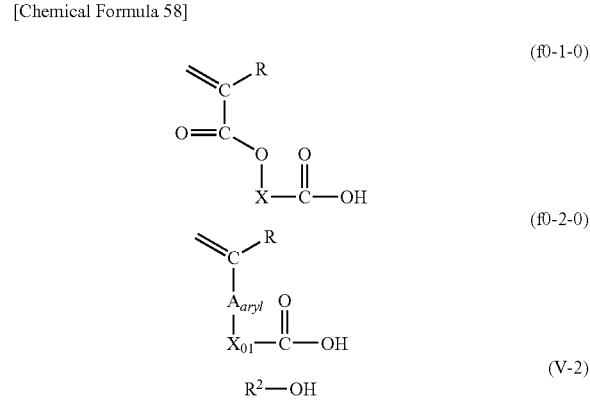

In the formulas, R, X, $A_{aryl}$ $X_{01}$ and $R^2$ are the same as defined above.

The method of reacting a monomer (V-1) with a compound (V-2) is not particularly limited. For example, a method in which a monomer (V-1) comes in contact with a compound (V-2) in a reaction solvent in the presence of a base can be used.

As a monomer (V-1) and a compound (V-2), commercially available compounds can be used. Alternatively, a monomer (V-1) and a compound (V-2) can be synthesized.

As a monomer (V-1), for example, a low molecular weight compound derived from an acrylate ester such as a carboxyalkyl (meth)acrylate or a mono((meth)acryloyloxyalkyl) succinate, or a polymeric compound including a structural unit derived from an acrylate ester can be used.

As a compound (V-2), for example, a fluorinated alkylalcohol or the like can be used.

As the reaction solvent, any reaction solvent capable of dissolving the monomer (V-1) and the compound (V-2) as raw materials can be used, and specific examples include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine; and inorganic bases such as sodium hydride, $K_2CO_3$ and $Cs_2CO_3$.

Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

The amount of the compound (V-2) added relative to the monomer (V-1) is preferably 1 to 3 equivalents, and more preferably 1 to 2 equivalents.

The reaction temperature is preferably −20 to 40° C., more preferably 0 to 30° C.

The reaction time varies, depending on the reactivity of the monomer (V-1) and the compound (V-2), the reaction temperature, and the like. However, in general, the reaction time is preferably 30 to 480 minutes, more preferably 60 to 360 minutes.

Alternatively, the component (F) can be produced by introducing a group represented by general formulas (II-1) to (II-3) as —R² (R² is the same as defined above) into a hydrophilic group of a copolymer having a carboxy group (e.g., a hydroxystyrene resin such as a polyhydroxystyrene, an acrylic resin, or the like).

The polymeric compound according to the third aspect of the present invention is a novel compound that is essentially unknown in the art.

The polymeric compound is useful as an additive or a base resin for a resist composition, and a resist composition containing a polymeric compound including a structural unit (f1) containing a fluorine atom is suitable immersion exposure.

As a resist composition containing a polymeric compound including a structural unit (f1) containing a fluorine atom, a resist composition for immersion exposure is particularly desirable. Such a resist composition is not particularly limited, although it is preferable to use a chemically amplified resist composition containing a base component that exhibits changed solubility in an alkali developing solution under action of acid, and an acid-generator component that generates acid upon exposure.

The polymeric compound is useful as an additive or a base resin for the negative resist composition according to the first aspect of the present invention.

EXAMPLES

As follows is a description of examples of the present invention, although the scope of the present invention is by no way limited by these examples.

In the following examples, a weight average molecular weight (hereafter, abbreviated as "molecular weight") is determined by the polystyrene equivalent value as measured by gel permeation chromatography (GPC). Further, the composition of a polymer is the amount (molar ratio) of the respective structural units within the structural formula.

Synthesis Example 1

Synthesis of Compound (1)

45 g (333 mmol) of potassium carbonate and 45 g (296 mmol) of methyl bromoacetate were added to 450 ml of an acetone solution containing 46 g (269 mmol) of 2-vinylnaphthol in a nitrogen atmosphere at 0° C., and then the temperature was elevated to room temperature, followed by stirring for 3 hours. After conducting thin-layer chromatography to confirm that the raw materials had been consumed, the reaction mixture was subjected to filtration, and the obtained filtrate was subjected to distillation under reduced pressure to remove the solvent. Then, water was added to the resultant, and extraction was conducted with ethyl acetate three times. The resulting organic phase was washed with water twice, and then subjected to distillation under reduced pressure to remove the solvent. The resulting crude product was purified by recrystallization (using an n-heptane/ethyl acetate mixture), thereby obtaining 54 g of a compound (1)-1 in the form of a colorless solid (yield: 83%).

Subsequently, 450 ml of a THF solution containing 54 g (222 mmol) of the compound (1)-1 was prepared, and 200 ml of a 25% by weight aqueous solution of TMAH was added thereto, followed by stirring at room temperature for 3 hours. After conducting thin-layer chromatography to confirm that the raw materials had been consumed, THF was distilled off under reduced pressure. Then, the resulting aqueous reaction solution was cooled to 0° C., and 55 ml of a 10N hydrochloric acid was added thereto to render the aqueous reaction solution acidic, followed by extraction with ethyl acetate three times. The resulting organic phase was washed with water twice, and the solvent was distilled off under reduced pressure, thereby obtaining 50 g of a compound (1)-2 in the form of a colorless solid (yield: 98%).

Subsequently, 50 g (222 mmol) of the compound (1)-2 was added to 400 ml of a THF solution containing 33 g (222 mmol) of 2,2,3,3,3-pentafluoro-1-propanol, 51 g (266 mmol) of ethyldiisopropylaminocarbodiimide hydrochloride (EDCI) and 1 g (11 mmol) of dimethylaminopyridine (DMAP) in a nitrogen atmosphere at 0° C., and the temperature was elevated to room temperature, followed by stirring for 3 hours. After conducting thin-layer chromatography to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by recrystallization (using an n-heptane/ethyl acetate mixture), thereby obtaining 59 g of a compound (1) in the form of a colorless solid (yield: 74%).

[Chemical Formula 59]

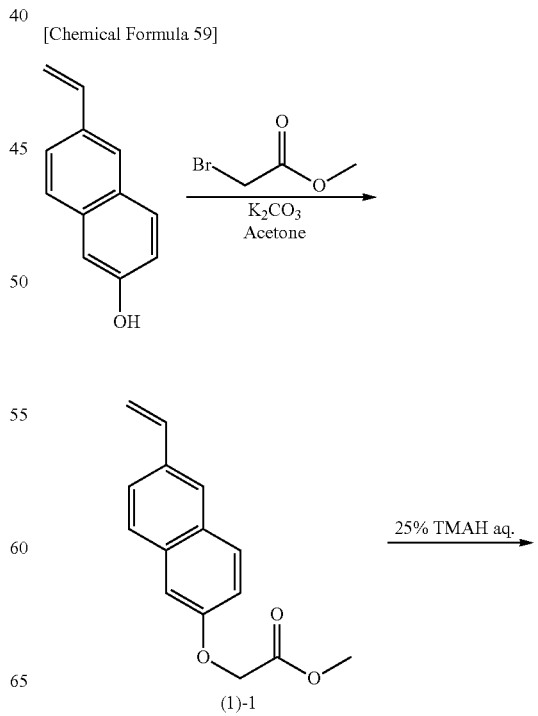

-continued

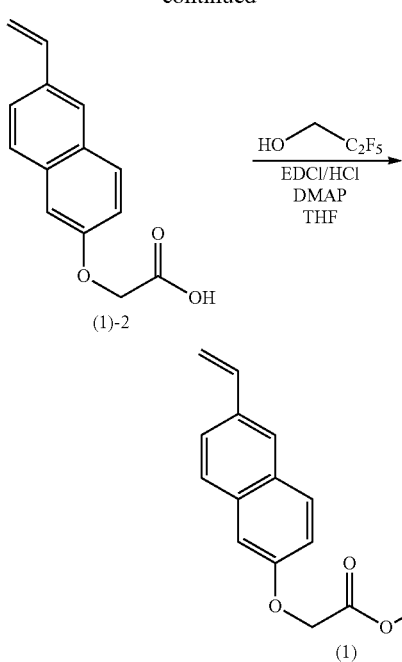

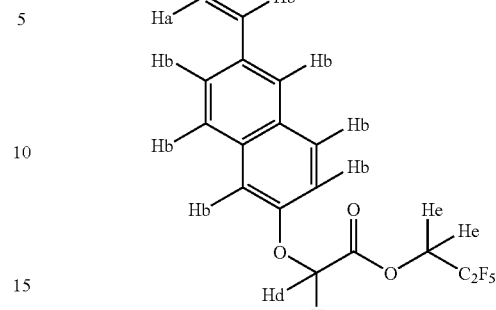

The obtained compounds (1)-1, (1)-2 and (1) were analyzed by $^1$H-NMR.

The results are shown below.

[Chemical Formula 60]

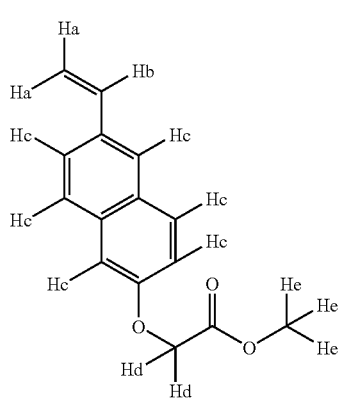

(1)-1

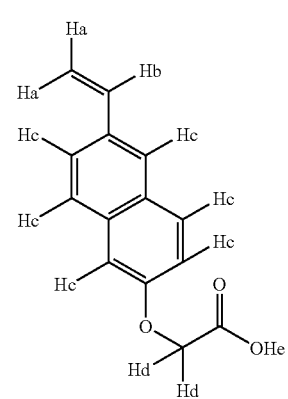

(1)-2

-continued

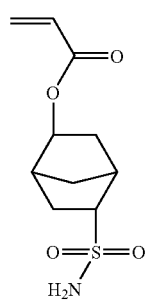

(1)

Spectrum data of compound (1)-1
$^1$H-NMR (CDCl$_3$) 7.75-7.60 (m, 4H, Hc), 7.25-7.10 (m, 2H, Hc), 6.85 (dd, 1H, Hb), 5.80 (d, 1H, Ha), 5.30 (d, 1H, Ha), 4.75 (s, 2H, Hd), 3.83 (s, 3H, He)

Spectrum data of compound (1)-2
$^1$H-NMR (DMSO-d6) 13.15 (br, 1H, He), 7.95-7.75 (m, 4H, Hc), 7.30-7.20 (m, 2H, Hc), 6.85 (dd, 1H, Hb), 5.90 (d, 1H, Ha), 5.25 (d, 1H, Ha), 4.75 (s, 2H, Hd)

Spectrum data of compound (1)
$^1$H-NMR (DMSO-d6) 7.86-7.69 (m, 4H, Hc), 7.32 (d, 1H, Hc), 7.23 (dd, 1H, Hc), 6.86 (dd, 1H, Hb), 5.92 (d, 1H, Ha), 5.33 (d, 1H, Ha), 5.10 (s, 2H, Hd), 5.97 (t, 2H, He)

Synthesis Example 2

Synthesis of Compound (3)

[Chemical Formula 61]

Acrylation of norbornene-2-sulfoneamide:

0.0541 g of hydroquinone, 36.2 g (0.5 mol) of acrylic acid and 0.19 g (0.0013 mol) of trifluoromethanesulfonic acid were added to a 200 ml four-necked glass flask equipped with a stirrer, a thermometer and a reflux condenser, and the temperature was elevated to 80° C. while stirring. Then, 17.32 g (0.1 mol) of norbornene-2-sulfoneamide was added thereto over 3 hours. Thereafter, a reaction was effected for 4 hours while maintaining the internal temperature at 80 to 85° C. After the completion of the reaction, the resultant was cooled to room temperature. Then, 30 g of distilled water and 100 g of ethyl acetate were added in this order while stirring, and 24.3 g (0.36 mol) of a 25% by weight aqueous ammonia was added to neutralize the resultant to a pH of 7.2. Then, the resultant was transferred to a separating funnel, and the aqueous phase was removed, followed by washing the organic phase with 30 g of distilled water twice. The organic phase having the aqueous phase removed was concentrated, and purification was conducted by silica gel chromatography, thereby obtaining 19.6 g (0.08 mol) of a compound (3) represented by chemical formula (3) above (yield: 80%).

The obtained compound (3) was analyzed by $^1$H-NMR. The results are shown below.

$^1$H-NMR (300 MHz, CDCl$_3$, TMS)

δ: 6.38 (1H, m), 6.06 (1H, m), 5.79 (1H, m), 5.52 (0.5×1H, s), 5.41 (0.3×1H, m), 5.35 (0.5×1H, s), 5.28 (1H, s), 4.78 (0.3×1H, m), 4.70 (0.4×1H, m), 3.54 (0.3×1H, m), 3.44 (0.3×1H, m), 3.02 (0.4×1H, m), 2.77 (1H, m), 2.48 (1H, m), 1.99-1.84 (2H, m), 1.80-1.49 (3H, m), 1.37 (1H, m)<

<Synthesis of Polymeric Compound>

Example 1

Synthesis of Fluorine-Containing Polymeric Compound (F1)

5.00 g (13.88 mmol) of the compound (1), 0.90 g (6.94 mmol) of a compound (2) and 0.50 g (6.94 mmol) of a compound (5) were added to a three-necked flask equipped with a thermometer and a reflux tube, and 36.28 g of tetrahydrofuran was added thereto and dissolved.

Then, 0.32 g of dimethyl 2,2'-azobis(isobutyrate) (product name: V-601) as a polymerization initiator was added and dissolved in the resulting solution. The solution was stirred while heating at 80° C. for 6 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 3.77 g of a fluorine-containing polymeric compound (F1) as an objective compound.

With respect to the fluorine-containing polymeric compound (F1), the weight average molecular weight and the dispersity were determined by the polystyrene equivalent value as measured by gel permeation chromatography (GPC). As a result, it was found that the weight average molecular weight was 13,000, and the dispersity was 1.57. Further, the fluorine-containing polymeric compound (F1) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=59/27/14.

[Chemical Formula 62]

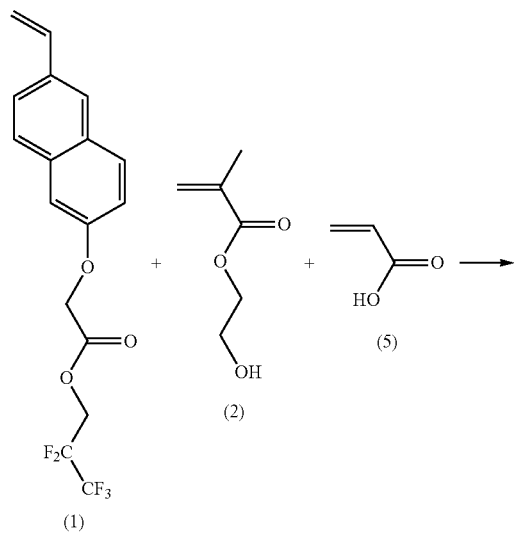

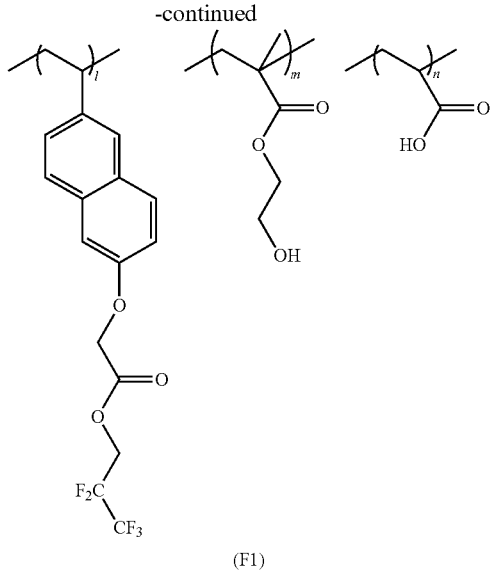

(F1)

Example 2

Synthesis of Fluorine-Containing Polymeric Compound (F2)

2.32 g (6.45 mmol) of the compound (1) and 0.68 g (2.76 mmol) of a compound (3) were added to a three-necked flask equipped with a thermometer and a reflux tube, and 17.00 g of tetrahydrofuran was added thereto and dissolved. Then, 0.11 g of dimethyl 2,2'-azobis(isobutyrate) (product name: V-601) as a polymerization initiator was added and dissolved in the resulting solution. The solution was stirred while heating at 80° C. for 6 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 1.30 g of a fluorine-containing polymeric compound (F2) as an objective compound.

With respect to the fluorine-containing polymeric compound (F2), the weight average molecular weight and the dispersity were determined by the polystyrene equivalent value as measured by gel permeation chromatography (GPC). As a result, it was found that the weight average molecular weight was 16,400, and the dispersity was 2.06. Further, the fluorine-containing polymeric compound (F2) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=71/29.

[Chemical Formula 63]

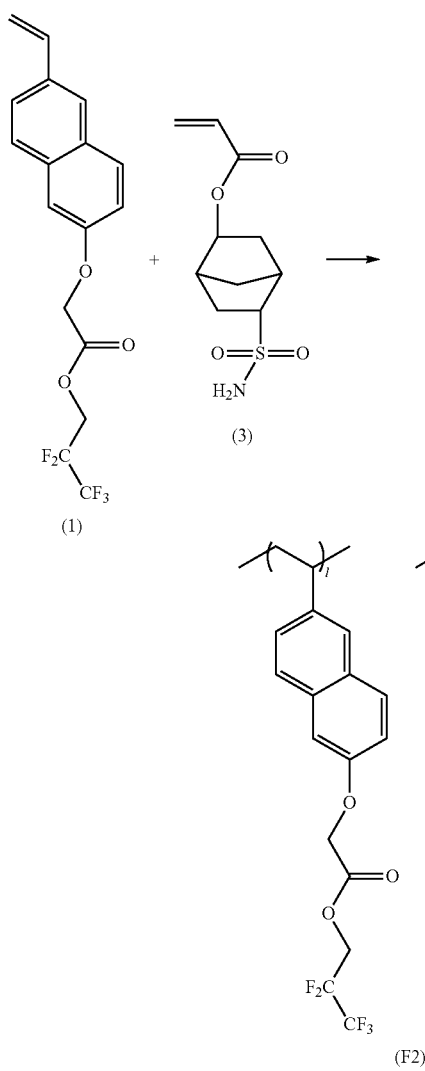

Example 3

Synthesis of Fluorine-Containing Polymeric Compound (F3)

3.54 g (9.83 mmol) of a compound (1), 0.18 g (1.36 mmol) of a compound (2) and 0.28 g (3.93 mmol) of a compound (5) were added to a three-necked flask equipped with a thermometer and a reflux tube, and 22.67 g of tetrahydrofuran was added thereto and dissolved. Then, 0.17 g of dimethyl 2,2'-azobis(isobutyrate) (product name: V-601) as a polymerization initiator was added and dissolved in the resulting solution. The solution was stirred while heating at 80° C. for 6 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 2.1 g of a fluorine-containing polymeric compound (F3) as an objective compound.

With respect to the fluorine-containing polymeric compound (F3), the weight average molecular weight and the dispersity were determined by the polystyrene equivalent value as measured by gel permeation chromatography (GPC). As a result, it was found that the weight average molecular weight was 13,800, and the dispersity was 1.62. Further, the fluorine-containing polymeric compound (F3) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=74.2/9.8/16.0.

[Chemical Formula 64]

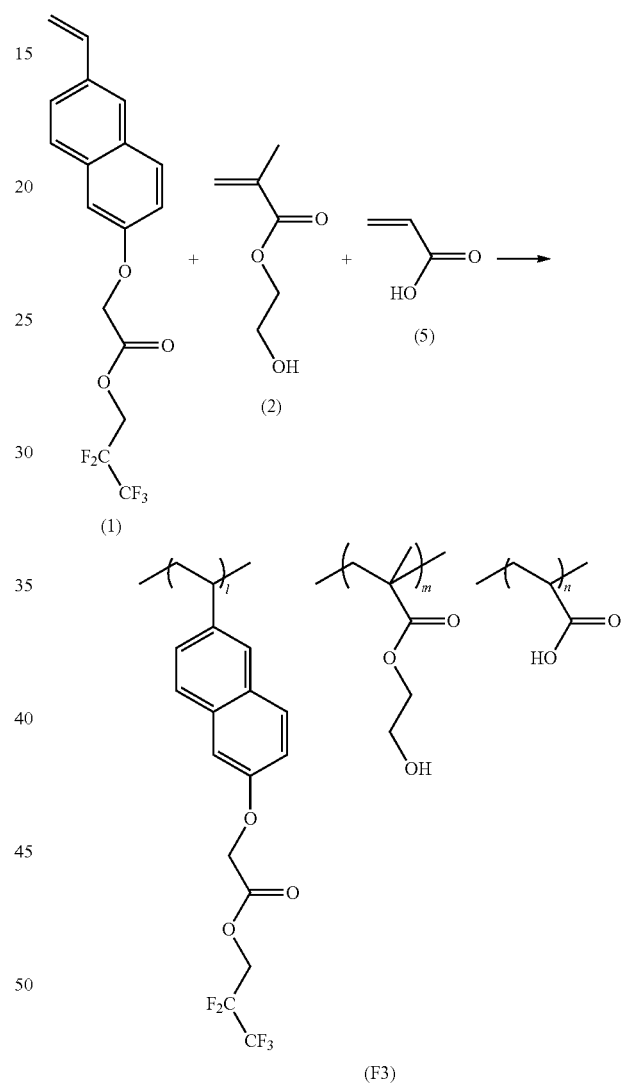

Example 4

Synthesis of Fluorine-Containing Polymeric Compound (F4)

2.37 g (6.58 mmol) of a compound (1), 0.47 g (2.19 mmol) of a compound (4) and 0.16 g (2.19 mmol) of a compound (5) were added to a three-necked flask equipped with a thermometer and a reflux tube, and 17.00 g of tetrahydrofuran was added thereto and dissolved. Then, 0.13 g of dimethyl 2,2'-azobis(isobutyrate) (product name: V-601) as a polymerization initiator was added and dissolved in the resulting solution. The solution was stirred while heating at 80° C. for 6 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 1.6 g of a fluorine-containing polymeric compound (F4) as an objective compound.

With respect to the fluorine-containing polymeric compound (F4), the weight average molecular weight and the dispersity were determined by the polystyrene equivalent value as measured by gel permeation chromatography (GPC). As a result, it was found that the weight average molecular weight was 15,500, and the dispersity was 1.68. Further, the fluorine-containing polymeric compound (F4) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=77/14/9.

[Chemical Formula 65]

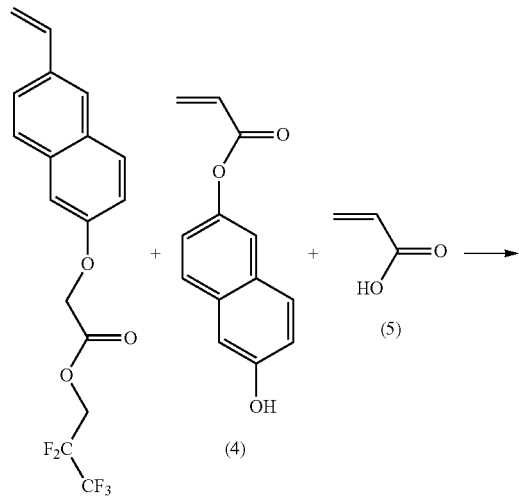

Synthesis Example 3

Synthesis of Fluorine-Containing Polymeric Compound (F'1)

5.00 g (13.88 mmol) of the compound (1) and 0.67 g (9.25 mmol) of a compound (5) were charged into a three-necked flask equipped with a thermometer and a reflux tube, and 32.11 g of tetrahydrofuran was added thereto and dissolved. Then, 0.27 g of dimethyl 2,2'-azobis(isobutyrate) (product name: V-601) as a polymerization initiator was added and dissolved in the resulting solution. The solution was stirred while heating at 80° C. for 6 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 3.15 g of a fluorine-containing polymeric compound (F'1) as an objective compound.

With respect to the fluorine-containing polymeric compound (F'1), the weight average molecular weight and the dispersity were determined by the polystyrene equivalent value as measured by gel permeation chromatography (GPC). As a result, it was found that the weight average molecular weight was 14,500, and the dispersity was 1.63. Further, the fluorine-containing polymeric compound (F'1) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=73/27.

[Chemical Formula 66]

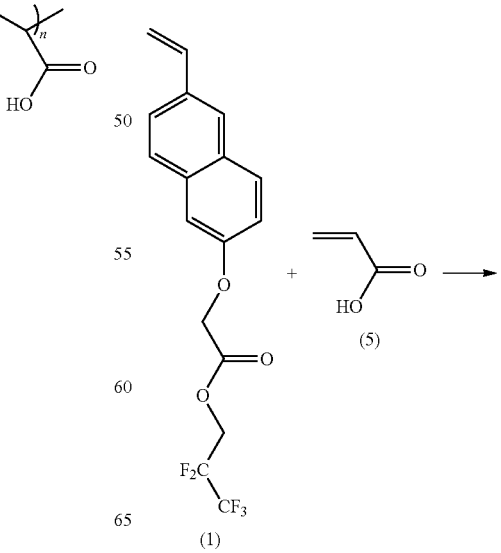

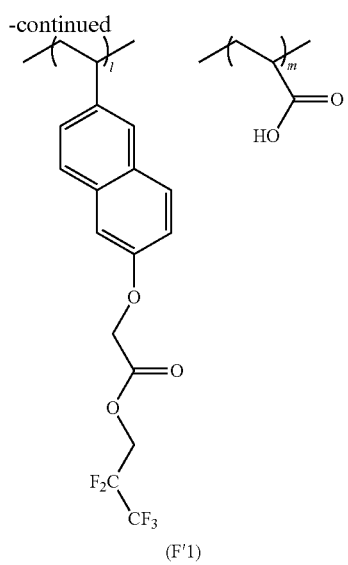

(F'1)

Production of Negative Resist Composition

Examples 5 to 10, Comparative Example 1, and Reference Examples 1 to 3

The components shown in Table 1 were mixed together and dissolved to obtain negative resist compositions.

In Table 1, the reference characters indicate the following. Further, the values in brackets [ ] indicate the amount (in terms of parts by weight) of the component added.

(A)-1: a polymeric compound represented by chemical formula (A1-1) shown below (manufactured by Promerus LLC). In the polymeric compound (A)-1, the ratio between the structural units (a1:a2, molar ratio), the weight average molecular weight (Mw) and the dispersity (Mw/Mn) are as shown below.

[Chemical Formula 67]

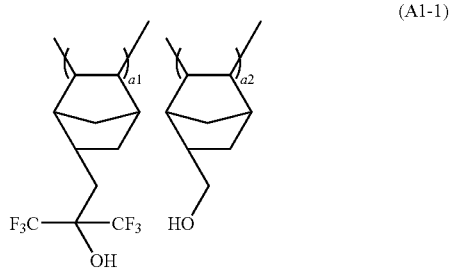

[a1:a2=60:40 (molar ratio), Mw: 3,600, Mw/Mn: 1.48]

(F)-1: fluorine-containing polymeric compound (F1) synthesized in Example 1

(F)-2: fluorine-containing polymeric compound (F2) synthesized in Example 2

(F)-3: fluorine-containing polymeric compound (F'1) synthesized in Synthesis

TABLE 1

|  | Component (A) | | Component (B) | | Component (C) | Component (D) | Component (S) |
|---|---|---|---|---|---|---|---|
| Comp. Ex. 1 | (A)-1 | — | (B)-1 | (B)-2 | (C)-1 | (D)-1 | (S)-1 |
|  | [100] |  | [3.0] | [6.0] | [8.5] | [1.4] | [3000] |
| Ex. 5 | (A)-1 | (F)-1 | (B)-1 | (B)-2 | (C)-1 | (D)-1 | (S)-1 |
|  | [100] | [1.0] | [3.0] | [6.0] | [8.5] | [1.4] | [3000] |
| Ex. 6 | (A)-1 | (F)-1 | (B)-1 | (B)-2 | (C)-1 | (D)-1 | (S)-1 |
|  | [100] | [5.0] | [3.0] | [6.0] | [8.5] | [1.4] | [3000] |
| Ex. 7 | (A)-1 | (F)-1 | (B)-1 | (B)-2 | (C)-1 | (D)-1 | (S)-1 |
|  | [100] | [10.0] | [3.0] | [6.0] | [8.5] | [1.4] | [3000] |
| Ex. 8 | (A)-1 | (F)-2 | (B)-1 | (B)-2 | (C)-1 | (D)-1 | (S)-1 |
|  | [100] | [1.0] | [3.0] | [6.0] | [8.5] | [1.4] | [3000] |
| Ex. 9 | (A)-1 | (F)-2 | (B)-1 | (B)-2 | (C)-1 | (D)-1 | (S)-1 |
|  | [100] | [5.0] | [3.0] | [6.0] | [8.5] | [1.4] | [3000] |
| Ex. 10 | (A)-1 | (F)-2 | (B)-1 | (B)-2 | (C)-1 | (D)-1 | (S)-1 |
|  | [100] | [10.0] | [3.0] | [6.0] | [8.5] | [1.4] | [3000] |
| Ref. Ex. 1 | (A)-1 | (F)-3 | (B)-1 | (B)-2 | (C)-1 | (D)-1 | (S)-1 |
|  | [100] | [1.0] | [3.0] | [6.0] | [8.5] | [1.4] | [3000] |
| Ref. Ex. 2 | (A)-1 | (F)-3 | (B)-1 | (B)-2 | (C)-1 | (D)-1 | (S)-1 |
|  | [100] | [5.0] | [3.0] | [6.0] | [8.5] | [1.4] | [3000] |
| Ref. Ex. 3 | (A)-1 | (F)-3 | (B)-1 | (B)-2 | (C)-1 | (D)-1 | (S)-1 |
|  | [100] | [10.0] | [3.0] | [6.0] | [8.5] | [1.4] | [3000] |

Example 3

(B)-1: triphenylsulfonium heptafluoro-n-propanesulfonate
(B)-2: a compound represented by chemical formula (B-2) shown below

[Chemical Formula 68]

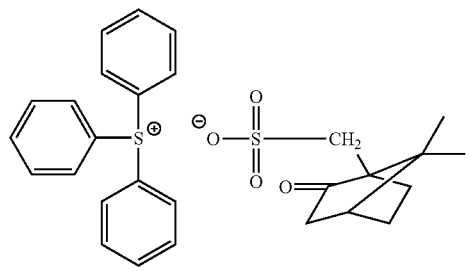

(B-2)

(C)-1: tetraethoxymethylated glycoluril E-9401 (a product name, manufactured by Sanwa chemical Co., Ltd.)
(D)-1: triisopropanolamine
(S)-1: a mixed solvent of PGMEA/PGME=6/4 (weight ratio)

<Evaluation of Hydrophobicity of Resist Film>

With respect to the negative resist compositions of Examples 5 to 10, Reference Examples 1 to 3 and Comparative Example 1, the sliding angle, static contact angle and dynamic contact angle (receding angle and advancing angle) (hereafter, these angles are referred to as "contact angles") of the resist film surface prior to exposure were measured in the following manner, to thereby evaluate the hydrophobicity of the resist film.

[Procedure]

Each of the negative resist compositions shown in Table 1 was applied onto an 8-inch silicon wafer using a spinner, and was then prebaked (PAB) on a hotplate at 80° C. for 60 seconds and dried, thereby forming a resist film having a film thickness of 100 nm.

Subsequently, 50 µl of water was dropped onto the surface of the resist film (prior to exposure), and the contact angles were measured using DROP MASTER-700 (manufactured by Kyowa Interface Science Co. Ltd.). The results are shown in Table 2.

TABLE 2

|  | Sliding angle (°) | Advancing angle (°) | Receding angle (°) | Static contact angle (°) |
|---|---|---|---|---|
| Comp. Ex. 1 | 34.5 | 81.5 | 46.7 | 67.4 |
| Ex. 5 | 27.0 | 86.1 | 57.8 | 75.0 |
| Ex. 6 | 24.5 | 94.4 | 68.1 | 86.5 |
| Ex. 7 | 22.0 | 95.7 | 73.2 | 89.6 |
| Ex. 8 | 31.0 | 85.9 | 55.7 | 75.8 |
| Ex. 9 | 23.0 | 94.6 | 69.5 | 87.4 |
| Ex. 10 | 18.0 | 94.0 | 74.2 | 91.1 |
| Ref. Ex. 1 | 28.0 | 86.6 | 54.0 | 76.1 |
| Ref. Ex. 2 | 18.0 | 96.2 | 76.0 | 92.1 |
| Ref. Ex. 3 | 16.5 | 97.7 | 78.9 | 92.6 |

From the results shown in Table 2, the resist films formed using the negative resist compositions of Examples 5 to 10 containing the polymeric compound (F) according to the present invention exhibited a small sliding angle and a large receding angle, as compared to the resist film formed using the resist composition of Comparative Example 1 containing no component (F), which meant that the hydrophobicity was improved.

Further, in Examples 5 to 10 and Reference Examples 1 to 3, it was confirmed that the hydrophobicity of the resist film became higher as the amount of the fluorine-containing polymeric compound became larger.

<Evaluation of Lithography Properties>

Using the negative resist compositions of Examples 6, 7, 9 and 10, Reference Examples 2 and 3, and Comparative Example 1, resist patterns were formed as follows.

[Formation of Resist Pattern]

An organic anti-reflection film composition (product name: AR-46, manufactured by Rohm and Haas Company) was applied onto a silicon wafer using a spinner, and the composition was then baked at 215° C. for 60 seconds, thereby forming an organic anti-reflection film having a film thickness of 31 nm.

Then, a negative resist composition was applied onto the anti-reflection film using a spinner, and was then prebaked (PAB) on a hotplate at 80° C. for 60 seconds and dried, thereby forming a resist film having a film thickness of 100 nm.

Subsequently, the resist film was selectively irradiated with an ArF excimer laser (193 nm) through a mask pattern (6% half tone), using an ArF exposure apparatus NSR-S302A (manufactured by Nikon Corporation, NA (numerical aperture)=0.60, 2/3 annular illumination).

Thereafter, a post exposure bake (PEB) treatment was conducted at 110° C. for 60 seconds, followed by development for 60 seconds at 23° C. in a 2.38% by weight aqueous tetramethylammonium hydroxide (TMAH) solution (product name: NMD-3; manufactured by Tokyo Ohka Kogyo Co., Ltd.). Then, the resist was washed for 30 seconds with pure water, followed by drying by shaking. Further, the resist was heated and dried at 100° C. for 60 seconds.

As a result, in each of the examples, a line and space pattern (L/S pattern) in which lines having a line width of 120 nm were spaced at equal intervals (pitch: 240 nm) was formed. Further, in each of the examples, no foreign matter was observed on the L/S pattern.

The optimum exposure dose Eop (mJ/cm$^2$; sensitivity) with which an L/S pattern having a line width of 120 nm and a pitch of 240 nm was formed was determined. The results are shown in Table 3.

TABLE 3

|  | Eop (mJ/cm$^2$) |
|---|---|
| Comp. Ex. 1 | 29.0 |
| Ex. 6 | 27.0 |
| Ex. 7 | 26.0 |
| Ex. 9 | 28.0 |
| Ex. 10 | 26.0 |
| Ref. Ex. 2 | 27.0 |
| Ref. Ex. 3 | 27.0 |

[Evaluation of Resist Pattern Shape]

With the above Eop, a pattern with a large area was formed, and the surface of the formed pattern was observed using a scanning electron microscope (SEM) to thereby evaluate the shape of the resist pattern.

As a result, it was found that the patterns formed using the negative resist compositions of Reference Example 2 and Examples 6, 7, 9 and 10 had small surface roughness, and had an excellent shape.

With respect to the pattern formed using the negative resist composition of Reference Example 3, fine uneven portions were observed in large numbers on the surface of the pattern.

From the results shown above, it was confirmed that in a negative resist composition containing the polymeric compound (F) according to the present invention, unlike the negative resist compositions of Reference Examples 2 and 3, the hydrophobicity of the resist film can be improved by increasing the amount of the component (F), without adversely affecting the surface of the resist pattern.

Thus, from the evaluation results, it was confirmed that, according to the negative resist composition of the present invention and the method of forming a resist pattern using the same, a resist pattern having an excellent shape can be formed.

Furthermore, according to the present invention, it was confirmed that, by virtue of including a fluorine-containing polymeric compound having a structural unit containing a fluorine-containing base dissociable group and a structural unit containing a cross-linking group-containing group, a negative resist composition can be provided which is capable of forming a resist film exhibiting not only high hydrophobicity on the film surface and an excellent solubility in an alkali developing solution, but also excellent lithography properties.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A negative resist composition comprising an alkali-soluble resin component (A), an acid generator component (B) that generates acid upon exposure, and a cross-linking component (C), said alkali-soluble resin component (A) comprising a polymeric compound (F) having a structural unit (f1) represented by general formula (f1-1) or (f1-2) shown below and a structural unit (f2) containing a cross-linking group-containing group:

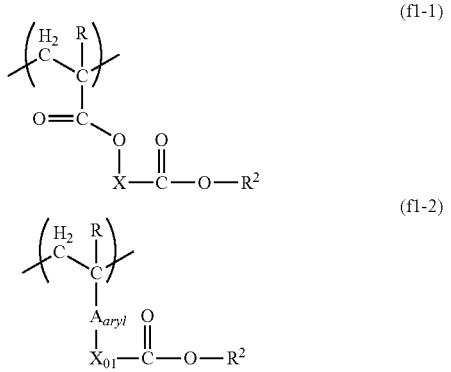

wherein each R independently represents a hydrogen atom, a lower alkyl group or 1 to 5 carbon atoms or a halogenated lower alkyl group of 1 to 5 carbon atoms; X represents a divalent organic group; $A_{aryl}$ represents an aromatic cyclic group which may have a substituent; $X_{01}$ represents a single bond —O—, —C(=O), —C(=O)—O—, (—O—C(=O)—O—), —NH—C(=O)—, a combination thereof, or a combination thereof having an alkylene group of 1 to 10 carbon atoms; and each $R^2$ independently represents an organic group having a fluorine atom.

2. The negative resist composition according to claim 1, wherein said structural unit (f2) is at least one structural unit selected from the group consisting of structural units containing a group represented by general formulas (f2-1), (f2-2) or (f2-3) shown below:

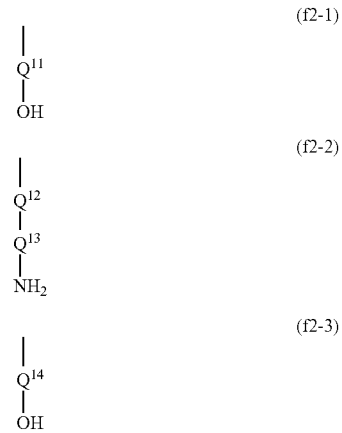

wherein $Q^{11}$ represents an alkylene group which may have an ether bond; $Q^{12}$ represents a divalent linking group; $Q^{13}$ represents —SO$_2$— or —C(=O)—; and $Q^{14}$ represents an aromatic cyclic group.

3. The negative resist composition according to claim 1, wherein said cross-linking component (C) is at least one cross-linker selected from the group consisting of melamine-based cross-linkers, urea-based cross-linkers, alkylene urea-based cross-linkers, glycoluril-based cross-linkers and epoxy-based cross-linkers.

4. The negative resist composition according to claim 1, further comprising a nitrogen-containing organic compound (D).

5. A method of forming a resist pattern, comprising: applying a negative resist composition according to claim 1 to a substrate to form a resist film, subjecting said resist film to exposure, and subjecting said resist film to alkali developing to form a resist pattern.

6. A polymeric compound comprising a structural unit (f1) represented by general formula (f1-1) or (f1-2) shown below and a structural unit (f2) containing a cross-linking group-containing group:

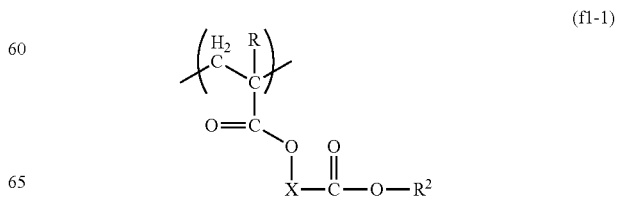

(f1-2)

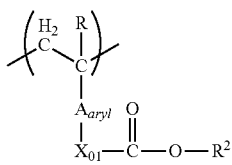

wherein each R independently represents a hydrogen atom, a lower alkyl group of 1 to 5 carbon atoms or a halogenated lower alkyl group of 1 to 5 carbon atoms; X represents a divalent organic group; $A_{aryl}$ represents an aromatic cyclic group which may have a substituent; $X_{01}$ represents a single bond, —O—, —C(=O)—, —C(=O)—O—, (—O—C(=O)—O—), —NH—C(=O)—, a combination thereof, or a combination thereof having an alkylene group of 1 to 10 carbon atoms; and each $R^2$ independently represents an organic group having a fluorine atom.

7. The polymeric compound according to claim 6, wherein said structural unit (f2) is at least one structural unit selected from the group consisting of structural units containing a group represented by general formulas (f2-1), (f2-2) or (f2-3) shown below:

(f2-1)

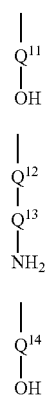

|
$Q^{11}$
|
OH (f2-2)

|
$Q^{12}$
|
$Q^{13}$
|
$NH_2$ (f2-3)

|
$Q^{14}$
|
OH wherein $Q^{11}$ represents an alkylene group which may have an ether bond; $Q^{12}$ represents a divalent linking group; $Q^{13}$ represents —SO$_2$— or —C(=O)—; and $Q^{14}$ represents an aromatic cyclic group.

8. A negative resist composition comprising an alkali-soluble resin component (A), an acid generator component (B) that generates acid upon exposure, and a cross-linking component (C),
said alkali-soluble resin component (A) comprising a polymeric compound (F) having a structural unit (f1) represented by general formula (f1-1) or (f1-2) shown below and a structural unit (f2) containing a cross-linking group-containing group:

(f1-1)

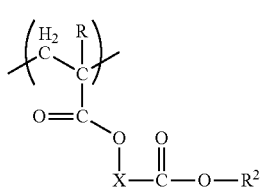

(f1-2)

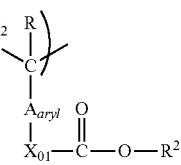

wherein each R independently represents a hydrogen atom, a lower alkyl group of 1 to 5 carbon atoms or a halogenated lower alkyl group of 1 to 5 carbon atoms; X represents a divalent organic group; $A_{aryl}$ represents an aromatic cyclic group which may have a substituent and contains a naphthalene ring; $X_{01}$ represents a single bond or a divalent linking group; and each $R^2$ independently represents an organic group having a fluorine atom.

9. The negative resist composition according to claim 8, wherein said structural unit (f2) is at least one structural unit selected from the group consisting of structural units containing a group represented by general formulas (f2-1), (f2-2) or (f2-3) shown below:

(f2-1)

|
$Q^{11}$
|
OH (f2-2)

|
$Q^{12}$
|
$Q^{13}$
|
$NH_2$ (f2-3)

|
$Q^{14}$
|
OH wherein $Q^{11}$ represents an alkylene group which may have an ether bond; $Q^{12}$ represents a divalent linking group; $Q^{13}$ represents —SO$_2$— or —C(=O)—; and $Q^{14}$ represents an aromatic cyclic group.

10. The negative resist composition according to claim 8, wherein said cross-linking component (C) is at least one cross-linker selected from the group consisting of melamine-based cross-linkers, urea-based cross-linkers, alkylene urea-based cross-linkers, glycoluril-based cross-linkers and epoxy-based cross-linkers.

11. The negative resist composition according to claim 8, further comprising a nitrogen-containing organic compound (D).

12. A method of forming a resist pattern, comprising: applying a negative resist composition according to claim 8 to a substrate to form a resist film, subjecting said resist film to exposure, and subjecting said resist film to alkali developing to form a resist pattern.

13. A method of forming a resist pattern, comprising: applying a negative resist composition according to claim 9 to a substrate to form a resist film, subjecting said resist film to exposure, and subjecting said resist film to alkali developing to form a resist pattern.

14. A method of forming a resist pattern, comprising: applying a negative resist composition according to claim 10 to a substrate to form a resist film, subjecting said resist film to exposure, and subjecting said resist film to alkali developing to form a resist pattern.

15. A method of forming a resist pattern, comprising: applying a negative resist composition according claim 11 to a substrate to form a resist film, subjecting said resist film to exposure, and subjecting said resist film to alkali developing to form a resist pattern.

16. A polymeric compound comprising a structural unit (f1) represented by general formula (f1-1) or (f1-2) shown below and a structural unit (f2) containing a cross-linking group-containing group:

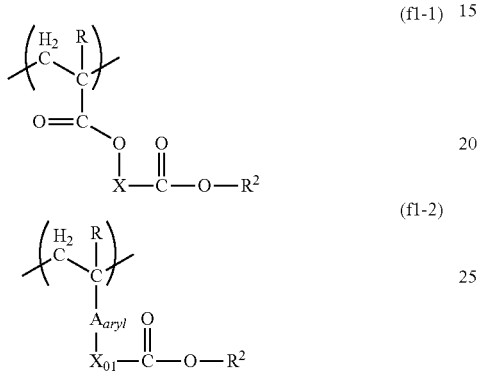

wherein each R independently represents a hydrogen atom, a lower alkyl group of 1 to 5 carbon atoms or a halogenated lower alkyl group of 1 to 5 carbon atoms; X represents a divalent organic group; $A_{aryl}$ represents an aromatic cyclic group which may have a substituent and contains a naphthalene ring; $X_{01}$ represents a single bond or a divalent linking group; and each $R^2$ independently represents an organic group having a fluorine atom.

17. The polymeric compound according to claim 16, wherein said structural unit (C) is at least one structural unit selected from the group consisting of structural units containing a group represented by general formulas (f2-1), (f2-2) or (f2-3) shown below:

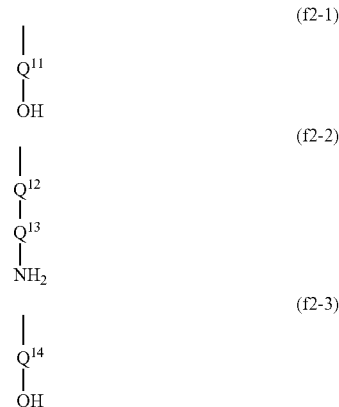

wherein $Q^{11}$ represents an alkylene group which may have an ether bond; $Q^{12}$ represents a divalent linking group; $Q^{13}$ represents —$SO_2$— or —C(=O)—; and $Q^{14}$ represents an aromatic cyclic group.

* * * * *